United States Patent
Nojiri et al.

(10) Patent No.: US 6,329,111 B1
(45) Date of Patent: *Dec. 11, 2001

(54) PHOSPHOR PATTERN, PROCESSES FOR PREPARING THE SAME AND PHOTOSENSITIVE ELEMENT TO BE USED FOR THE SAME

(75) Inventors: Takeshi Nojiri, Iwama-machi; Hideyasu Tsuiki, Hitachinaka; Hiroyuki Tanaka, Mito; Yumiko Wada, Hitachi; Seiji Tai, Hitachi; Seikichi Tanno, Hitachi; Hajime Kakumaru, Hitachi; Kazuya Sato, Hitachi; Naoki Kimura, Hitachi; Ikuo Mukai, Hitachi, all of (JP)

(73) Assignee: Hitachi Chemical Company, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/787,112

(22) Filed: Jan. 22, 1997

(30) Foreign Application Priority Data

| Jan. 22, 1996 | (JP) | 8-008306 |
|---|---|---|
| Jan. 22, 1996 | (JP) | 8-008307 |
| Jan. 23, 1996 | (JP) | 8-009643 |
| Jan. 23, 1996 | (JP) | 8-009644 |
| Feb. 28, 1996 | (JP) | 8-041229 |

(51) Int. Cl.$^7$ .............. B32B 7/02; G03F 7/004; C09K 11/08
(52) U.S. Cl. ............... 430/25; 430/28; 430/26; 156/67; 156/89.11; 156/100; 156/102; 427/68
(58) Field of Search .................. 156/67, 89.11, 156/100, 102; 427/64, 68, 66, 67; 430/26, 24, 23, 28, 25; 445/24

(56) References Cited

U.S. PATENT DOCUMENTS

| 3,463,686 | * | 8/1969 | Gallaro et al. ............. 156/67 |
| 5,292,613 | * | 3/1994 | Sato et al. ............. 430/257 |
| 5,294,516 | * | 3/1994 | Sato et al. ............. 430/262 |
| 5,601,468 | * | 2/1997 | Fujii et al. ............. 427/68 |
| 5,858,616 | * | 1/1999 | Tanaka et al. ............. 430/28 |

FOREIGN PATENT DOCUMENTS

| 05-109358 | * | 4/1993 | (JP) ............. 430/24 |
| 05-242803 | * | 9/1993 | (JP) ............. 430/25 |
| 06-273925 | * | 9/1994 | (JP) . |

* cited by examiner

*Primary Examiner*—Martin Angebranndt
(74) *Attorney, Agent, or Firm*—Antonelli, Terry, Stout & Kraus, LLP

(57) ABSTRACT

Disclosed are a phosphor pattern which comprises a substrate having unevenness and a phosphor layer formed on the inner surface of a concave portion of the substrate, wherein the phosphor pattern thickness ratio (x)/(y) satisfies a range of 0.1 to 1.5, where when the length from the bottom of the concave portion to the top of a convex portion is L ($\mu$m), (x) is a thickness of the phosphor pattern formed on an uneven wall surface at a position of 0.9×L from the bottom of the concave portion toward the top of the convex portion, and (y) is a thickness of the phosphor pattern formed on the uneven wall surface at a position of 0.4×L from the bottom of the concave portion toward the top of the convex portion, and processes for preparing the same.

20 Claims, 11 Drawing Sheets

PHOSPHOR PATTERN, PROCESSES FOR PREPARING THE SAME AND PHOTOSENSITIVE ELEMENT TO BE USED FOR THE SAME

BACKGROUND OF THE INVENTION

This invention relates to a photosensitive element and processes for preparing a phosphor pattern using the same.

In the prior art, as one of flat plate displays, there has been known a plasma display panel (hereinafter referred to as "PDP") which enables multicolor display by providing a phosphor which emits light by plasma discharge.

In PDP, flat front plate and back plate comprising glass are arranged in parallel with each other and facing to each other, both of the plates are retained at a certain interval by a barrier rib provided therebetween, and PDP has a structure that discharge is effected in a space surrounded with the front plate, the back plate and the barrier rib.

In such a space, a phosphor is coated for display, and by discharge, the phosphor emits light by UV ray generated from filler gas, and the light can be recognized by an observer.

In the prior art, as a method for providing the phosphor, a method of coating a slurry solution or paste in which phosphors of the respective colors are dispersed, by a printing method such as screen printing has been proposed and disclosed in Japanese Provisional Patent Publications No. 115027/1989, No. 124929/1989, No. 124930/1989 and No. 155142/1990.

However, the above phosphor-dispersed slurry solution is liquid so that dispersion failure due to precipitation of the phosphors occurs easily, and the slurry solution also has a drawback that when a liquid photosensitive resist is used in the slurry solution, storage stability is poor due to acceleration of a dark reaction or the like. Further, the printing method such as screen printing is inferior in printing precision so that there are problems that it is difficult to cope with enlargement of a screen of PDP in the future, and others.

In order to solve these problems, there has been proposed a method of using a photosensitive element (which is also called as a photosensitive film) containing a phosphor (Japanese Provisional Patent Publication No. 273925/1994).

In the method of using a photosensitive element, a phosphor-containing photosensitive resin layer of a photosensitive element comprising a photosensitive resin layer containing a phosphor and a support film is embedded in the space of the above substrate for PDP by contact bonding (lamination) under heating, the layer is subjected to imagewise exposure with active light such as UV ray by a photographic method using a negative film, an unexposed portion is removed by a developing solution such as an alkaline aqueous solution, and further unnecessary organic components are removed by calcination to form a phosphor pattern only at a necessary portion.

Therefore, when a phosphor pattern is formed in the space of the above substrate for PDP, it is not necessary to confirm dispersibility of a phosphor, and storage stability is also excellent as compared with the case of using a phosphor-dispersed slurry solution or paste. Further, the photographic method is used so that a phosphor pattern can be formed with good precision.

However, when a phosphor-containing photosensitive resin layer is embedded in the space (in the cell) of above substrate for PDP by lamination by using a photosensitive element according to the conventional method, it is difficult to form a phosphor pattern with uniform thickness and shape on the wall surface of a barrier rib and the bottom of the space.

SUMMARY OF THE INVENTION

The invention according to Claim 1 is to provide a phosphor pattern in which lowering of apparent luminance in visual recognition from a wide angle of a field of view can be suppressed in PDP.

The invention according to Claim 2 is to provide a process for preparing a phosphor pattern, in which property of embedding in a space of a substrate having unevenness such as a substrate for PDP (property of forming a phosphor-containing photosensitive resin composition layer on the wall surface of a barrier rib and the bottom of a space of a substrate for PDP) is excellent and a phosphor pattern with high precision and a uniform shape can be formed.

The invention according to Claim 3 is to provide a process for preparing a phosphor pattern, having excellent operatability in addition to the effects of the invention according to Claim 2.

The invention according to Claim 4 is to provide a process for preparing a phosphor pattern, having excellent property of suppressing decrease in phosphor-containing photosensitive resin composition layer thickness in addition to the effects of the invention according to Claim 2.

The invention according to Claim 5 is to provide a photosensitive element in which property of suppressing edge fusion and property of embedding in a space of a substrate having unevenness such as a substrate for PDP are excellent and a phosphor pattern with high precision and a uniform shape can be formed with good operatability.

The invention according to Claim 6 is to provide a process for preparing a phosphor pattern, in which operatability, environmental safety and property of embedding in a space of a substrate having unevenness such as a substrate for PDP are excellent and a phosphor pattern with high precision and a uniform shape can be formed.

The invention according to Claim 7 is to provide a process for preparing a phosphor pattern, having more excellent operatability in addition to the effects of the invention according to Claim 6.

The invention according to Claim 8 is to provide a process for preparing a phosphor pattern, having excellent property of suppressing decrease in phosphor-containing photosensitive resin composition layer thickness in addition to the effects of the invention according to Claim 6.

The invention according to Claim 9 is to provide a process for preparing a phosphor pattern, in which property of embedding in a space of a substrate having unevenness such as a substrate for PDP is excellent and a phosphor pattern with high precision and a uniform shape can be formed.

The invention according to Claim 10 is to provide a process for preparing a phosphor pattern, having more excellent operatability in addition to the effects of the invention according to Claim 9.

The invention according to Claim 11 is to provide a process for preparing a phosphor pattern, having excellent property of suppressing decrease in phosphor-containing photosensitive resin composition layer thickness in addition to the effects of the invention according to Claim 9.

The invention according to Claim 12 is to provide a photosensitive element in which property of suppressing edge fusion and property of embedding in a space of a substrate having unevenness such as a substrate for PDP are excellent and a phosphor pattern with high precision and a uniform shape can be formed with good operatability.

The invention according to Claim 13 is to provide a process for preparing a phosphor pattern, in which property of embedding in a space of a substrate having unevenness such as a substrate for PDP is excellent and a phosphor pattern with high precision and a uniform shape can be formed.

The invention according to Claim 14 is to provide a process for preparing a phosphor pattern, having more excellent operatability in addition to the effects of the invention according to Claim 13.

The invention according to Claim 15 is to provide a process for preparing a phosphor pattern, having excellent property of suppressing decrease in phosphor-containing photosensitive resin composition layer thickness in addition to the effects of the invention according to Claim 13.

The invention according to Claim 16 is to provide a process for preparing a phosphor pattern, in which property of embedding in a space of a substrate having unevenness such as a substrate for PDP is excellent and a phosphor pattern with high precision and a uniform shape can be formed.

The invention according to Claim 17 is to provide a process for preparing a phosphor pattern, having more excellent operatability in addition to the effects of the invention according to Claim 16.

The invention according to Claim 18 is to provide a process for preparing a phosphor pattern, having excellent property of suppressing decrease in phosphor-containing photosensitive resin composition layer thickness in addition to the effects of the invention according to Claim 16.

The inventions according to Claims 19 and 24 are to provide a process for preparing a phosphor pattern, having more excellent operatability in addition to the effects of the invention according to Claim 2, and a photosensitive element having more excellent operatability in addition to the effects of the invention according to Claim 5.

The inventions according to Claims 20 and 25 are to provide a process for preparing a phosphor pattern, having more excellent storage stability in addition to the effects of the invention according to Claim 2, and a photosensitive element having more excellent storage stability in addition to the effects of the invention according to Claim 5.

The inventions according to Claims 21 and 26 are to provide a process for preparing a phosphor pattern, having excellent property of suppressing mixing of colors in addition to the effects of the invention according to Claim 2, and a photosensitive element having more excellent property of suppressing mixing of colors in addition to the effects of the invention according to Claim 5.

The invention according to Claim 27 is to provide a process for preparing a phosphor pattern, having more excellent operatability in addition to the effects of the invention according to Claim 2.

The inventions according to Claims 22 and 28 are to provide a process for preparing a phosphor pattern, which can form a phosphor pattern with high precision and a uniform shape and has the effects of the invention according to Claim 2, and a photosensitive element which can form a phosphor pattern with high precision and a uniform shape and has the effects of the invention according to Claim 5.

The inventions according to Claims 23 and 29 are to provide a process for preparing a phosphor pattern, which can form a phosphor pattern with high precision and a uniform shape and has the effects of the invention according to Claim 9, and a photosensitive element which can form a phosphor pattern with high precision and a uniform shape and has the effects of the invention according to Claim 12.

(1) The present invention relates to a phosphor pattern which comprises a substrate having unevenness and a phosphor layer formed on the inner surface of a concave portion of the substrate, wherein when the length from the bottom of the concave portion to the top of a convex portion is L ($\mu$m), the phosphor pattern thickness ratio (x)/(y) of the thickness (x) of the phosphor pattern formed on an uneven wall surface at a position of 0.9×L from the bottom of the concave portion toward the top of the convex portion to the thickness (y) of the phosphor pattern formed on the uneven wall surface at a position of 0.4×L from the bottom of the concave portion toward the top of the convex portion satisfies a range of 0.1 to 1.5.

(2) The present invention further relates to a process for preparing a phosphor pattern, which comprises:

(Ia) a step of heating and pressurizing a thermoplastic resin layer (B) in a state that the thermoplastic resin layer (B) is superposed on a phosphor-containing photosensitive resin composition layer (A) on an uneven surface of a substrate having unevenness, to laminate the phosphor-containing photosensitive resin composition layer (A) and the thermoplastic resin layer (B) on the uneven surface;

(IIa) a step of irradiating the phosphor-containing photosensitive resin composition layer (A) and/or the thermoplastic resin layer (B) imagewisely with active light;

(IIIa) a step of removing unnecessary portions from the phosphor-containing photosensitive resin composition layer (A) and/or the thermoplastic resin layer (B) by development; and (IVa) a step of removing unnecessary components from the phosphor-containing photosensitive resin composition layer (A) and/or the thermoplastic resin layer (B) by calcination.

(3) The present invention further relates to the process of the above (2), wherein the respective steps of (Ia) to (IIIa) are repeated to form a multicolor pattern comprising photosensitive resin composition layers each containing a phosphor which emits red, green or blue light, and then the step of (IVa) is carried out to form a multicolor phosphor pattern.

(4) The present invention further relates to the process of the above (2), wherein the respective steps of (Ia) to (IVa) are repeated to form a multicolor phosphor pattern which emits red, green and blue lights.

(5) The present invention further relates to a photosensitive element which comprises a support film, a thermoplastic resin layer (B) provided on the support film, and a phosphor-containing photosensitive resin composition layer (A) provided on the thermoplastic resin layer (B).

(6) The present invention further relates to a process for preparing a phosphor pattern, which comprises:

(Ib) a step of heating and pressurizing the photosensitive element of the above (5) so that the phosphor-containing photosensitive resin composition layer (A) is contacted with an uneven surface of a substrate having unevenness, to laminate the phosphor-containing photosensitive resin composition layer (A) and the thermoplastic resin layer (B) on the uneven surface;

(IIb) a step of irradiating the phosphor-containing photosensitive resin composition layer (A) and/or the thermoplastic resin layer (B) imagewisely with active light;

(IIIb) a step of removing unnecessary portions from the phosphor-containing photosensitive resin composition layer (A) and/or the thermoplastic resin layer (B) by development; and (IVb) a step of removing unnecessary components from the phosphor-containing photosensitive resin composition layer (A) and/or the thermoplastic resin layer (B) by calcination.

(7) The present invention further relates to the process of the above (6), wherein the respective steps of (Ib) to (IIIb) are repeated to form a multicolor pattern comprising photosensitive resin composition layers each containing a phosphor which emits red, green or blue light, and then the step of (IVb) is carried out to form a multicolor phosphor pattern.

8) The present invention further relates to the process the above (6), wherein the respective steps of (Ib) to IVb) are repeated to form a multicolor phosphor pattern which emits red, green and blue lights.

(9) The present invention further relates to a process for preparing a phosphor pattern, which comprises:

(Ic) a step of heating and pressurizing an embedding layer (C) in a state that the embedding layer (C) is superposed on a phosphor-containing photosensitive resin composition layer (A) on an uneven surface of a substrate having unevenness, to laminate the phosphor-containing photosensitive resin composition layer (A) and the embedding layer (C) on the uneven surface;

(IIc) a step of peeling the embedding layer (C);

(IIIc) a step of irradiating the phosphor-containing photosensitive resin composition layer (A) imagewisely with active light;

(IVc) a step of removing an unnecessary portion from the phosphor-containing photosensitive resin composition layer (A) by development; and (Vc) a step of removing unnecessary components from the phosphor-containing photosensitive resin composition layer (A) by calcination.

(10) The present invention further relates to the process of the above (9), wherein the respective steps of (Ic) to (IVc) are repeated to form a multicolor pattern comprising photosensitive resin composition layers each containing a phosphor which emits red, green or blue light, and then the step of (Vc) is carried out to form a multicolor phosphor pattern.

(11) The present invention further relates to the process of the above (9), wherein the respective steps of (Ic) to (Vc) are repeated to form a multicolor phosphor pattern which emits red, green and blue lights.

(12) The present invention further relates to a photosensitive element which comprises a support film, an embedding layer (C) provided on the support film, and a phosphor-containing photosensitive resin composition layer (A) provided on the embedding layer (C).

(13) The present invention further relates to a process for preparing a phosphor pattern, which comprises:

(Id) a step of heating and pressurizing the photosensitive element having the embedding layer (C) and the phosphor-containing photosensitive resin composition layer (A) provided thereon, of the above (12) so that the phosphor-containing photosensitive resin composition layer (A) is contacted with an uneven surface of a substrate having unevenness, to laminate the phosphor-containing photosensitive resin composition layer (A) and the embedding layer (C) on the uneven surface;

(IId) a step of peeling the embedding layer (C);

(IIId) a step of irradiating the phosphor-containing photosensitive resin composition layer (A) imagewisely with active light;

(IVd) a step of removing an unnecessary portion from the phosphor-containing photosensitive resin composition layer (A) by development; and (Vd) a step of removing unnecessary components from the phosphor-containing photosensitive resin composition layer (A) by calcination.

(14) The present invention further relates to the process of the above (13), wherein the respective steps of (Id) to (IVd) are repeated to form a multicolor pattern comprising photosensitive resin composition layers each containing a phosphor which emits red, green or blue light, and then the step of (Vd) is carried out to form a multicolor phosphor pattern.

(15) The present invention further relates to the process of the above (13), wherein the respective steps of (Id) to (Vd) are repeated to form a multicolor phosphor pattern which emits red, green and blue lights.

(16) The present invention further relates to a process for preparing a phosphor pattern, which comprises:

(Ie) a step of pressurizing a phosphor-containing photosensitive resin composition layer (A) in a state that the phosphor-containing photosensitive resin composition layer (A) is superposed on a substrate having unevenness, to adhere the phosphor-containing photosensitive resin composition layer (A) to the inner surface of a concave portion on the substrate having unevenness;

(IIe) a step of irradiating the phosphor-containing photosensitive resin composition layer (A) imagewisely with active light;

(IIIe) a step of removing an unnecessary portion from the phosphor-containing photosensitive resin composition layer (A) by development; and (IVe) a step of removing unnecessary components from the phosphor-containing photosensitive resin composition layer (A) by calcination.

(17) The present invention further relates to the process of the above (16), wherein the respective steps of (Ie) to (IIIe) are repeated to form a multicolor pattern comprising photosensitive resin composition layers each containing a phosphor which emits red, green or blue light, and then the step of (IVe) is carried out to form a multicolor phosphor pattern.

(18) The present invention further relates to the process of the above (16), wherein the respective steps of (Ie) to (IVe) are repeated to form a multicolor phosphor pattern which emits red, green and blue lights.

(19) The present invention further relates to the process of the above (2) to (4), (6) to (8), (9) to (11), (13) to (15) or (16) to (18) and the element of the above (5) or (12), wherein the phosphor-containing photosensitive resin composition layer (A) contains:

(a) a film property-imparting polymer;

(b) a photopolymerizable unsaturated compound having an ethylenic unsaturated group;

(c) a photopolymerization initiator which produces free radical by irradiation of active light; and (d) a phosphor.

(20) The present invention further relates to the process of the above (2) to (4), (6) to (8), (9) to (11), (13) to (15) or (16) to (18) and the element of the above (5) or (12), wherein the phosphor-containing photosensitive resin composition layer (A) contains:

(e) a photopolymerizable high molecular weight binder having an ethylenic unsaturated group;

(f) a photopolymerization initiator which produces free radical by irradiation of active light; and (g) a phosphor.

(21) The present invention further relates to the process of the above (2), (3), (4), (6), (7), (8), (19) or (20) and the element of the above (5), wherein the thermoplastic resin layer (B) contains:
  (h) a thermoplastic resin;
  (i) a photopolymerizable unsaturated compound having an ethylenic unsaturated group; and
  (j) a photopolymerization initiator which produces free radical by irradiation of active light.

(22) The present invention further relates to the process of the above (2), (3), (4), (6), (7), (8), (19) or (20) and the element of the above (5), wherein in the step (IIIa) or (IIIb) of removing unnecessary portions by development, the phosphor-containing photosensitive resin composition layer (A) and the thermoplastic resin layer (B) are developed by using the same developing solution.

(23) The present invention further relates to the process of the above (2), (3), (4), (6), (7), (8), (19), (20) or (21) and the element of the above (5), wherein in the phosphor-containing photosensitive resin composition layer (A) and the thermoplastic resin layer (B) in a region which is the same as the region where unevenness is formed on the substrate having unevenness, the ratio $(V^1)/(V^2)$ of the total volume $(V^1)$ of the phosphor-containing photosensitive resin composition layer (A) and the thermoplastic resin layer (B) to the volume $(V^2)$ of the space of a concave portion of the substrate having unevenness is in the range of 1 to 2.

(24) The present invention further relates to the process of the above (9), (10), (11), (13), (14), (15), (19) or (20) and the element of the above (12), wherein in the phosphor-containing photosensitive resin composition layer (A) and the embedding layer (C) in a region which is the same as the region where unevenness is formed on the substrate having unevenness, the ratio $(V'^1)/(V'^2)$ of the total volume $(V'^1)$ of the phosphor-containing photosensitive resin composition layer (A) and the embedding layer (C) to the volume $(V'^2)$ of the space of a concave portion of the substrate having unevenness is in the range of 1 to 2.

(25) The present invention further relates to a process for producing a back plate for a plasma display panel, which comprises laminating the phosphor layer according to Claim 1 on a substrate having a barrier rib for a plasma display panel, shifting a photosensitive layer of the phosphor layer on the surface of the substrate for a plasma display panel and carrying out exposure in a pattern state, development and then calcination.

DESCRIPTION OF THE PREFERRED EMBODIMENTS

In the following, the present invention is explained in detail.

The phosphor pattern of the present invention comprises a substrate having unevenness and a phosphor layer formed on the inner surface of a concave portion of the substrate, wherein when the length from the bottom of the concave portion to the top of a convex portion is L ($\mu$m), the phosphor pattern thickness ratio (x)/(y) of the thickness (x) of the phosphor pattern formed on an uneven wall surface at a position of 0.9×L from the bottom of the concave portion toward the top of the convex portion to the thickness (y) of the phosphor pattern formed on the uneven wall surface at a position of 0.4×L from the bottom of the concave portion toward the top of the convex portion satisfies a range of 0.1 to 1.5.

As the substrate having unevenness in the present invention, there may be mentioned, for example, a substrate for a plasma display panel (a substrate for PDP) on which a barrier rib is formed.

As the substrate for PDP, there may be mentioned, for example, a substrate such as a glass plate and a synthetic resin plate, which may be subjected to surface treatment for transparent adhesion and on which an electrode and a barrier rib are formed.

Formation of a barrier rib is not particularly limited, and a known material may be used. For example, a rib material containing silica, a thermosetting resin, a low melting point glass (e.g., lead oxide) and a solvent may be used.

On the substrate for PDP, in addition to an electrode and a barrier rib, a dielectric film, an insulating film, an auxiliary electrode and a resistor may be formed, if necessary.

A method for forming the above members on the substrate is not particularly limited. For example, an electrode can be formed on the substrate by a method such as vapor deposition, sputtering, plating, coating and printing, and a barrier rib can be formed on the substrate by a method such as a printing method, a sand blasting method and an embedding method.

Figure 1:
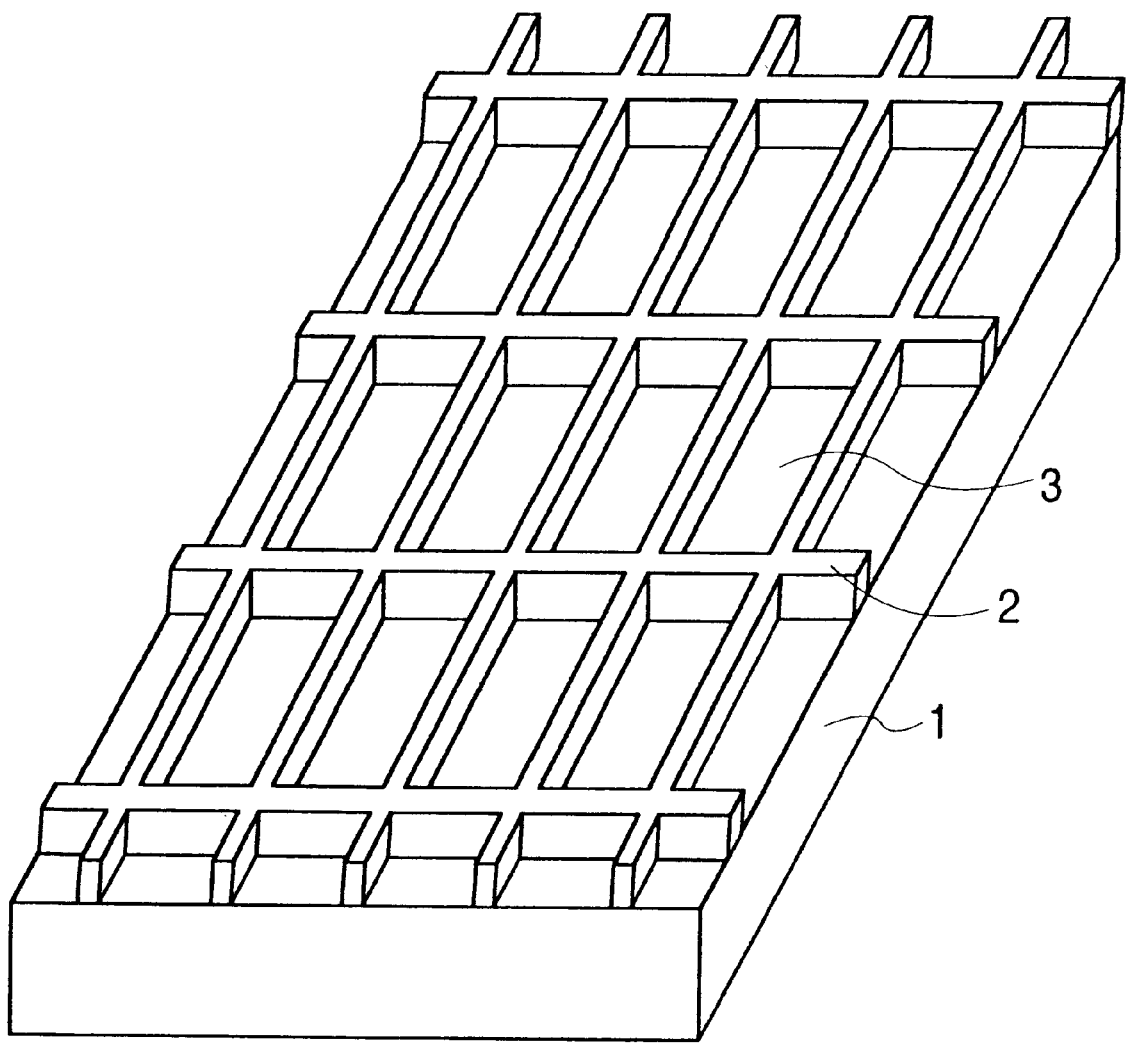
FIG. 1 is a schematical view showing one embodiment of a substrate for PDP on which a barrier rib is formed.
Figure 2:
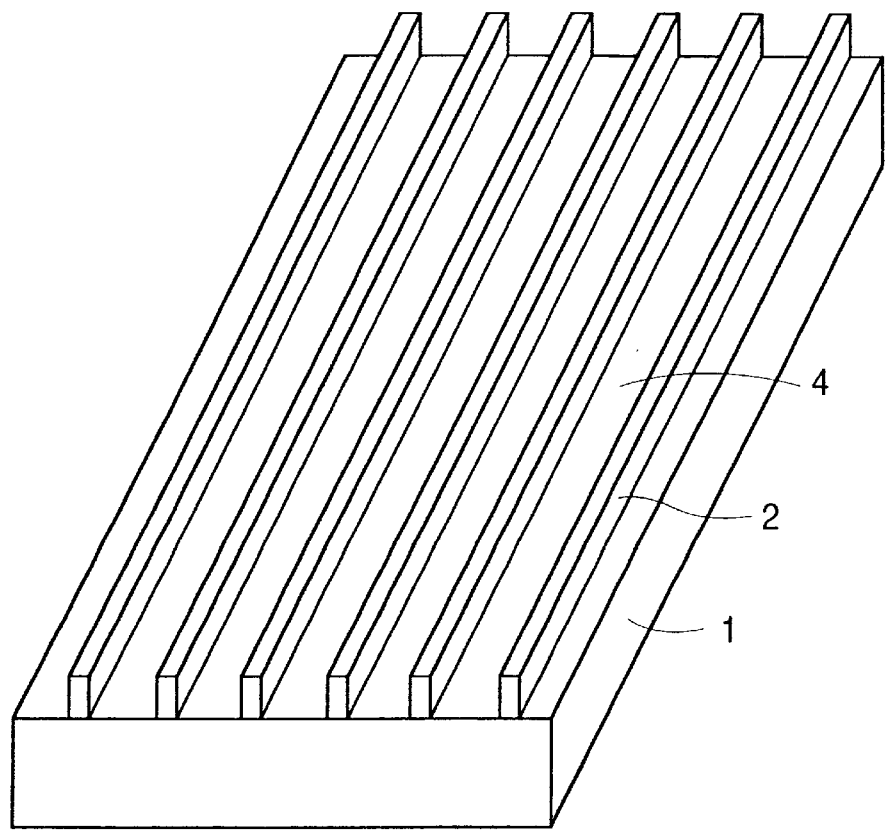
FIG. 2 is a schematical view showing one embodiment of a substrate for PDP on which a barrier rib is formed.

FIG. 1 and FIG. 2 each show a schematical view of one embodiment of the substrate for PDP on which a barrier rib is formed.

The barrier rib generally has a height of 20 to 500 μm and a width of 20 to 200 μm.

The shape of a discharge space surrounded with the barrier rib is not particularly limited and may be lattice-shaped, striped, honeycomb-shaped, triangular or elliptical. In general, a lattice-shaped or striped discharge space as shown in FIG. 1 or FIG. 2 is formed.

In FIG. 1 and FIG. 2, a barrier rib 2 is formed on a substrate 1. In FIG. 1, a lattice-shaped discharge space 3 is formed, and in FIG. 2, a striped discharge space 4 is formed.

The size of the discharge space is determined by the size and resolution of PDP. In general, in the lattice-shaped discharge space as shown in FIG. 1, the longitudinal and lateral lengths are 50 μm to 1 mm, and in the striped discharge space as shown in FIG. 2, the interval is 30 μm to 1 mm.

The phosphor layer in the present invention is formed on the bottom of a space of the substrate having unevenness such as the above substrate for PDP and the wall surface of the barrier rib.

When the opening width of the concave portion of such a substrate having unevenness (the opening width of the barrier rib in the substrate for PDP) is a narrow opening width such as 80 μm, 90 μm, 100 μm, 120 μm and 140 μm, it is preferred to form a phosphor layer or phosphor pattern described below by a photolithographic method described below.

Figure 3:
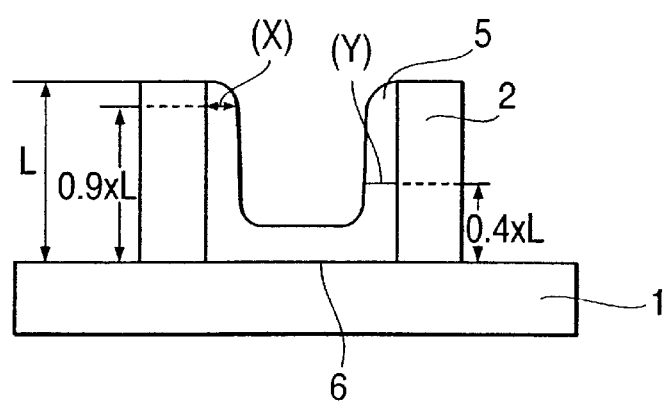
FIG. 3 is a schematical view showing one embodiment of the phosphor pattern of the present invention.

FIG. 3 shows a state that a phosphor layer 5 is formed on the uneven surface of the substrate 1 for a plasma display panel (the substrate for PDP) on which the barrier rib 2 is formed. In FIG. 3, 6 is a concave portion bottom.

The phosphor layer in the phosphor pattern of the present invention satisfies that when the length from the concave portion bottom 6 (the surface of the substrate 1) to the top of a convex portion (the barrier rib 2) is L (μm), the phosphor pattern thickness ratio (x)/(y) of the thickness (x) of the phosphor pattern formed on an uneven wall surface (the wall surface of the barrier rib 2) at a position of 0.9×L from the concave portion bottom 6 toward the top of the convex portion to the thickness (y) of the phosphor pattern formed on the uneven wall surface at a position of 0.4×L from the concave portion bottom 6 toward the top of the convex portion is in the range of 0.1 to 1.5. If the phosphor pattern thickness ratio (x)/(y) is less than 0.1, when light is emitted as PDP, apparent luminance in visual recognition from a wide angle of a field of view is lowered. On the other hand, it said ratio exceeds 1.5, the utilization rate of visible light emitted by a phosphor is lowered to lower luminance.

When light is emitted as PDP, if importance is attached to the point that the utilization rate of visible light emited by a phosphor is improved, the phosphor pattern thickness ratio (x)/(y) is preferably a ratio satisfying a range of 0.1 to less than 0.5, more preferably a ratio satisfying a range of 0.15 to 0.45, particularly preferably a ratio satisfying a range of 0.2 to 0.4.

When light is emitted as PDP, if importance is attached to the point that lowering of apparent luminance in visual recognition from a wide angle of a field of view can be suppressed, the phosphor pattern thickness ratio (x)/(y) is preferably a ratio satisfying a range of 0.5 to 1.5, more preferably a ratio satisfying a range of 0.55 to 1.3, particularly preferably a ratio satisfying a range of 0.6 to 1.2.

As a process for forming the phosphor pattern (comprising a phosphor layer) of the present invention, there may be mentioned, for example, a process including (Ia) a step of heating and pressurizing a thermoplastic resin layer (B) in a state that the layer (B) is superposed on a phosphor-containing photosensitive resin composition layer (A) on an uneven surface of a substrate having unevenness, (IIa) a step of irradiating active light imagewisely, (IIIa) a step of removing unnecessary portions by development and (IVa) a step of removing unnecessary components by calcination.

As the substrate having unevenness in the present invention, there may be used, for example, the above substrate for PDP.

The phosphor-containing photosensitive resin composition layer (A) in the present invention is not particularly limited so long as it is a layer containing a photosensitive resin composition containing a phosphor. As a preferred example, there may be mentioned a layer containing (a) a film property-imparting polymer, (b) a photopolymerizable unsaturated compound having an ethylenic unsaturated group, (c) a photopolymerization initiator which produces free radical by irradiation of active light and (d) a phosphor.

As the film property-imparting polymer (a) in the present invention, a vinyl copolymer is preferred. As a vinyl monomer to be used in the vinyl copolymer, there may be mentioned, for example, acrylic acid, methacrylic acid, maleic acid, fumaric acid, itaconic acid, methyl acrylate, methyl methacrylate, ethyl acrylate, ethyl methacrylate, n-propyl acrylate, n-propyl methacrylate, iso-propyl acrylate, iso-propyl methacrylate, n-butyl acrylate, n-butyl methacrylate, iso-butyl acrylate, iso-butyl methacrylate, sec-butyl acrylate, sec-butyl methacrylate, tert-butyl acrylate, tert-butyl methacrylate, pentyl acrylate, pentyl methacrylate, hexyl acrylate, hexyl methacrylate, heptyl acrylate, heptyl methacrylate, 2-ethylhexyl acrylate, 2-ethylhexyl methacrylate, octyl acrylate, octyl methacrylate, nonyl acrylate, nonyl methacrylate, decyl acrylate, decyl methacrylate, dodecyl acrylate, dodecyl methacrylate, tetradecyl acrylate, tetradecyl methacrylate, hexadecyl acrylate, hexadecyl methacrylate, octadecyl acrylate, octadecyl methacrylate, eicosyl acrylate, eicosyl methacrylate, docosyl acrylate, docosyl methacrylate, cyclopentyl acrylate, cyclopentyl methacrylate, cyclohexyl acrylate, cyclohexyl methacrylate, cycloheptyl acrylate, cycloheptyl methacrylate, benzyl acrylate, benzyl methacrylate, phenyl acrylate, phenyl methacrylate, methoxyethyl acrylate, methoxyethyl methacrylate, diethylene glycol methoxy acrylate, diethylene glycol methoxy methacrylate, dipropylene glycol methoxy acrylate, dipropylene glycol methoxy methacrylate, triethylene glycol methoxy acrylate, triethylene glycol methoxy methacrylate, 2-hydroxyethyl acrylate, 2-hydroxyethyl methacrylate, dimethylaminoethyl acrylate, dimethylaminoethyl methacrylate, diethylaminoethyl acrylate, diethylaminoethyl methacrylate, dimethylaminopropyl acrylate, dimethylaminopropyl methacrylate, 2-chloroethyl acrylate, 2-chloroethyl methacrylate, 2-fluoroethyl acrylate, 2-fluoroethyl methacrylate, 2-cyanoethyl acrylate, 2-cyanoethyl methacrylate, styrene, α-methylstyrene, vinyltoluene, vinyl chloride, vinyl acetate, N-vinyl pyrrolidone, butadiene, isoprene, chloroprene, acrylamide, methacrylamide, acrylonitrile and methacrylonitrile. These monomers are used singly or in combination of two or more of them.

As the above film property-imparting polymer (a), there may be used a polyvinyl alcohol type resin (e.g., a hydrolyzate of polyacrylate or polymethacrylate, a hydrolyzate of polyvinyl acetate, a hydrolyzate of a copolymer of ethylene and vinyl acetate, a hydrolyzate of a copolymer of ethylene and acrylate, a hydrolyzate of a copolymer of vinyl chloride and vinyl acetate, a hydrolyzate of a copolymer of styrene and acrylate or methacrylate and a hydrolyzate of a copolymer of vinyltoluene and acrylate or methacrylate), a water-soluble salt of carboxyalkyl cellulose, water-soluble cellulose ethers such as hydroxypropyleneoxy cellulose ether, a water-soluble cellulose such as hydroxypropyloxy cellulose, a water-soluble salt of carboxyalkyl starch and polyvinyl pyrrolidone.

The weight average molecular weight (a value obtained by carrying out measurement by gel permeation chromatography and calculated on standard polystyrene) of the film property-imparting polymer (a) in the present invention is preferably 5,000 to 300,000, more preferably 20,000 to 150,000. If the weight average molecular weight is less than 5,000, film-forming property and flexibility tend to be lowered when a photosensitive element is prepared, while if it exceeds 300,000, developability (property that an unnecessary portion can be easily removed by development) tends to be lowered.

In order that the phosphor-containing photosensitive resin composition layer (A) can be developed by known various developing solutions, the carboxyl group content (which can be regulated by an acid value (mgKOH/g)) of the film property-imparting polymer (a) can be adjusted suitably.

For example, when development is carried out by using an alkaline aqueous solution of sodium carbonate, potassium carbonate or the like, the acid value is preferably 90 to 260. If the acid value is less than 90, development tends to be difficult, while if it exceeds 260, developing solution resistance (property that a portion which remains without being removed by development and becomes a pattern is not corroded by a developing solution) tends to be lowered.

When development is carried out by using an aqueous developing solution comprising water or an alkaline aqueous solution and at least one organic solvent, the acid value is preferably 16 to 260. If the acid value is less than 16, development tends to be difficult, while if it exceeds 260, developing solution resistance tends to be lowered.

Further, when development is carried out by using a developing solution (an emulsion developing solution) comprising water and at least one organic solvent which is not dissolved in water and when an organic solvent developing solution such as 1,1,1-trichloroethane is used, no carboxyl group may be contained.

As the photopolymerizable unsaturated compound (b) having an ethylenic unsaturated group in the present invention, there may be used all compounds which have been conventionally known as a photopolymerizable polyfunctional monomer.

For example, there may be mentioned a compound represented by the following formula (I):

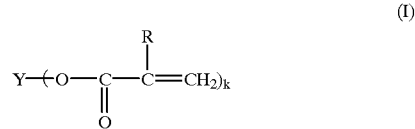

wherein R represents a hydrogen atom or a methyl group, k represents an integer of 1 to 10, and Y represents a saturated or unsaturated hydrocarbon residue or heterocyclic residue which may have a substituent(s), or a polyalkylene glycol residue

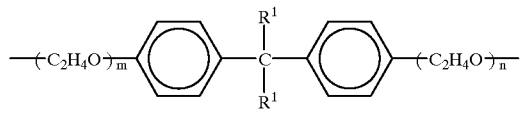

wherein $R^1$ represents a hydrogen atom, a methyl group, an ethyl group, a propyl group or a trifluoromethyl group, and m and n each independently represent an integer of 1 to 20.

In the formula (I), as the saturated or unsaturated hydrocarbon residue or heterocyclic residue which may have a substituent(s) represented by Y, there may be mentioned, for example, a straight, branched or alicyclic alkane residue having 1 to 22 carbon atoms, which may have a substituent (s) such as a halogen atom, a hydroxyl group, an amino group and a carboxyl group (e.g., a methane residue, an ethane residue, a propane residue, a cyclopropane residue, a butane residue, an isobutane residue, a cyclobutane residue, a pentane residue, an isopentane residue, a neopentane residue, a cyclopentane residue, a hexane residue, a cyclohexane residue, a haptane residue, a cycloheptane residue, an octane residue, a nonane residue and a decane residue), an aromatic cyclic residue (e.g., a benzene residue, a naphthalene residue, an anthracene residue, a biphenyl residue and a terphenyl residue) and a heterocyclic residue (e.g., a furan residue, a thiophene residue, a pyrrole residue, an oxazole residue, a thiazole residue, an imidazole residue, a pyridine residue, a pyrimidine residue, a pyrazine residue, a triazine residue, a quinoline residue and a quinoxaline residue).

Specifically, as a monomer having one unsaturated bond, there may be mentioned, for example, an ester type monomer of acrylic acid or methacrylic acid (e.g., methyl acrylate, methyl methacrylate, ethyl acrylate, ethyl methacrylate, n-propyl acrylate, n-propyl methacrylate, iso-propyl acrylate, iso-propyl methacrylate, n-butyl acrylate, n-butyl methacrylate, iso-butyl acrylate, iso-butyl methacrylate, sec-butyl acrylate, sec-butyl methacrylate, tert-butyl acrylate, tert-butyl methacrylate, pentyl acrylate, pentyl methacrylate, hexyl acrylate, hexyl methacrylate, heptyl acrylate, heptyl methacrylate, 2-ethylhexyl acrylate, 2-ethylhexyl methacrylate, octyl acrylate, octyl methacrylate, nonyl acrylate, nonyl methacrylate, decyl acrylate, decyl methacrylate, dodecyl acrylate, dodecyl methacrylate, tetradecyl acrylate, tetradecyl methacrylate, hexadecyl acrylate, hexadecyl methacrylate, octadecyl acrylate, octadecyl methacrylate, eicosyl acrylate, eicosyl methacrylate, docosyl acrylate, docosyl methacrylate, cyclopentyl acrylate, cyclopentyl methacrylate, cyclohexyl acrylate, cyclohexyl methacrylate, cycloheptyl acrylate, cycloheptyl methacrylate, benzyl acrylate, benzyl methacrylate, phenyl acrylate, phenyl methacrylate, methoxyethyl acrylate, methoxyethyl methacrylate, dimethylaminoethyl acrylate, dimethylaminoethyl methacrylate, dimethylaminopropyl acrylate, dimethylaminopropyl methacrylate, 2-chloroethyl acrylate, 2-chloroethyl methacrylate, 2-fluoroethyl acrylate, 2-fluoroethyl methacrylate, 2-cyanoethyl acrylate, 2-cyanoethyl methacrylate, diethylene glycol methoxy acrylate, diethylene glycol methoxy methacrylate, dipropylene glycol methoxy acrylate, dipropylene glycol methoxy methacrylate, triethylene glycol methoxy acrylate and triethylene glycol methoxy methacrylate), a styrene type monomer (e.g., styrene, α-methylstyrene and p-t-butylstyrene), a polyolefin type monomer (e.g., butadiene, isoprene and chloroprene), a vinyl type monomer (e.g., vinyl chloride and vinyl acetate), a nitrile type monomer (e.g., acrylonitrile and methacrylonitrile) and 1-(methacryloyloxyethoxycarbonyl)-2-(3'-chloro-2'-hydroxypropoxycarbonyl)benzene.

As a monomer having two unsaturated bonds, there may be mentioned, for example, ethylene glycol diacrylate, ethylene glycol dimethacrylate, diethylene glycol diacrylate, diethylene glycol dimethacrylate, triethylene glycol diacrylate, triethylene glycol dimethacrylate, tetraethylene glycol diacrylate, tetraethylene glycol dimethacrylate, polyethylene glycol diacrylate, polyethylene glycol dimethacrylate, hexapropylene glycol diacrylate, hexapropylene glycol dimethacrylate, polypropylene glycol diacrylate, polypropylene glycol dimethacrylate, butylene glycol diacrylate, butylene glycol dimethacrylate, neopentyl glycol diacrylate, neopentyl glycol dimethacrylate, 1,3-butanediol diacrylate, 1,3-butanediol dimethacrylate, 1,4-butanediol diacrylate, 1,4-butanediol dimethacrylate, 1,5-pentanediol diacrylate, 1,5-pentanediol dimethacrylate, 1,6-hexanediol diacrylate, 1,6-hexanediol dimethacrylate, pentaerythritol diacrylate, pentaerythritol dimethacrylate, trimethylolpropane diacrylate, trimethylolpropane dimethacrylate, bisphenol A diacrylate, bisphenol A dimethacrylate, 2,2-bis(4-acryloxyethoxyphenyl)propane, 2,2-bis(4-methacryloxyethoxyphenyl)propane, 2,2-bis(4-acryloxydiethoxyphenyl)propane, 2,2-bis(4-methacryloxydiethoxyphenyl)propane, 2,2-bis(4-acryloxypolyethoxyphenyl)propane, 2,2-bis(4-methacrylpolyethoxyphenyl)propane (in the formula (I), Y is

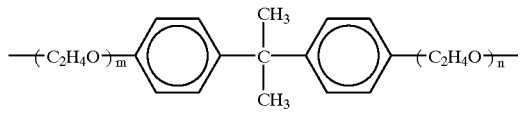

wherein m and n each independently represent an integer of 1 to 20), bisphenol A diglycidyl ether diacrylate, bisphenol A diglycidyl ether dimethacrylate and a urethane diacrylate compound.

As a monomer having three unsaturated bonds, there may be mentioned, for example, trimethylolpropane triacrylate, trimethylolpropane trimethacrylate, pentaerythritol triacrylate, pentaerythritol trimethacrylate, ethylene oxide-modified trimethylolpropane triacrylate, ethylene oxide-modified trimethylolpropane trimethacrylate, trimethylolpropane triglycidyl ether triacrylate and trimethylolpropane triglycidyl ether trimethacrylate.

As a monomer having four unsaturated bonds, there may be mentioned, for example, tetramethylolpropane tetraacrylate, tetramethylolpropane tetramethacrylate, pentaerythritol tetraacrylate and pentaerythritol tetramethacrylate.

As a monomer having five unsaturated bonds, there may be mentioned, for example, dipentaerythritol pentaacrylate and dipentaerythritol pentamethacrylate.

As a monomer having six unsaturated bonds, there may be mentioned, for example, dipentaerythritol hexaacrylate and dipentaerythritol hexamethacrylate.

Any of these monomers having an unsaturated bond(s) may be used so long as radical polymerization can be effected by irradiation of light, and these monomers having an unsaturated bond(s) are used singly or in combination of two or more of them.

It is necessary to remove unnecessary components of the phosphor-containing photosensitive resin composition layer (A) in the present invention by calcination when a phosphor pattern is prepared so that among the above photopolymerizable unsaturated compounds (b) having an ethylenic unsaturated group, preferred are polyethylene glycol dimethacrylate, polyethylene glycol diacrylate, polypropylene glycol dimethacrylate and polypropylene glycol diacrylate each having have good thermal decomposition property.

When a photosensitive element described below is prepared by using the phosphor-containing photosensitive resin composition layer (A) and from the point that storage stability after embedding in the space of the substrate for PDP described below (property that the photopolymerizable unsaturated compound (b) having an ethylenic unsaturated group in the phosphor-containing photosensitive resin composition layer (A) is migrated into the thermoplastic resin layer (B) described below is suppressed) can be improved and the point that at the time of heating under reduced pressure when the phosphor-containing photosensitive resin composition layer (A) is embedded in the space of the substrate for PDP described below, evaporation of the photopolymerizable unsaturated compound (b) having an ethylenic unsaturated group in the phosphor-containing photosensitive resin composition layer (A) can be suppressed, the weight average molecular weight of the photopolymerizable unsaturated compound (b) having an ethylenic unsaturated group is preferably 400 or more, more preferably 500 or more, particularly preferably 600 or more. The boiling point (760 mmHg, a found value or a calculated value) of the photopolymerizable unsaturated compound (b) having an ethylenic unsaturated group is not particularly limited so long as it is 300° C. or higher. However, from the points of stability and operatability when heating is carried out under reduced pressure, the boiling point (760 mmHg) is preferably 350° C. or higher, more preferably 400° C. or higher.

The photopolymerizable unsaturated compound (b) having an ethylenic unsaturated group, having a weight average molecular weight of 400 or more or the photopolymerizable unsaturated compound (b) having an ethylenic unsaturated group, having a boiling point (760 mmHg) of 300° C. or higher may be selected from, for example, photopolymerizable unsaturated compounds shown below.

As a monomer having one unsaturated bond, there may be mentioned, for example, an ester type monomer of acrylic acid or methacrylic acid (polyethylene glycol acrylate (the number of ethylene oxides is 9 to 50), polyethylene glycol methacrylate (the number of ethylene oxides is 9 to 50), methoxypolyethylene glycol acrylate (the number of ethylene oxides is 9 to 50), methoxypolyethylene glycol methacrylate (the number of ethylene oxides is 9 to 50), methoxypolypropylene glycol acrylate (the number of propylene oxides is 7 to 40), methoxypolypropylene glycol methacrylate (the number of propylene oxides is 7 to 40) or the like), a styrene type monomer, a polyolefin type monomer, a vinyl type monomer and a nitrile type monomer.

As a monomer having two unsaturated bonds, there may be mentioned, for example, polyethylene glycol diacrylate (the number of ethylene oxides is 9 to 50), polyethylene glycol dimethacrylate (the number of ethylene oxides is 9 to 50), hexapropylene glycol diacrylate, hexapropylene glycol dimethacrylate, polypropylene glycol diacrylate (the number of propylene oxides is 7 to 40), polypropylene glycol dimethacrylate (the number of propylene oxides is 7 to 40), polyethylene glycol polypropylene glycol diacrylate (the total number of ethylene oxides and propylene oxides is 7 to 50), polyethylene glycol polypropylene glycol dimethacrylate (the total number of ethylene oxides and propylene oxides is 7 to 50), 2,2-bis(4-acryloxydiethoxyphenyl)propane, 2,2-bis(4-methacryloxydiethoxyphenyl)propane, 2,2-bis(4-acryloxypolyethoxyphenyl)propane, 2,2-bis(4-methacryloxypolyethoxyphenyl)propane (in the formula (I), Y is

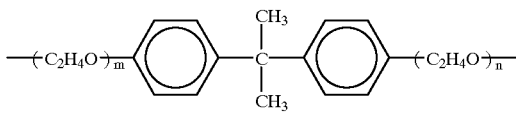

(wherein $4 \leq m+n \leq 40$)), bisphenol A diglycidyl ether diacrylate, bisphenol A diglycidyl ether dimethacrylate and a urethane diacrylate compound such as a reaction product of trimethylhexamethylene diisocyanate/cyclohexanedimethanol/2-hydroxyethyl acrylate (a molar ratio of 2/1/2).

As a monomer having three unsaturated bonds, there may be mentioned, for example, propylene oxide-modified trimethylolpropane trimethacrylate and alkyl-modified dipentaerythritol triacrylate.

As a monomer having four unsaturated bonds, there may be mentioned, for example, ditrimethylolpropane tetramethacrylate, alkyl-modified dipentaerythritol tetraacrylate, alkyl-modified dipentaerythritol tetramethacrylate, ethylene oxide-modified pentaerythritol tetraacrylate and ethylene oxide-modified pentaerythritol tetramethacrylate.

As a monomer having five unsaturated bonds, there may be mentioned, for example, dipentaerythritol pentaacrylate, dipentaerythritol pentamethacrylate, dipentaerythritol monohydroxypentaacrylate, dipentaerythritol monohydroxypentamethacrylate and alkyl-modified dipentaerythritol pentaacrylate.

As a monomer having six unsaturated bonds, there may be mentioned, for example, dipentaerythritol hexaacrylate and dipentaerythritol hexamethacrylate.

These monomers are used singly or in combination of two or more of them.

As the photopolymerization initiator (c) which produces free radical by irradiation of active light in the present invention, there may be mentioned, for example, an aromatic ketone (e.g., benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 1-hydroxy-cyclohexyl-phenyl-ketone, 2,4-diethylthioxanthone, 2-ethylanthraquinone and phenanthrenequinone), a benzoin ether (e.g., benzoin methyl ether, benzoin ethyl ether and benzoin phenyl ether), a benzoin (e.g., methyl benzoin and ethyl benzoin), a benzyl derivative (e.g., 2-benzyl-2-dimethylamino-1-(4-morpholinophenyl)butanone-1, 2-methyl-1-(4-(methylthio)phenyl)-2-morpholinopropanone-1, 2,2-dimethoxy-1,2-diphenylethan-1-one and benzyldimethyl-ketal), a 2,4,5-triarylimidazole dimer (e.g., a 2-(o-chlorophenyl)-4,5-diphenylimidazole dimer, a 2-(o-chlorophenyl)-4,5-di(m-methoxyphenyl)imidazole dimer, a 2-(o-fluorophenyl)-4,5-phenylimidazole dimer, a 2-(o-methoxyphenyl)-4,5-diphenylimidazole dimer, a 2-(p-methoxyphenyl)-4,5-diphenylimidazole dimer, a 2,4-di(p-methoxyphenyl)-5-phenylimidazole dimer and a 2-(2,4-dimethoxyphenyl)-4,5-diphenylimidazole dimer) and an acridine derivative (e.g., 9-phenylacridine and 1,7-bis(9,9'-acridinyl)heptane). These photopolymerization initiators are used singly or in combination of two or more of them.

The phosphor (d) is not particularly limited, and a phosphor comprising a common metal oxide as a main component is used.

As a phosphor which emits red light, there may be mentioned, for example, $Y_2O_2S$:Eu, $Zn_3(PO_4)_2$:Mn, $Y_2O_3$:Eu, $YVO_4$:Eu, $(Y,Gd)BO_3$:Eu, $\gamma$-$Zn_3(PO_4)_2$:Mn and $(ZnCd)S$:Ag+$In_2O$.

As a phosphor which emits green light, there may be mentioned, for example, ZnS:Cu, $Zn_2SiO_4$:Mn, ZnS:Cu+$Zn_2SiO_4$:Mn, $Gd_2O_2S$:Tb, $Y_3Al_5O_{12}$:Ce, ZnS:Cu,Al, $Y_2O_2S$:Tb, ZnO:Zn, ZnS:Cu,Al+$In_2O3$, $LaPO_4$:Ce,Tb and $BaO.6Al_2O_3$:Mn.

As a phosphor which emits blue light, there may be mentioned, for example, ZnS:Ag, ZnS:Ag,Al, ZnS:Ag,Ga,Al, ZnS:Ag,Cu,Ga,Cl, ZnS:Ag+$In_2O_3$, $Ca_2B_5O_9Cl$:$Eu^{2+}$, $(Sr,Ca,Ba,Mg)_{10}(PO_4)_6Cl_2$:$Eu^{2+}$, $Sr_{10}(PO_4)_6Cl_2$:$Eu^{2+}$, $BaMgAl_{10}O_{17}$:$Eu^{2+}$, $BaMgAl_{14}O_{23}$:$Eu^{2+}$ and $BaMgAl_{16}O_{26}$:$Eu^{2+}$.

The particle size of the phosphor (d) in the present invention is preferably 0.1 to 20 $\mu$m, more preferably 1 to 15 $\mu$m, particularly preferably 2 to 8 $\mu$m. If the particle size is less than 0.1 $\mu$m, light emission efficiency tends to be lowered, while if it exceeds 20 $\mu$m, dispersibility tends to be lowered.

The shape of the phosphor (d) in the present invention is preferably spherical, and it is preferred that its surface area is smaller.

The formulation amount of Component (a) in the present invention is preferably 10 to 90 parts by weight, more preferably 20 to 80 parts by weight based on the total amount of Component (a) and Component (b) being 100 parts by weight. If the formulation amount is less than 10 parts by weight, when the resulting material is supplied as a photosensitive element in a roll state, a phosphor-containing photosensitive resin is exuded from a roll edge portion (hereinafter referred to as "edge fusion") so that it is difficult to carry out drawing from a roll at the time of lamination of a photosensitive element, and an exuded portion is partially and excessively embedded in the space of the substrate for PDP, whereby a problem of significant lowering of production yield is caused or film-forming property tends to be lowered. If the formulation amount exceeds 90 parts by weight, sensitivity tends to be insufficient.

The formulation amount of Component (b) in the present invention is preferably 10 to 90 parts by weight, more preferably 20 to 80 parts by weight based on the total amount of Component (a) and Component (b) being 100 parts by weight. If the formulation amount is less than 10 parts by weight, the sensitivity of a phosphor-containing photosensitive resin composition tends to be insufficient. If the formulation amount exceeds 90 parts by weight, a photocured product tends to be brittle, and when a photosensitive element is prepared, a phosphor-containing photosensitive resin composition tends to be exuded from an edge portion by flowing, or film-forming property tends to be lowered.

The formulation amount of Component (c) in the present invention is preferably 0.01 to 30 parts by weight, more preferably 0.1 to 20 parts by weight based on the total amount of Component (a) and Component (b) being 100 parts by weight. If the formulation amount is less than 0.01 part by weight, the sensitivity of a phosphor-containing photosensitive resin composition tends to be insufficient. If the formulation amount exceeds 30 parts by weight, photocuring of an inner portion tends to be insufficient due to increase in absorption of active light at an exposed surface of a phosphor-containing photosensitive resin composition.

The formulation amount of Component (d) in the present invention is preferably 10 to 400 parts by weight, more preferably 50 to 380 parts by weight based on the total amount of Component (a), Component (b) and Component (c) being 100 parts by weight. If the formulation amount is less than 10 parts by weight, when light is emitted as PDP, light emission efficiency tends to be lowered. If the formulation amount exceeds 400 parts by weight, when a photosensitive element is prepared, film-forming property tends to be lowered, or flexibility tends to be lowered.

From the points of sensitivity, pattern-forming property and safety, the phosphor-containing photosensitive resin composition layer (A) in the present invention may comprise (e) a photopolymerizable high molecular weight binder having an ethylenic unsaturated group, (f) a photopolymerization initiator which produces free radical by irradiation of active light and (g) a phosphor.

As the above photopolymerizable high molecular weight binder (e) having an ethylenic unsaturated group, there may be mentioned a photopolymerizable vinyl copolymer obtained by subjecting a compound having at least one ethylenic unsaturated group and one functional group such as an oxirane ring, an isocyanate group, a hydroxyl group and a carboxyl group to accition reaction with a vinyl copolymer having a functional group such as a carboxyl group, a hydroxyl group, an amino group, an isocyanate group, an oxirane ring and an acid anhydride.

As a vinyl monomer to be used in the vinyl copolymer having a functional group such as a carboxyl group, a hydroxyl group, an amino group, an oxirane ring and an acid anhydride, there may be mentioned, for example, a vinyl monomer having a functional group such as a carboxyl group, a hydroxyl group, an amino group, an oxirane ring and an acid anhydride, such as acrylic acid, methacrylic acid, maleic acid, fumaric acid, itaconic acid, cinnamic acid, 2-hydroxyethyl acrylate, 2-hydroxyethyl methacrylate, acrylamide, methacrylamide, isocyanate-ethyl methacrylate, glycidyl acrylate, glycidyl methacrylate and maleic anhydride. As other vinyl monomer, there may be mentioned, for example, methyl acrylate, methyl methacrylate, ethyl acrylate, ethyl methacrylate, n-propyl acrylate, n-propyl methacrylate, iso-propyl acrylate, iso-propyl methacrylate, n-butyl acrylate, n-butyl methacrylate, iso-butyl acrylate, iso-butyl methacrylate, sec-butyl acrylate, sec-butyl methacrylate, tert-butyl acrylate, tert-butyl methacrylate, pentyl acrylate, pentyl methacrylate, hexyl acrylate, hexyl methacrylate, heptyl acrylate, heptyl methacrylate, 2-ethylhexyl acrylate, 2-ethylhexyl methacrylate, octyl acrylate, octyl methacrylate, nonyl acrylate, nonyl methacrylate, decyl acrylate, decyl methacrylate, dodecyl acrylate, dodecyl methacrylate, tetradecyl acrylate, tetradecyl methacrylate, hexadecyl acrylate, hexadecyl methacrylate, octadecyl acrylate, octadecyl methacrylate, eicosyl acrylate, eicosyl methacrylate, docosyl acrylate, docosyl methacrylate, cyclopentyl acrylate, cyclopentyl methacrylate, cyclohexyl acrylate, cyclohexyl methacrylate, cycloheptyl acrylate, cycloheptyl methacrylate, benzyl acrylate, benzyl methacrylate, phenyl acrylate, phenyl methacrylate, methoxyethyl acrylate, methoxyethyl methacrylate, diethylene glycol methoxy acrylate, diethylene glycol methoxy methacrylate, dipropylene glycol methoxy acrylate, dipropylene glycol methoxy methacrylate, triethylene glycol methoxy acrylate, triethylene glycol methoxy methacrylate, dimethylaminoethyl acrylate, dimethylaminoethyl methacrylate, diethylaminoethyl acrylate, diethylaminoethyl methacrylate, dimethylaminopropyl acrylate, dimethylaminopropyl methacrylate, 2-chloroethyl acrylate, 2-chloroethyl methacrylate, 2-fluoroethyl acrylate, 2-fluoroethyl methacrylate, 2-cyanoethyl acrylate, 2-cyanoethyl methacrylate, styrene, α-methylstyrene, vinyltoluene, vinyl chloride, vinyl acetate, N-vinyl pyrrolidone, butadiene, isoprene, chloroprene, acrylonitrile and methacrylonitrile. These monomers are used singly or in combination of two or more of them with the vinyl monomer having a functional group such as a carboxyl group, a hydroxyl group, an amino group, an oxirane ring and an acid anhydride being an indispensable component.

As the compound having at least one ethylenic unsaturated group and one functional group such as an oxirane ring, an isocyanate group, a hydroxyl group, a carboxyl group, an amino group and an acid anhydride, there may be mentioned, for example, glycidyl acrylate, glycidyl methacrylate, ethyl isocyanate methacrylate, 2-hydroxyethyl acrylate, 2-hydroxyethyl methacrylate, acrylic acid, methacrylic acid, maleic acid, fumaric acid, itaconic acid, cinnamic acid, acrylamide, methacrylamide and maleic anhydride. These compounds are used singly or in combination of two or more of them.

In the following, examples of the photopolymerizable high molecular weight binder (e) having an ethylenic unsaturated group are shown:

(1) a high molecular weight compound obtained by dissolving a vinyl copolymer containing methacrylic acid in an inert solvent, adding a catalyst such as triethylamine, triethyldiamine and benzyltriethylammonium chloride and a polymerization inhibitor such as hydroquinone to the solution and subjecting glycidyl methacrylate and a carboxyl group of methacrylic acid to addition reaction;

(2) a high molecular weight compound obtained by dissolving a vinyl copolymer containing ethyl isocyanate methacrylate in an inert solvent, adding a catalyst such as triethylamine, triethyldiamine and benzyltriethylammonium chloride and a polymerization inhibitor such as hydroquinone to the solution and subjecting 2-hydroxyethyl methacrylate and an isocyanate group of ethyl isocyanate methacrylate to addition reaction;

(3) a high molecular weight compound obtained by dissolving a vinyl copolymer containing 2-hydroxyethyl methacrylate in an inert solvent, adding a catalyst such as triethylamine, triethyldiamine and benzyltriethylammonium chloride and a polymerization inhibitor such as hydroquinone to the solution and subjecting ethyl isocyanate methacrylate and a hydroxyl group of 2-hydroxyethyl methacrylate to addition reaction;

(4) a high molecular weight compound obtained by dissolving a vinyl copolymer containing maleic anhydride in an inert solvent, adding a catalyst such as triethylamine, triethyldiamine and benzyltriethylammonium chloride and a polymerization inhibitor such as hydroquinone to the solution and subjecting 2-hydroxyethyl acrylate and the acid anhydride to addition reaction;

(5) a high molecular weight compound obtained by dissolving a vinyl copolymer containing 2-hydroxyethyl methacrylate in an inert solvent, adding a catalyst such as triethylamine, triethyldiamine and benzyltriethylammonium chloride and a polymerization inhibitor such as hydroquinone to the solution and subjecting maleic anhydride and a hydroxyl group of 2-hydroxyethyl methacrylate to addition reaction; and (6) a high molecular weight compound obtained by dissolving a vinyl copolymer containing methacrylic acid in an inert solvent, adding a catalyst such as triethylamine, triethyldiamine and benzyltriethylammonium chloride and a polymerization inhibitor such as hydroquinone to the solution, subjecting glycidyl methacrylate and a carboxyl group of methacrylic acid to addition reaction and then further subjecting maleic anhydride and a produced hydroxyl group to addition reaction.

The weight average molecular weight of the photopolymerizable high molecular weight binder (e) having an ethylenic unsaturated group is preferably 5,000 to 300,000, more preferably 20,000 to 150,000. If the weight average molecular weight is less than 5,000, when a photosensitive element is prepared, film-forming property and flexibility tend to be lowered, while if it exceeds 300,000, developability (property that an unnecessary portion can be easily removed by development) tends to be lowered.

In order that the phosphor-containing photosensitive resin composition layer (A) can be developed by known various developing solutions, the carboxyl group content (which can be regulated by an acid value (mgKOH/g)) of the photopolymerizable high molecular weight binder (e) having an ethylenic unsaturated group can be adjusted suitably.

For example, when development is carried out by using an alkaline aqueous solution of sodium carbonate, potassium carbonate or the like, the acid value is preferably 90 to 260. If the acid value is less than 90, development tends to be difficult, while if it exceeds 260, developing solution resistance (property that a portion which remains without being removed by development and becomes a pattern is not corroded by a developing solution) tends to be lowered.

When development is carried out by using an aqueous developing solution comprising water or an alkaline aqueous solution and at least one organic solvent, the acid value is preferably 16 to 260. If the acid value is less than 16, development tends to be difficult, while if it exceeds 260, developing solution resistance tends to be lowered.

Further, when development is carried out by using a developing solution (an emulsion developing solution) comprising water and at least one organic solvent which is not dissolved in water and when an organic solvent developing solution such as 1,1,1-trichloroethane is used, no carboxyl group may be contained.

The concentration of the ethylenic unsaturated group of the photopolymerizable high molecular weight binder (e) having an ethylenic unsaturated group is preferably $3.0 \times 10^{-4}$ to $5.8 \times 10^{-3}$ mol/g, more preferably $6.0 \times 10^{-4}$ to $5.5 \times 10^{-3}$ mol/g, particularly preferably $9 \times 10^{-4}$ to $5.0 \times 10^{-3}$ mol/g. If the concentration of the ethylenic unsaturated group is less than $3.0 \times 10^{-4}$ mol/g, developing solution resistance (property that a portion which remains without being removed by development and becomes a pattern is not corroded by a developing solution) tends to be lowered, while if it exceeds $5.8 \times 10^{-3}$ mol/g, gelation tends to occur during preparation of the photopolymerizable high molecular weight binder (e) having an ethylenic unsaturated group.

As the photopolymerization initiator (f) which produces free radical by irradiation of active light in the present invention, there may be used, for example, the above photopolymerization initiator (c) which produces free radical by irradiation of active light, which can be used in the photosensitive resin composition constituting the phosphor-containing photosensitive resin composition layer (A). These photopolymerization initiators are used singly or in combination of two or more of them.

The phosphor (g) in the present invention is not particularly limited, and there may be used the above phosphor (d) which can be used in the photosensitive resin composition constituting the phosphor-containing photosensitive resin composition layer (A).

The formulation amount of Component (f) in the present invention is preferably 0.01 to 30 parts by weight, more preferably 0.1 to 20 parts by weight based on 100 parts by weight of Component (e). If the formulation amount is less than 0.01 part by weight, the sensitivity of a phosphor-containing photosensitive resin composition tends to be insufficient, while if it exceeds 30 parts by weight, photocuring of an inner portion tends to be insufficient due to increase in absorption of active light at an exposed surface of a phosphor-containing photosensitive resin composition.

The formulation amount of Component (g) in the present invention is preferably 10 to 400 parts by weight, more preferably 50 to 380 parts by weight, particularly preferably 70 to 350 parts by weight based on 100 parts by weight of Component (e). If the formulation amount is less than 10 parts by weight, when light is emitted as PDP, light emission efficiency tends to be lowered. If the formulation amount exceeds 400 parts by weight, when a photosensitive element is prepared, film-forming property tends to be lowered, or flexibility tends to be lowered.

In the phosphor-containing photosensitive resin composition layer (A) constituted by the photopolymerizable high molecular weight binder (e) having an ethylenic unsaturated group, the photopolymerization initiator (f) which produces free radical by irradiation of active light and the phosphor (g) in the present invention, for the purpose of improving sensitivity, a photopolymerizable unsaturated compound having an ethylenic unsaturated group may be used when a photosensitive element is prepared and in such a formulation amount range that storage stability (property that a phenomenon that the photopolymerizable unsaturated compound having an ethylenic unsaturated group in the phosphor-containing photosensitive resin composition layer (A) is migrated into the thermoplastic resin layer (B) described below is suppressed, and the thermoplastic resin layer (B) is not photocured thereby) after embedding in the space of the substrate for PDP can be maintained.

As the photopolymerizable unsaturated compound having an ethylenic unsaturated group, there may be mentioned, for example, the above photopolymerizable unsaturated compound (b) having an ethylenic unsaturated group, which can be used in the photosensitive resin composition constituting the phosphor-containing photosensitive resin composition layer (A). These compounds are used singly or in combination of two or more of them.

The formulation amount of the photopolymerizable unsaturated compound having an ethylenic unsaturated group, which can be used in the phosphor-containing photosensitive resin composition layer (A) constituted by the photopolymerizable high molecular weight binder (e) having an ethylenic unsaturated group, the photopolymerization initiator (f) which produces free radical by irradiation of active light and the phosphor (g) in the present invention is preferably 1 to 80 parts by weight, more preferably 3 to 70 parts by weight, particularly preferably 5 to 60 parts by weight based on the total amount of Component (e) and the photopolymerizable unsaturated compound having an ethylenic unsaturated group being 100 parts by weight. If the formulation amount is less than 1 part by weight, when a photosensitive element is prepared, film-forming property tends to be lowered. If the formulation amount exceeds 80 parts by weight, developing solution resistance tends to be lowered.

In the phosphor-containing photosensitive resin composition layer (A) constituted by the photopolymerizable high molecular weight binder (e) having an ethylenic unsaturated group, the photopolymerization initiator (f) which produces free radical by irradiation of active light and the phosphor (g) in the present invention, for the purpose of improving flexibility when a photosensitive element is prepared, a film property-imparting polymer may be used.

As the film property-imparting polymer, there may be used, for example, the above film property-imparting polymer (a) which can be used in the photosensitive resin composition constituting the phosphor-containing photosensitive resin composition layer (A). These polymers are used singly or in combination of two or more of them.

The formulation amount of the film property-imparting polymer which can be used in the phosphor-containing photosensitive resin composition layer (A) constituted by the photopolymerizable high molecular weight binder (e) having an ethylenic unsaturated group, the photopolymerization initiator (f) which produces free radical by irradiation of active light and the phosphor (g) in the present invention is preferably 1 to 80 parts by weight, more preferably 3 to 70 parts by weight, particularly preferably 5 to 60 parts by weight based on the total amount of Component (e) and the film property-imparting polymer being 100 parts by weight. If the formulation amount is less than 1 part by weight, when a photosensitive element is prepared, no effect of improving flexibility tends to be obtained. If the formulation amount exceeds 80 parts by weight, sensitivity tends to be lowered.

In the photosensitive resin composition constituting the phosphor-containing photosensitive resin composition layer (A) in the present invention, a compound having a carboxyl group may be contained in order to prevent thickening for a long period of time and obtain good storage stability.

As the compound having a carboxyl group, there may be mentioned, for example, a saturated aliphatic acid, an unsaturated aliphatic acid, an aliphatic dibasic acid, an aromatic dibasic acid, an aliphatic tribasic acid and an aromatic tribasic acid.

As a specific example thereof, there may be mentioned, for example, formic acid, acetic acid, chloroacetic acid, dichloroacetic acid, trichloroacetic acid, propionic acid capric acid, undecanoic acid, lauric acid, tridecanoic acid, myristic acid, pentadecanoic acid, palmitic acid, heptadecanoic acid, stearic acid, nonadecanoic acid, arachidic acid, palmitoleic acid, oleic acid, elaidic acid, linolenic acid, linoleic acid, oxalic acid, malonic acid, methylmalonic acid, ethylmalonic acid, monomethyl malonate, monoethyl malonate, succinic acid, methylsuccinic acid, adipic acid, methyladipic acid, pimelic acid, suberic acid, azelaic acid, sebacic acid, maleic acid, itaconic acid, phthalic acid, isophthalic acid, terephthalic acid, trimellitic acid, citric acid, salicylic acid, pyruvic acid and malic acid.

Among them, from the point that an effect of suppressing thickening is high, oxalic acid, malonic acid, methylmalonic acid, ethylmalonic acid and citric acid are preferred, and oxalic acid, malonic acid and citric acid are more preferred. These compounds are used singly or in combination of two or more of them.

The formulation amount of the compound having a carboxyl group is preferably 0.01 to 30 parts by weight based on 100 parts by weight of Component (a) or Component (e). If the formulation amount is less than 0.01 part by weight, an effect of storage stability tends to be lowered, while if it exceeds 30 parts by weight, sensitivity tends to be insufficient.

In order to obtain good dispersion of the phosphor, it is preferred to add a dispersant to the photosensitive resin composition constituting the phosphor-containing photosensitive resin composition layer (A) in the present invention.

As the dispersant, there may be mentioned an inorganic dispersant (e.g., silica gel type, bentonite type, kaolinite type, talc type, hectorite type, montmorillonite type, saponite type and beidellite type) and an organic dispersant (e.g., aliphatic acid amide type, aliphatic acid ester type, polyethylene oxide type, a sulfate type anion surfactant, polycarboxylic acid amine salt type, polycarboxylic acid type, polyamide type, high molecular weight polyether type, acryl copolymer type and special silicone type). These dispersants are used singly or in combination of two or more of them.

The amount of the dispersant to be used is not particularly limited, but it is preferably 0.01 to 100 parts by weight based on 100 parts by weight of Component (a) or Component (e). If the amount to be used is less than 0.01 part by weight, an effect to be brought about by addition tends not to appear, while if it exceeds 100 parts by weight, precision of pattern formation (property that a pattern comprising a phosphor-containing photosensitive resin composition can be obtained with dimensional precision and a desired shape after development) tends to be lowered.

In the photosensitive resin composition constituting the phosphor-containing photosensitive resin composition layer (A) in the present invention, it is preferred to use a binding agent for the purpose of preventing peeling of the phosphor from the substrate for PDP after calcination.

As the binding agent, there may be mentioned, for example, a low melting point glass, a metal alkoxide and a silane coupling agent. These binding agents are used singly or in combination of two or more of them.

The amount of the binder to be used is not particularly limited, but it is preferably 0.01 to 100 parts by weight, more preferably 0.05 to 50 parts by weight, particularly preferably 0.1 to 30 parts by weight based on 100 parts by weight of Component (d) or Component (g). If the amount to be used is less than 0.01 part by weight, an effect of binding the phosphor tends not to appear, while if it exceeds 100 parts by weight, light emission efficiency tends to be lowered.

In order to obtain good film property, a plasticizer may be added to the phosphor-containing photosensitive resin composition layer (A) in the present invention.

As the plasticizer, there may be mentioned a compound represented by the formula (II):

(II)

wherein R represents a hydrogen atom or a methyl group, $Y^1$ represents a hydrogen atom, a saturated hydrocarbon group which may have a substituent(s) or a polyalkylene glycol residue, $Y^2$ represents a hydroxyl group, a saturated hydrocarbon group which may have a substituent(s) or a polyalkylene glycol residue, and n represents an integer of 1 to 20, polypropylene glycol and a derivative thereof, polyethylene glycol and a derivative thereof, dioctyl phthalate, diheptyl phthalate, dibutyl phthalate, tricresyl phosphate, cresyldiphenyl phosphate and biphenyldiphenyl phosphate.

The formulation amount of the plasticizer is preferably 10 to 90 parts by weight, more preferably 20 to 80 parts by weight, particularly preferably 30 to 70 parts by weight based on 100 parts by weight of Component (a) or Component (e). If the formulation amount is less than 10 parts by weight, when a photosensitive element is prepared, an effect of film-forming property tends to be low. If the formulation amount exceeds 90 parts by weight, the sensitivity of the phosphor-containing photosensitive resin composition layer (A) tends to be insufficient.

If necessary, a dye, a color-forming agent, a pigment, a polymerization inhibitor, a surface-modifying agent, a stabilizer, an adhesiveness-imparting agent and a thermosetting agent may be added to the photosensitive resin composition constituting the phosphor-containing photosensitive resin composition layer (A) in the present invention.

It is necessary to remove unnecessary components by calcination at the time of preparing a phosphor pattern described below, and it is necessary that the photosensitive resin composition other than the phosphor (d), the phosphor (g) and the binding agent in the photosensitive resin composition constituting the phosphor-containing photosensitive resin composition layer (A) in the present invention has good thermal decomposition property. Therefore, it is preferred that the photosensitive resin composition other than the phosphor (d), the phosphor (g) and the binding agent does not contain elements other than carbon, hydrogen, oxygen and nitrogen as elements constituting said composition.

The phosphor-containing photosensitive resin composition layer (A) in the present invention can be obtained by dissolving the above respective components constituting said layer in or mixing said components with a solvent which can dissolve or disperse said components to prepare a solution in which said components are dispersed uniformly and coating the solution on a support film, followed by drying.

As the solvent which can dissolve or disperse the above respective components constituting the phosphor-containing photosensitive resin composition layer (A), there may be mentioned, for example, toluene, acetone, methyl ethyl ketone, methyl isobutyl ketone, methyl cellosolve, ethyl cellosolve, γ-butyrolactone, N-methylpyrrolidone, dimethylformamide, tetramethylsulfone, diethylene glycol dimethyl ether, diethylene glycol monobutyl ether, chloroform, methylene chloride, methyl alcohol and ethyl alcohol. These solvents are used singly or in combination of two or more of them.

As the support film, there may be mentioned a support film which is chemically and thermally stable and constituted by a flexible substance, for example, polyethylene terephthalate, polycarbonate, polyethylene and polypropylene. Among them, polyethylene terephthalate and polyethylene are preferred, and polyethylene terephthalate is more preferred.

It is required that the support film can be removed later from the phosphor-containing photosensitive resin composition layer (A) so that it should not be a film subjected to surface treatment or comprising a material which makes removing impossible.

The thickness of the support film is preferably 5 to 100 $\mu$m, more preferably 10 to 90 $\mu$m.

As a coating method, a known method may be used, and there may be mentioned, for example, a knife coating method, a roll coating method, a spray coating method, a gravure coating method, a bar coating method and a curtain coating method.

In the coating step, the material of a portion of a coating apparatus, contacted with the solution in which the above respective components constituting the phosphor-containing photosensitive resin composition layer (A) are dispersed uniformly by dissolving said components in or mixing said components with the solvent which can dissolve or disperse said components is preferably a non-metallic material. When the material of a portion of a coating apparatus, contacted with the solution constituting the phosphor-containing photosensitive resin composition layer (A) is a metal, the coating apparatus contacted with the solution constituting the phosphor-containing photosensitive resin composition layer (A) is polished by the phosphor in said solution, and powder generated by polishing tends to migrate, as impurity, into the solution constituting the phosphor-containing photosensitive resin composition layer (A).

The drying temperature is preferably 60 to 130° C., and the drying time is preferably 3 minutes to 1 hour.

The thickness of the phosphor-containing photosensitive resin composition layer (A) in the present invention is not particularly limited, but it is preferably 10 to 200 $\mu$m, more preferably 15 to 150 $\mu$m, particularly preferably 20 to 100 $\mu$m. If the thickness is less than 10 $\mu$m, a phosphor pattern after calcination described below tends to be thin to lower light emission efficiency, while if it exceeds 200 $\mu$m, a phosphor pattern after calcination tends to be thick to reduce a light emission area of a phosphor surface, which results in lowering of light emission efficiency.

The viscosity at 100° C. of the phosphor-containing photosensitive resin composition layer (A) in the present invention is preferably 1 to $1\times10^9$ Pa·sec, more preferably 2 to $1\times10^8$ Pa·sec, particularly preferably 5 to $1\times10^7$ Pa·sec, extremely preferably 10 to $1\times10^6$ Pa·sec. If the viscosity at 100° C. is less than 1 Pa·sec, the viscosity at room temperature becomes too low so that when a photosensitive element is prepared, the phosphor-containing photosensitive resin composition layer (A) tends to be exuded from an edge portion by flowing, and film-forming property tends to be lowered. If the viscosity at 100° C. exceeds $1\times10^9$ Pa·sec, property of forming the phosphor-containing photosensitive resin composition layer (A) on the inner surface of a concave portion of a substrate having unevenness described below tends to be lowered.

With respect to the sensitivity of the phosphor-containing photosensitive resin composition layer (A) in the present invention, when a predetermined active light irradiation dose of active light is irradiated imagewisely by using a step tablet of 21 grades produced by Hitachi Chemical Co., Ltd. or the like in the step of irradiating active light imagewisely described below and development is carried out in the step of removing an unnecessary portion(s) by development described below, the number of step tablet grades of the remaining phosphor-containing photosensitive resin composition layer (A) is preferably 1 to 21 grades, more preferably 1.5 to 18 grades, particularly preferably 2 to 15 grades.

With respect to the resolution of the phosphor-containing photosensitive resin composition layer (A) in the present invention, when a predetermined active light irradiation dose of active light is irradiated imagewisely by using a photomask for evaluating resolution produced by Hitachi Chemical Co., Ltd. or the like and development is carried out in the step of removing an unnecessary portion(s) by development described below, the minimum line/space of the remaining the phosphor-containing photosensitive resin composition layer (A) is preferably 1 mm/1 mm or less, more preferably 900 $\mu$m/900 $\mu$m or less, particularly preferably 800 $\mu$m/800 $\mu$m.

With respect to the adhesiveness of the phosphor-containing photosensitive resin composition layer (A) in the present invention, when a predetermined active light irradiation dose of active light is irradiated imagewisely by using a photomask for evaluating adhesiveness produced by Hitachi Chemical Co., Ltd. or the like and development is carried out in the step of removing an unnecessary portion(s) by development described below, the minimum line/space of the remaining the phosphor-containing photosensitive resin composition layer (A) is preferably 400 μm/400 μm or less, more preferably 350 μm/400 μm or less, particularly preferably 300 μm/400 μm.

On the phosphor-containing photosensitive resin composition layer (A) in the present invention, a peelable cover film may be further laminated.

As the cover film, there may be mentioned polyethylene, polypropylene, polyethylene terephthalate and polycarbonate. It is preferred that the adhesive strength of the cover film to the phosphor-containing photosensitive resin composition layer (A) is smaller than the adhesive strength of the cover film to the support film.

The thickness of the cover film is not particularly limited, but it is preferably 5 to 100 μm, more preferably 10 to 90 μm.

The photosensitive element of the present invention obtained as described above can be stored by being wound in a roll state.

A resin constituting the thermoplastic resin layer (B) in the present invention is not particularly limited so long as it is softened at temperature at the time of contact bonding under heating, and there may be mentioned, for example, polyethylene, polypropylene, polyvinyl chloride, polyvinyl acetate, polyvinylidene chloride, polystyrene, polyvinyltoluene, polyacrylate, polymethacrylate, a copolymer of ethylene and vinyl acetate, a copolymer of ethylene and acrylate, a copolymer of vinyl chloride and vinyl acetate, a copolymer of styrene and acrylate or methacrylate, a copolymer of vinyltoluene and acrylate or methacrylate, a polyvinyl alcohol type resin (e.g., a hydrolyzate of polyacrylate or polymethacrylate, a hydrolyzate of polyvinyl acetate, a hydrolyzate of a copolymer of ethylene and vinyl acetate, a hydrolyzate of a copolymer of ethylene and acrylate, a hydrolyzate of a copolymer of vinyl chloride and vinyl acetate, a hydrolyzate of a copolymer of styrene and acrylate or methacrylate and a hydrolyzate of a copolymer of vinyltoluene and acrylate or methacrylate), a water-soluble salt of carboxyalkyl cellulose, water-soluble cellulose ethers, a water-soluble salt of carboxyalkyl starch, polyvinyl pyrrolidone and a resin having a carboxyl group obtained by copolymerizing an unsaturated carboxylic acid and an unsaturated monomer which is copolymerizable therewith.

From the points of preventing mixing of colors and improving operatability, the thermoplastic resin layer (B) in the present invention may be constituted by a photosensitive resin composition comprising (h) a thermoplastic resin, (i) a photopolymerizable unsaturated compound having an ethylenic unsaturated group and (j) a photopolymerization initiator which produces free radical by irradiation of active light.

As the thermoplastic resin (h), there may be used a resin which can be used as the above resin constituting the thermoplastic resin layer (B), and the above film property-imparting polymer (a) which can be used in the photosensitive resin composition constituting the phosphor-containing photosensitive resin composition layer (A).

As the photopolymerizable unsaturated compound (i) having an ethylenic unsaturated group, there may be used the above photopolymerizable unsaturated compound (b) having an ethylenic unsaturated group, which can be used in the photosensitive resin composition constituting the phosphor-containing photosensitive resin composition layer (A).

As the photopolymerization initiator (j) which produces free radical by irradiation of active light, there may be used the above photopolymerization initiator (c) which produces free radical by irradiation of active light, which can be used in the photosensitive resin composition constituting the phosphor-containing photosensitive resin composition layer (A)

The formulation amount of Component (h) is preferably 10 to 90 parts by weight, more preferably 20 to 80 parts by weight based on the total amount of Component (h) and Component (i) being 100 parts by weight. If the formulation amount is less than 10 parts by weight, when a photosensitive element is prepared, a photosensitive resin composition tends to be exuded from an edge portion by flowing, or film-forming property tends to be lowered. If the formulation amount exceeds 90 parts by weight, sensitivity tends to be insufficient.

The formulation amount of Component (i) is preferably 10 to 90 parts by weight, more preferably 20 to 80 parts by weight based on the total amount of Component (h) and Component (i) being 100 parts by weight. If the formulation amount is less than 10 parts by weight, sensitivity tends to be insufficient, while if it exceeds 90 parts by weight, when a photosensitive element is prepared, a photosensitive resin composition tends to be exuded from an edge portion by flowing, or film-forming property tends to be lowered.

The formulation amount of Component (j) is preferably 0.01 to 30 parts by weight, more preferably 0.1 to 20 parts by weight based on the total amount of Component (h) and Component (i) being 100 parts by weight. If the formulation amount is less than 0.01 part by weight, sensitivity tends to be insufficient, while if it exceeds 30 parts by weight, photocuring of an inner portion tends to be insufficient due to increase in absorption of active light at an exposed surface.

From the point of reducing steps, it is preferred that the thermoplastic resin layer (B) can be developed by using the same developing solution by which the phosphor-containing photosensitive resin composition layer (A) is developed.

As the thermoplastic resin layer (B) which can be developed by the same developing solution, there may be mentioned a thermoplastic resin layer which is soluble in water or an alkaline aqueous solution.

As a resin constituting the thermoplastic resin layer (B) which is soluble in water or an alkaline aqueous solution, there may be mentioned, for example, a polyvinyl alcohol type resin (e.g., a hydrolyzate of polyacrylate or polymethacrylate, a hydrolyzate of polyvinyl acetate, a hydrolyzate of a copolymer of ethylene and vinyl acetate, a hydrolyzate of a copolymer of ethylene and acrylate, a hydrolyzate of a copolymer of vinyl chloride and vinyl acetate, a hydrolyzate of a copolymer of styrene and acrylate or methacrylate and a hydrolyzate of a copolymer of vinyltoluene and acrylate or methacrylate), a water-soluble salt of carboxyalkyl cellulose, water-soluble cellulose ethers, a water-soluble salt of carboxyalkyl starch, polyvinyl pyrrolidone and a resin having a carboxyl group obtained by copolymerizing an unsaturated carboxylic acid and an unsaturated monomer which is copolymerizable therewith.

As the resin having a carboxyl group obtained by copolymerizing an unsaturated carboxylic acid and an unsaturated monomer which is copolymerizable therewith, it is preferred to use, for example, a vinyl copolymer obtained by copolymerizing an unsaturated carboxylic acid (e.g., acrylic acid, methacrylic acid, maleic acid, fumaric acid and itaconic acid) and the above vinyl monomer which can be used in the film property-imparting polymer (a) constituting the phosphor-containing photosensitive resin composition layer (A).

The weight average molecular weight of the resin having a carboxyl group obtained by copolymerizing an unsaturated carboxylic acid and an unsaturated monomer which is copolymerizable therewith is preferably 5,000 to 300,000, more preferably 20,000 to 150,000. If the weight average molecular weight is less than 5,000, when a photosensitive element is prepared, film-forming property and flexibility tend to be lowered, while if it exceeds 300,000, developability tends to be lowered.

In order that the thermoplastic resin layer (B) which is soluble in an alkaline aqueous solution can be developed by known various developing solutions, the carboxyl group content (which can be regulated by an acid value (mgKOH/g)) of the resin having a carboxyl group obtained by copolymerizing an unsaturated carboxylic acid and an unsaturated monomer which is copolymerizable therewith can be adjusted suitably.

For example, when development is carried out by using an alkaline aqueous solution of sodium carbonate, potassium carbonate or the like, the acid value is preferably 90 to 260. If the acid value is less than 90, development tends to be difficult, while if it exceeds 260, developing solution resistance tends to be lowered.

When development is carried out by using an aqueous developing solution comprising water or an alkaline aqueous solution and at least one organic solvent, the acid value is preferably 16 to 260. If the acid value is less than 16, development tends to be difficult, while if it exceeds 260, developing solution resistance tends to be lowered.

In order to obtain good film property of the thermoplastic resin layer (B), a plasticizer may be added to the resin constituting the thermoplastic resin layer (B) described above.

As the plasticizer, there may be used the above plasticizer which can be used in the photosensitive resin composition constituting the phosphor-containing photosensitive resin composition layer (A).

The thermoplastic resin layer (B) in the present invention can be formed into a film shape by dissolving the resin constituting the thermoplastic resin layer (B) in or mixing said resin in a solvent which dissolves said resin to prepare a uniform solution and coating the solution on the above support film by using a known coating method such as a knife coating method, a roll coating method, a spray coating method, a gravure coating method, a bar coating method and a curtain coating method, followed by drying.

As the solvent which dissolves the resin constituting the thermoplastic resin layer (B), there may be mentioned, for example, water, toluene, acetone, methyl ethyl ketone, methyl isobutyl ketone, methyl cellosolve, ethyl cellosolve, γ-butyrolactone, N-methylpyrrolidone, dimethylformamide, tetramethylsulfone, diethylene glycol dimethyl ether, diethylene glycol monobutyl ether, chloroform, methylene chloride, methyl alcohol and ethyl alcohol. These solvents are used singly or in combination of two or more of them.

As the support film, there may be mentioned a support film which is chemically and thermally stable and constituted by a flexible substance, for example, polyethylene terephthalate, polycarbonate, polyethylene and polypropylene. Among them, polyethylene terephthalate and polyethylene are preferred, and polyethylene terephthalate is more preferred.

It is required that the support film can be removed later from the thermoplastic resin layer (B) so that it should not be a film subjected to surface treatment or comprising a material which makes removing impossible.

The thickness of the support film is preferably 5 to 100 μm, more preferably 10 to 90 μm.

As a coating method, a known method may be used, and there may be mentioned, for example, a knife coating method, a roll coating method, a spray coating method, a gravure coating method, a bar coating method and a curtain coating method.

The drying temperature is preferably 60 to 130° C., and the drying time is preferably 3 minutes to 1 hour.

The thickness of the thermoplastic resin layer (B) in the present invention is not particularly limited, but it is preferably 10 to 200 μm, more preferably 15 to 150 μm, particularly preferably 20 to 100 μm. If the thickness is less than 10 μm, a phosphor pattern after calcination described below tends to be thin to lower light emission efficiency, while if it exceeds 200 μm, a phosphor pattern after calcination tends to be thick to reduce a light emission area of a phosphor surface, which results in lowering of light emission efficiency.

The viscosity at 100° C. of the thermoplastic resin layer (B) in the present invention is preferably 1 to $1 \times 10^9$ Pa·sec, more preferably 2 to $1 \times 10^8$ Pa·sec, particularly preferably 5 to $1 \times 10^7$ Pa·sec, extremely preferably 10 to 10 $1 \times 10^6$ Pa·sec. If the viscosity at 100° C. is less than 1 Pa·sec, the viscosity at room temperature becomes too low so that when a photosensitive element is prepared, the thermoplastic resin layer (B) tends to be exuded from an edge portion by flowing, and film-forming property tends to be lowered. If the viscosity at 100° C. exceeds $1 \times 10^9$ Pa·sec, property of forming the phosphor-containing photosensitive resin composition layer (A) on the inner surface of a concave portion of a substrate having unevenness described below tends to be lowered.

On the thermoplastic resin layer (B) in the present invention, a peelable cover film may be further laminated.

As the cover film, there may be mentioned polyethylene, polypropylene, polyethylene terephthalate and polycarbonate it is preferred that the adhesive strength of the cover film to the thermoplastic resin layer (B) is smaller than the adhesive strength of the cover film to the support film.

The thickness of the cover film is not particularly limited, but it is preferably 5 to 100 μm, more preferably 10 to 90 μm.

The photosensitive element of the present invention obtained as described above can be stored by being wound in a roll state.

In the following, the respective steps of the processes for preparing a phosphor pattern of the present invention are explained by referring to FIG. 4, FIG. 5, FIG. 6, FIG. 7, FIG. 8, FIG. 9, FIG. 10, FIG. 11, FIG. 12 and FIG. 13. FIG. 4, FIG. 5, FIG. 6, FIG. 7, FIG. 8, FIG. 9, FIG. 10, FIG. 11, FIG. 12 and FIG. 13 are schematical views showing the respective steps of the processes for preparing a phosphor pattern of the present invention.

<(Ia) Step of heating and pressurizing the thermoplastic resin layer (B) in a state that the thermoplastic resin layer (B) is superposed on the phosphor-containing photosensitive resin composition layer (A) on an uneven surface of a substrate having unevenness, to laminate the phosphor-containing photosensitive resin composition layer (A) and the thermoplastic resin layer (B) on the uneven surface>

Figure 4A:
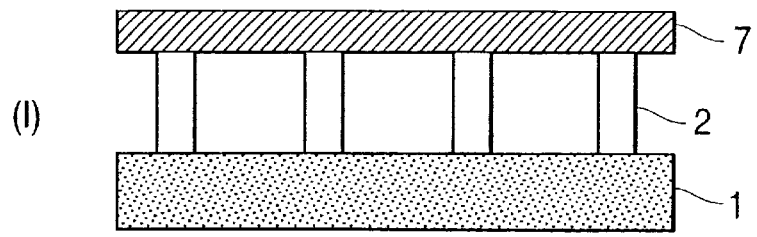
FIG. 4 is a schematical view showing the respective steps of (Ia) and (IIa) in the process for preparing a phosphor pattern of the present invention.

FIG. 4(a) shows a state that a phosphor-containing photosensitive resin composition layer (A) 7 is laminated on a substrate 1 for PDP on which a barrier rib 2 is formed.

In FIG. 4(a), as a method for laminating the phosphor-containing photosensitive resin composition layer (A) 7 on the substrate 1 for PDP on which the barrier rib 2 is formed, there may be mentioned, for example, a lamination method by using the photosensitive element constituted by the phosphor-containing photosensitive resin composition layer (A) described above.

In the case where the photosensitive element is used, when a cover film exists on the photosensitive element, after the cover film is removed, the photosensitive element can be laminated by contact bonding using a contact bonding roll or the like so that the phosphor-containing photosensitive resin composition layer (A) 7 is contacted with the surface on which the barrier rib is formed, of the substrate for PDP.

The contact bonding pressure when pressurization is carried out is preferably 50 to $1\times10^5$ N/m, more preferably $2.5\times10^2$ to $5\times10^4$ N/m, particularly preferably $5\times10^2$ to $4\times10^4$ N/m in terms of line pressure. If the contact bonding pressure is less than 50 N/m, property of embedding the phosphor-containing photosensitive resin composition layer (A) 7 in the space of a concave portion of the substrate for PDP tends to be lowered, while if it exceeds $1\times10^5$ N/m, the barrier rib on the substrate for PDP tends to be broken.

Here, as a method for making the line pressure $5\times10^3$ N/m, there may be mentioned, for example, a method for making the line pressure $5\times10^3$ N/m by using a laminator having a cylinder diameter of 40 mm, using a substrate having a thickness of 3 mm, a length of 10 cm and a width of 10 cm (a square) and making the cylinder pressure (ordinary pressure 1 atm is 0) of the laminator 2 kgf/cm$^2$, and a method for making the line pressure $5\times10^3$ N/m by using a laminator having a cylinder diameter of 40 mm, using a substrate having a thickness of 3 mm, a length of 20 cm and a width of 20 cm (a square) and making the cylinder pressure (ordinary pressure 1 atm is 0) of the laminator 4 kgf/cm$^2$.

From the point that property of embedding the phosphor-containing photosensitive resin composition layer (A) 7 in the space of the concave portion is further improved, the above contact bonding roll having a surface made of a material abundant in flexibility, such as rubber and plastics may be used.

The thickness of the layer of the material abundant in flexibility is preferably 200 to 400 μm.

From the point that property of embedding the phosphor-containing photosensitive resin composition layer (A) 7 in the space of the concave portion is further improved, lamination may be carried out by contact bonding the photosensitive element to the surface on which the barrier rib 2 is formed, of the substrate 1 for PDP while heating the photosensitive element by a heating roll 9 or the like.

The heating temperature at the time of contact bonding under heating is preferably 10 to 140° C., more preferably 20 to 135° C., particularly preferably 30 to 130° C. If the heating temperature is lower than 10° C., the phosphor-containing photosensitive resin composition layer (A) 7 tends not to be adhered to the substrate for PDP sufficiently, while if it exceeds 140° C., the phosphor-containing photosensitive resin composition layer (A) 7 tends to be thermoset.

The contact bonding pressure at the time of contact bonding under heating is preferably 50 to $1\times10^5$ N/m, more preferably $2.5\times10^2$ to $5\times10^4$ N/m, particularly preferably $5\times10^2$ to $4\times10^4$ N/m in terms of line pressure. If the contact bonding pressure is less than 50 N/m, property of embedding the phosphor-containing photosensitive resin composition layer (A) 7 in the space of the concave portion of the substrate for PDP tends to be lowered, while if it exceeds $1\times10^5$ N/m, the barrier rib on the substrate for PDP tends to be broken.

When the photosensitive element is heated as described above, it is not necessary to carry out preheat treatment of the substrate for PDP on which the barrier rib is formed. However, from the point that property of embedding the phosphor-containing photosensitive resin composition layer (A) 7 in the space is further improved, it is preferred to carry out preheat treatment of the above substrate for PDP.

The preheating temperature is preferably 30 to 130° C., and the preheating time is preferably 0.5 to 20 minutes.

Further, for the same purpose, operations of the above contact bonding and contact bonding under heating may be carried out under a reduced pressure of $5\times10^4$ Pa or less.

After lamination is completed as described above, heating may be carried out at a temperature range of 30 to 150° C. for 1 to 120 minutes. At the time of heating, a support film may be removed, if necessary.

As described above, as shown in FIG. 4(a), the phosphor-containing photosensitive resin composition layer (A) 7 can be laminated on the substrate 1 for PDP on which the barrier rib 2 is formed.

Figure 4B:
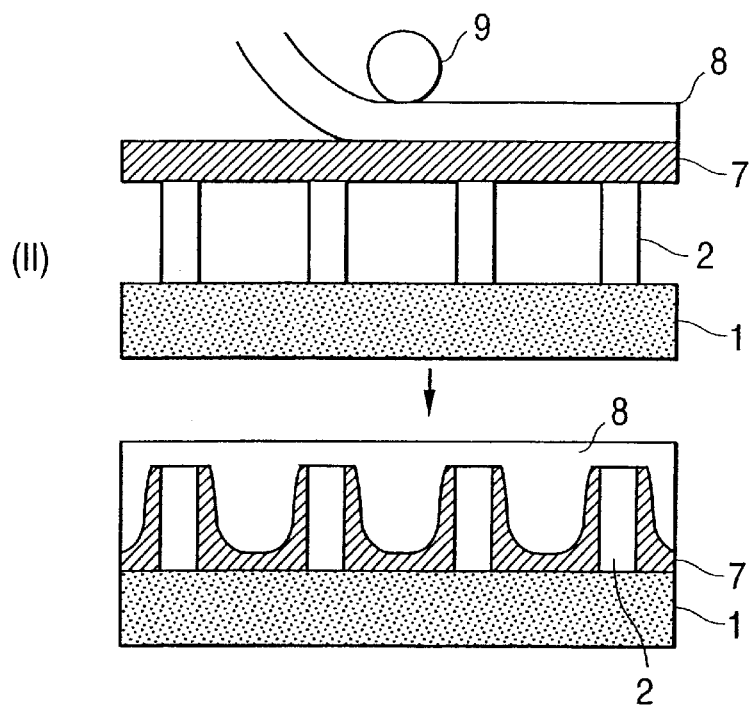

FIG. 4(b) shows a state that a thermoplastic resin layer (B) 8 is superposed on the phosphor-containing photosensitive resin composition layer (A) 7, and the phosphor-containing photosensitive resin composition layer (A) 7 and the thermoplastic resin layer (B) 8 are laminated while carrying out contact bonding under heating.

In FIG. 4(b), as a method for superposing the thermoplastic resin layer (B) 8 on the phosphor-containing photosensitive resin composition layer (A) 7 and carrying out contact bonding under heating, there may be mentioned, for example, a method in which when a support film exists on the phosphor-containing photosensitive resin composition layer (A) 7 in the state of FIG. 4(a), after the support film is removed, (when a cover film exists on the thermoplastic resin layer (B) 8, after the cover film is removed), the thermoplastic resin layer (B) 8 is superposed on the phosphor-containing photosensitive resin composition layer (A) 7, and contact bonding under heating is carried out by the heating roll 9 or the like.

The heating temperature at the time of contact bonding under heating is preferably 10 to 140° C., more preferably 20 to 135° C., particularly preferably 30 to 130° C. If the heating temperature is lower than 10° C., property of embedding the phosphor-containing photosensitive resin composition layer (A) 7 in the space of the substrate for PDP tends to be lowered, while if it exceeds 140° C., the phosphor-containing photosensitive resin composition layer (A) 7 tends to be thermoset.

The contact bonding pressure at the time of contact bonding under heating is preferably 50 to $1\times10^5$ N/m, more preferably $2.5\times10^2$ to $5\times10^4$ N/m, particularly preferably $5\times10^2$ to $4\times10^4$ N/m in terms of line pressure. If the contact bonding pressure is less than 50 N/m, property of embedding the phosphor-containing photosensitive resin composition layer (A) 7 in the space of the concave portion of the substrate for PDP tends to be lowered, while if it exceeds $1\times10^5$ N/m, the barrier rib on the substrate for PDP tends to be broken.

When the thermoplastic resin layer (B) 8 is heated as described above, it is not necessary to carry out preheat treatment of the substrate for PDP on which the phosphor-containing photosensitive resin composition layer (A) 7 is laminated. However, from the point that property of embedding the phosphor-containing photosensitive resin composition layer (A) 7 in the space of the concave portion is further improved, it is preferred to carry out preheat treatment of the substrate for PDP on which the phosphor-containing photosensitive resin composition layer (A) 7 is laminated.

The preheating temperature is preferably 30 to 130° C., and the preheating time is preferably 0.5 to 20 minutes.

From the point that property of embedding the phosphor-containing photosensitive resin composition layer (A) 7 in the space of the concave portion is further improved, the above heating roll 9 having a surface made of a material abundant in flexibility, such as rubber and plastics may be used.

The thickness of the layer of the material abundant in flexibility is preferably 200 to 400 µm.

Further, for the same purpose, operations of the above contact bonding and contact bonding under heating may be carried out under a reduced pressure of $5 \times 10^4$ Pa or less.

After lamination is completed, heating may be carried out at a temperature range of 30 to 150° C. for 1 to 120 minutes. At the time of heating, when a support film exists on the thermoplastic resin layer (B) 8, the support film may be removed, if necessary.

As described above, the phosphor-containing photosensitive resin composition layer (A) 7 can be formed uniformly in the space of the concave portion of the substrate 1 for PDP.

In the step (Ia) in the present invention, both of the phosphor-containing photosensitive resin composition layer (A) 7 and the thermoplastic resin layer (B) 8 may be laminated simultaneously which carrying out contact bonding under heating.

As conditions of contact bonding under heating when contact bonding under heating of both of the layers is carried out simultaneously, there may be used the above conditions under which contact bonding under heating of the thermoplastic resin layer (B) 8 is carried out.

Figure 6:
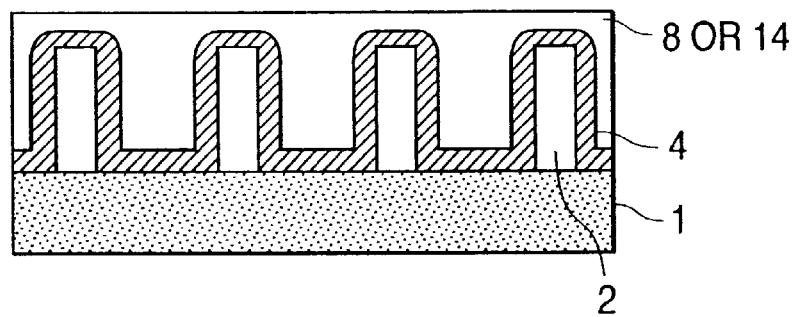
FIG. 6 is one embodiment after completion of the step (Ia) in the process for preparing a phosphor pattern of the present invention.

By changing a combination of the respective conditions such as the heating conditions and contact bonding pressure condition at the time of contact bonding under heating of the phosphor-containing photosensitive resin composition layer (A) 7 and the thermoplastic resin layer (B) 8, the preheating conditions of the substrate for PDP, the layer thicknesses of the phosphor-containing photosensitive resin composition layer (A) 7 and the thermoplastic resin layer (B) 8 described below and the like, the layers can be laminated in a state as shown in FIG. 6. FIG. 6 is one embodiment after completion of the step of FIG. 4(*b*) in the process for preparing a phosphor pattern of the present invention.

Figure 4C:
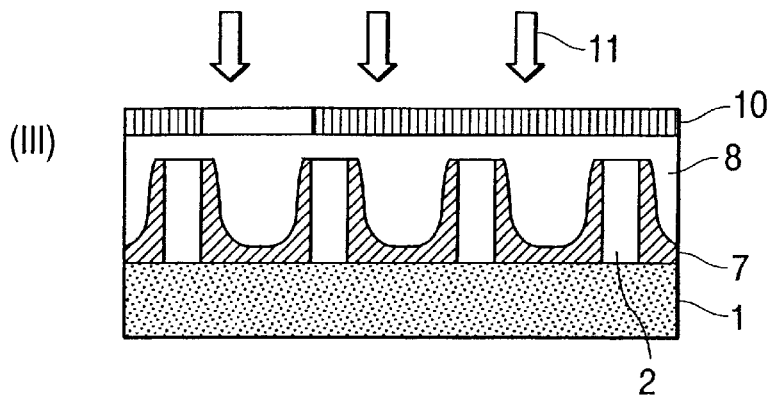

With respect to the layer thicknesses of the phosphor-containing photosensitive resin composition layer (A) 7 and the thermoplastic resin layer (B) 8, from the point that a phosphor pattern with high precision and a uniform shape can be formed, it is preferred that in the phosphor-containing photosensitive resin composition layer (A) and the thermoplastic resin layer (B) in a region which is the same as the region where unevenness is formed on a substrate having unevenness (a substrate for PDP), the ratio $(V^1)/(V^2)$ of the total volume ($V^1$) of the phosphor-containing photosensitive resin composition layer (A) and the thermoplastic resin layer (B) to the volume ($V^2$) of the space of a concave portion of the substrate having unevenness is in the range of 1 to 2. If $(V^1)/(V^2)$ is in the range of 1 to 1.05, the phosphor-containing photosensitive resin composition layer (A) 7 tends to be formed on the inner surface of the concave portion in a state that almost none of the phosphor-containing photosensitive resin composition layer (A) 7 remains on the convex portion as shown in FIG. 4(*b*). If $(V^1)/(V^2)$ exceeds 1.05 and is 2 or less, the phosphor-containing photosensitive resin composition layer (A) 7 tends to be formed on the inner surface of the concave portion in a state that the phosphor-containing photosensitive resin composition layer (A) 7 remains on the convex portion as shown in FIG. 6. Here, if $(V^1)/(V^2)$ is less than 1, a portion of the inner surface of the concave portion to which the phosphor-containing photosensitive resin composition layer (A) 7 cannot be adhered tends to be generated, while if it exceeds 2, the sectional shape of a multicolor phosphor pattern described below tends to be non-uniform.

In preparation of the substrate for PDP before the photosensitive element is laminated, there is a case where entire or partial shrinkage of the substrate for PDP is caused by heating or the like, and there is a case where almost no shrinkage of the substrate for PDP is caused by heating or the like. In the case where entire or partial shrinkage of the substrate for PDP is caused, positional displacement between the substrate for PDP and a photomask may be caused. Therefore, in the case where entire or partial shrinkage of the substrate for PDP is caused, from the point that tolerance of registration precision of a photomask is enlarged in the step (IIa) of irradiating the phosphor-containing photosensitive resin composition layer (A) and/or the thermoplastic resin layer (B) imagewisely with active light described below, it is preferred that the phosphor-containing photosensitive resin composition layer (A) 7 is laminated on the inner surface (the wall surface of the barrier rib 2 and the surface of the substrate 1) of the concave portion so that almost none of the phosphor-containing photosensitive resin composition layer (A) 7 remains on the convex portion (the barrier rib 2) as shown in FIG. 4(*b*). In the case where almost no shrinkage of the substrate for PDP is caused, lamination may be carried out as shown in FIG. 4(*b*), or lamination may be carried out in a state that the phosphor-containing photosensitive resin composition layer (A) 7 remains on the convex portion as shown in FIG. 6.

As described above, as shown in FIG. 4(*b*) or FIG. 6, the phosphor-containing photosensitive resin composition layer (A) 7 can be laminated uniformly on the surface (on the uneven surface) of the substrate 1 for PDP on which the barrier rib 2 is formed.

<(IIa) Step of irradiating the phosphor-containing photosensitive resin composition layer (A) and/or the thermoplastic resin layer (B) imagewisely with active light>

FIG. 4(*c*) shows a state that active light 11 is irradiated imagewisely.

In FIG. 4(*c*), as a method for irradiating the active light 11 imagewisely, there may be used a method of irradiating the active light 11 imagewisely through a photomask 10 such as a negative film and a positive film, provided above the thermoplastic resin layer (B) 8 in the state of FIG. 4(*b*). At the time of irradiation, when a support film exists on the thermoplastic resin layer (B) 8, the active light 11 may be irradiated imagewisely while the support film is laminated as such, or the active light 11 may be irradiated imagewisely after the support film is removed.

At the time of irradiation, when the thermoplastic resin layer (B) 8 is the photosensitive resin composition described above, the phosphor-containing photosensitive resin composition layer (A) 7 and the thermoplastic resin layer (B) 8 are to be photocured simultaneously.

In preparation of the substrate for PDP before the photosensitive element is laminated, in the case where entire or partial shrinkage of the substrate for PDP is caused by heating or the like or in the case where almost none of the phosphor-containing photosensitive resin composition layer (A) 7 remains on the convex portion as shown in FIG. 4(*b*), from the point that tolerance of registration precision is enlarged, it is preferred that the permeation width of the active light 11 of the photomask 10 is the same permeation width as the opening width of the concave portion of the substrate for PDP or wider than the opening width of the concave portion of the substrate for PDP.

Also, in preparation of the substrate for PDP before the photosensitive element is laminated, in the case where almost no shrinkage of the substrate for PDP is caused by heating or the like and the phosphor-containing photosensitive resin composition layer (A) 7 remains on the convex portion as shown in FIG. 6, from the point that a phosphor pattern can be formed on the inner surface of the concave portion with good operatability, it is preferred that photomask 10 has an active light permeation width which is narrower than the opening width of the concave portion.

When the opening width of the concave portion is W ($\mu$m), the active light permeation width which is narrower than the opening width of the concave portion is preferably 0.3×W to 0.99999×W, more preferably 0.5×W to 0.999×W, articularly preferably 0.6×W to 0.99×W.

If the active light permeation width which is narrower than the opening width of the concave portion is less than 0.3×W, photocuring of the phosphor-containing photosensitive resin composition layer (A) 7 formed on the inner surface of the concave portion tends to be insufficient. In development described below, developing solution resistance (property that a portion which remains without being removed by development and becomes a pattern is not corroded by development) of the phosphor-containing photosensitive resin composition layer (A) 7 formed on the inner surface of the concave portion tends to be lowered, and even a necessary portion of the phosphor-containing photosensitive resin composition layer (A) 7 formed on the inner surface of the concave portion tends to be removed. If the active light permeation width which is narrower than the opening width of the concave portion is a width exceeding 0.99999×W, even a portion other than the inner surface of the concave portion to be photocured tends to be photocured, and an unnecessary portion tends to remain after development described below.

When the phosphor-containing photosensitive resin composition layer (A) 7 remains on the convex portion as shown in FIG. 6, from the point that a phosphor pattern can be formed on the inner surface of the concave portion with good operatability, the active light may be irradiated imagewisely in a state that a gas containing oxygen exists on the thermoplastic resin layer (B) 8.

In this case, it is preferred that the photopolymerization initiator (c) which produces free radical by irradiation of active light in the photosensitive resin composition constituting the phosphor-containing photosensitive resin composition layer (A) 7 is a photopolymerization initiator in which free radical is produced by irradiation of active light and produced free radical is easily deactivated by oxygen.

The thermoplastic resin layer (B) 8 may be the photosensitive resin composition described above, and it is preferred that the photopolymerization initiator (j) which produces free radical by irradiation of active light, constituting the thermoplastic resin layer (B) 8 is a photopolymerization initiator in which free radical is produced by irradiation of active light and produced free radical is easily deactivated by oxygen.

Figure 7:
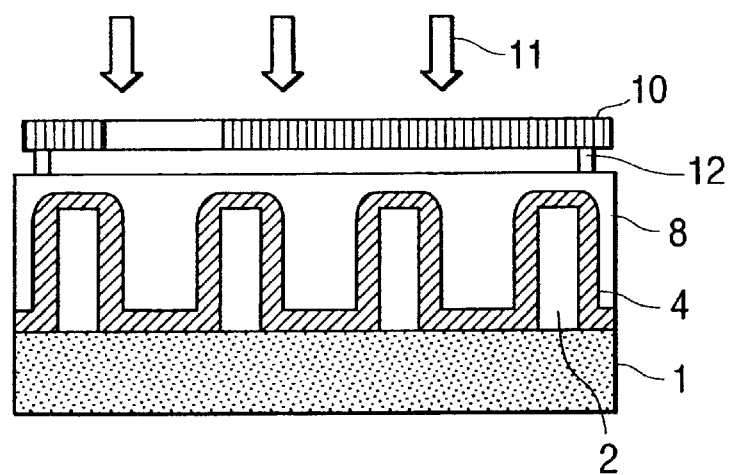
FIG. 7 is one embodiment of the step (IIIa) in the process for preparing a phosphor pattern of the present invention.

FIG. 7 shows a state that the active light 11 is irradiated imagewisely in a state that a gas containing oxygen exists on the thermoplastic resin layer (B) 8.

In the step of FIG. 7, it is necessary to irradiate the active light 11 imagewisely in a state that a gas containing oxygen always exists on the thermoplastic resin layer (B) 8. As a method for such irradiation, there may be mentioned, for example, a method in which the active light 11 is irradiated imagewisely in a state that the thermoplastic resin layer (B) 8 is directly contacted with air or the like, through the photomask 10 such as a negative film, a negative glass, a positive film and a positive glass with a spacer 12 or the like being sandwiched between the thermoplastic resin layer (B) 8 and the photomask 10.

When the thermoplastic resin layer (B) 8 and the photomask 10 are not adhered to each other so that oxygen is always supplied in a state that the thermoplastic resin layer (B) 8 is exposed to oxygen, the active light 11 can be also irradiated imagewisely in a state that the photomask 10 is directly superposed on the thermoplastic resin layer (B) 8 without sandwiching the spacer 12 or the like between the thermoplastic resin layer (B) 8 and the photomask 10.

In this case, when a support film exists on the thermoplastic resin layer (B) 8, if a portion to be exposed of the phosphor-containing photosensitive resin composition layer (A) 7 formed on a portion other than the inner surface of the concave portion and the thermoplastic resin layer (B) 8 are a photosensitive resin composition, in order that the photocuring property of a portion to be exposed of the thermoplastic resin layer (B) 8 is made insufficient by oxygen and an unnecessary portion thereof is removed by development described below, it is necessary to irradiate the active light 11 imagewisely after the support film is removed. However, when the support film is a film having oxygen permeability, the active light 11 can be irradiated imagewisely in a state that the support film is laminated.

Similarly, when a portion to be exposed of the phosphor-containing photosensitive resin composition layer (A) 7 formed on a portion other than the inner surface of the concave portion and the thermoplastic resin layer (B) 8 are a photosensitive resin composition, in order that the photocuring property of a portion to be exposed of the phosphor-containing photosensitive resin composition layer (A) 7 is made insufficient by oxygen, it is preferred to adjust the exposure dose of the active light 11 to enable removing by development described below.

As described above, when the photocured phosphor-containing photosensitive resin composition layer (A) 7 and the photocured thermoplastic resin layer (B) 8 are a photosensitive resin composition, the photocured thermoplastic resin layer (B) 8 is formed on the inner surface of the concave portion. When the phosphor-containing photosensitive resin composition layer (A) 7 having insufficient photocuring property and the thermoplastic resin layer (B) 8 having insufficient photocuring property are a photosensitive resin composition, the thermoplastic resin layer (B) 8 having insufficient photocuring property is formed on a portion other than the inner surface of the concave portion.

Also, after the thermoplastic resin layer (B) 8 is removed by dissolution using water, an alkaline aqueous solution, an aqueous developing solution, an organic solvent or the like which does not dissolve the phosphor-containing photosensitive resin composition layer (A) 7, the active light 11 may be irradiated imagewisely through the photomask 10 such as a negative film and a positive film.

As the active light 11, a known active light source may be used, and there may be mentioned, for example, light generated from carbon arc, mercury vapor arc, xenon arc or the like.

The sensitivity of a photopolymerization initiator is generally the largest in a UV ray region so that in that case, an active light source which radiates UV ray effectively should be used. When the photopolymerization initiator is sensitive to visible rays, for example, it is 9,10-phenanthrenequinone, visible light can be used as the active light 11, and as a light source thereof, there may be also used, in addition to the above light sources, a flood bulb for photographs and a solar lamp.

Also, as the active light 11 in the present invention, there may be mentioned parallel light, non-parallel light and scattered light. Either of parallel light, non-parallel light or scattered light may be used, one or two or all of them may be used in one step, and two of them may be used in two stages or all of them may be used in all stages separately. When two of them are used in two stages or all of them are used in all stages separately, either of them may be used firstly.

The irradiation dose of the active light 11 is preferably 3 mJ/cm$^2$ to 3 J/cm$^2$, more preferably 5 mJ/cm$^2$ to 1 J/cm$^2$, particularly preferably 10 mJ/cm$^2$ to 1 J/cm$^2$.

As described above, as shown in FIG. 4(*c*) and FIG. 7, active light can be irradiated imagewisely with high precision and good operatability.

<(IIIa) Step of removing unnecessary portions from the phosphor-containing photosensitive resin composition layer (A) and/or the thermoplastic resin layer (B) by development>

FIG. 5(*a*) shows a state that unnecessary portions are removed by development. In FIG. 5(*a*), 7' is a phosphor-containing photosensitive resin composition layer after photocuring.

In FIG. 5(*a*), as a development method, there may be mentioned, for example, a method in which after the state of FIG. 4(*c*), when a support film exists on the thermoplastic resin layer (B) 8, after the support film is removed, development is carried out by using a known developing solution such as water, an alkaline aqueous solution, an aqueous developing solution (which comprises water and at least one organic solvent or an alkaline aqueous solution and at least one organic solvent) and an organic solvent according to a known method such as spraying, dipping by rocking, blushing and scrapping to remove unnecessary portions.

When the unnecessary portions are removed, firstly, the thermoplastic resin layer (B) 8 is removed by dissolution using water, an alkaline aqueous solution, an aqueous developing solution, an organic solvent or the like which does not dissolve the phosphor-containing photosensitive resin composition layer (A) 7, and then the unnecessary portion of the phosphor-containing photosensitive resin composition layer (A) 7 may be removed by using a developing solution. Also, when the phosphor-containing photosensitive resin composition layer (A) 7 and the thermoplastic resin layer (B) 8 can be developed by using the same developing solution, the unnecessary portion of the phosphor-containing photosensitive resin composition layer (A) 7 and the thermoplastic resin layer (B) 8 can be removed in one step by using such a developing solution.

Figure 8:
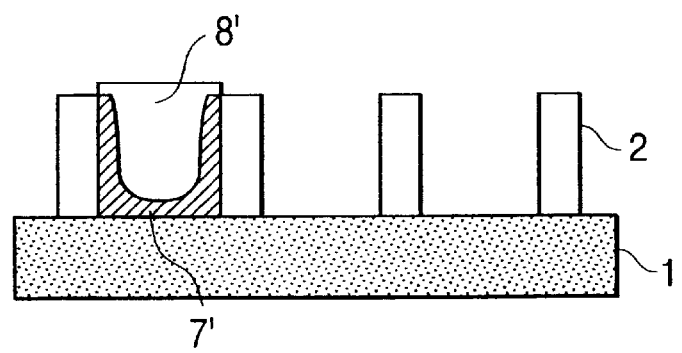
FIG. 8 is one embodiment after completion of the step (IVa) in the process for preparing a phosphor pattern of the present invention.

At the time of removal, when the thermoplastic resin layer (B) 8 is the photosensitive resin composition described above, a thermoplastic resin layer (B) 8' after photocuring remains on the phosphor-containing photosensitive resin composition layer (A) 7' after photocuring. FIG. 8 shows a state that the thermoplastic resin layer (B) 8' after photocuring remains on the phosphor-containing photosensitive resin composition layer (A) 7' after photocuring.

The developing time and the developing temperature can be adjusted suitably so that the unnecessary portions are removed. The developing time is preferably 1 to 10 times the shortest developing time of the phosphor-containing photosensitive resin composition layer (A) 7 (the shortest time until the phosphor-containing photosensitive resin composition layer (A) is removed by development after the layer (A) is embedded in the inner surface of the concave portion of the substrate for PDP), and the developing temperature is preferably 10 to 60° C.

If the developing time is shorter than the shortest developing time, an undeveloped portion tends to be generated, while if it exceeds 10 times the shortest developing time, even a necessary portion of the phosphor-containing photosensitive resin composition layer (A) 7 tends to be removed. If the developing temperature is lower than 10° C., developability tends to be lowered, while if it exceeds 60° C., developing solution resistance tends to be lowered.

As a base of the alkaline aqueous solution, there may be mentioned an alkali hydroxide (e.g., a hydroxide of lithium, sodium or potassium), an alkali carbonate (e.g., a carbonate or bicarbonate of lithium, sodium or potassium), an alkali metal phosphate (e.g., potassium phosphate and sodium phosphate), an alkali metal pyrophosphate (e.g., sodium pyrophosphate and potassium pyrophosphate), tetramethylammonium hydroxide and triethanolamine, and among them, sodium carbonate and tetramethylammonium hydroxide are preferred.

The pH of the alkaline aqueous solution to be used for development is preferably 9 to 11. The temperature can be adjusted depending on the developabilities of the phosphor-containing photosensitive resin composition layer (A) 7 and the thermoplastic resin layer (B) 8.

In the alkaline aqueous solution, a surfactant, a defoaming agent and a small amount of an organic solvent for accelerating development may be mixed.

As the aqueous developing solution, there may be mentioned an aqueous developing solution comprising water and at least one organic solvent or an alkaline aqueous solution and at least one organic solvent.

In the aqueous developing solution comprising water and at least one organic solvent, as the organic solvent, there may be mentioned, for example, acetone alcohol, acetone, ethyl acetate, an alkoxyethanol having an alkoxy group with 1 to 4 carbon atoms, ethyl alcohol, isopropyl alcohol, butyl alcohol, diethylene glycol monomethyl ether, diethylene glycol monoethyl ether, diethylene glycol monobutyl ether, triethylene glycol monobutyl ether, dipropylene glycol monomethyl ether, dipropylene glycol monopropyl ether, 3-methyl-3-methoxybutyl acetate, 1,1,1-trichloroethane, N-methylpyrrolidone, N,N-dimethylformamide, cyclohexanone, methyl isobutyl ketone and γ-butyrolactone. These organic solvents are used singly or in combination of two or more of them.

The concentration of the organic solvent is generally in the range of 2 to 95% by weight, and the temperature can be adjusted depending on developability.

In the aqueous developing solution comprising an alkaline aqueous solution and at least one organic solvent, as a base of the alkaline aqueous solution, there may be mentioned, for example, borax, sodium metasilicate, ethanolamine, ethylenediamine, diethylenetriamine, 2-amino-2-hydroxymethyl-1,3-propanediol, 1,3-diaminopropanol-2-morpholine and tetramethylammonium hydroxide in addition to the above compounds.

The pH of the aqueous developing solution comprising an alkaline aqueous solution and at least one organic solvent is preferably 8 to 12, more preferably 9 to 10.

As the organic solvent of the aqueous developing solution comprising an alkaline aqueous solution and at least one organic solvent, there may be mentioned, for example, acetone alcohol, acetone, ethyl acetate, an alkoxyethanol having an alkoxy group with 1 to 4 carbon atoms, ethyl alcohol, isopropyl alcohol, butyl alcohol, diethylene glycol monomethyl ether, diethylene glycol monoethyl ether and diethylene glycol monobutyl ether. These organic solvents are used singly or in combination of two or more of them.

The concentration of the organic solvent is generally in the range of 2 to 95% by weight, and the temperature can be adjusted depending on developability.

In the aqueous developing solution, small amounts of a surfactant and a defoaming agent may be mixed.

As the organic solvent to be used singly as a developing solution, there may be mentioned, for example, acetone alcohol, acetone, ethyl acetate, an alkoxyethanol having an alkoxy group with 1 to 4 carbon atoms, ethyl alcohol, isopropyl alcohol, butyl alcohol, diethylene glycol monomethyl ether, diethylene glycol monoethyl ether, diethylene glycol monobutyl ether, triethylene glycol monobutyl ether, dipropylene glycol monomethyl ether, dipropylene glycol monopropyl ether, 3-methyl-3-methoxybutyl acetate, 1,1,1-trichloroethane, N-methylpyrrolidone, N,N-dimethylformamide, cyclohexanone, methyl isobutyl ketone and γ-butyrolactone. For preventing ignition, water in the range of 1 to 20% by weight may be added to these organic solvents.

From the point of preventing deterioration of the phosphor at the time of development, it is preferred that an alkali metal ion or a metal ion is not contained in a known developing solution such as water, an alkaline solution, an aqueous developing solution (which comprises water and at least one organic solvent or an alkaline aqueous solution and at least one organic solvent) and an organic solvent.

After development, for the purpose of preventing deterioration of the phosphor, the base of the alkaline aqueous solution remaining on the phosphor-containing photosensitive resin composition layer (A) 7' after photocuring may be subjected to acid treatment (neutralization treatment) by using a n organic acid, an inorganic acid or an acid aqueous solution thereof according to a known method such as spraying, dipping by rocking, blushing and scrapping.

As the acid, there may be mentioned, for example, an organic acid and an inorganic acid such as a saturated aliphatic acid, an unsaturated aliphatic acid, an aliphatic dibasic acid, an aromatic dibasic acid, an aliphatic tribasic acid and an aromatic tribasic acid.

As a specific organic acid, there may be mentioned, for example, formic acid, acetic acid, chlioroacetic acid, dichloroacetic acid, trichloroacetic acid, propionic acid capric acid, undecanoic acid, lauric acid, tridecanoic acid, myristic acid, pentadecanoic acid, palmitic acid, heptadecanoic acid, stearic acid, nonadecanoic acid, arachidic acid, palmitoleic acid, oleic acid, elaidic acid, linolenic acid, linoleic acid, oxalic acid, malonic acid, methylmalonic acid, ethylmalonic acid, monomethyl malonate, monoethyl malonate, succinic acid, methylsuccinic acid, adipic acid, methyladipic acid, pimelic acid, suberic acid, azelaic acid, sebacic acid, maleic acid, itaconic acid, phthalic acid, isophthalic acid, terephthalic acid, trimellitic acid, citric acid, salicylic acid, pyruvic acid and malic acid.

As a specific inorganic acid, there may be mentioned, for example, sulfuric acid, hydrochloric acid and nitric acid. Among them, from the point of a high neutralization effect, formic acid, oxalic acid, malonic acid and citric acid are preferred.

The pH of the acid aqueous solution to be used for acid treatment is preferably 2 to 6, and the pH and temperature of the acid aqueous solution can be adjusted depending on acid resistances (durabilities that deterioration is not caused by acid) of the phosphor-containing photosensitive resin composition layer (A) 7' after photocuring and the substrate 1 for PDP (the substrate having unevenness). Further, after acid treatment (neutralization treatment), a step of water washing may be carried out.

As a method for removing the unnecessary portion of the phosphor-containing photosensitive resin composition layer (A) 7 and the unnecessary portion of the thermoplastic resin layer (B) 8, the respective removals may be carried out separately by dry development in which only an unnecessary portion having adhesiveness of the phosphor-containing photosensitive resin composition layer (A) 7 is peeled off by utilizing difference in adhesiveness between an exposed portion and an unexposed portion, or may be carried out in one step.

After development, for the purpose of improving adhesion and chemical resistance of a phosphor-containing photoresist on the surface of the space of the substrate for PDP, irradiation of UV ray by a high pressure mercury lamp or the like and heating may be also carried out.

The irradiation dose of UV ray is not particularly limited, but from the point of photocuring property, it is preferably 5 to 10,000 mJ/cm$^2$, more preferably 7 to 5,000 mJ/cm$^2$, particularly preferably 10 to 3,000 mJ/cm$^2$.

The temperature at the time of heating is preferably 60 to 180° C., more preferably 100 to 180° C. The heating time is preferably 15 to 90 minutes.

The above irradiation of UV ray and heating may be carried out separately, and either of them may be carried out previously.

As described above, by carrying out this step (the step (IIIa)), the phosphor-containing photosensitive resin composition layer after photocuring, from which the unnecessary portion is removed is formed.

Figure 9:
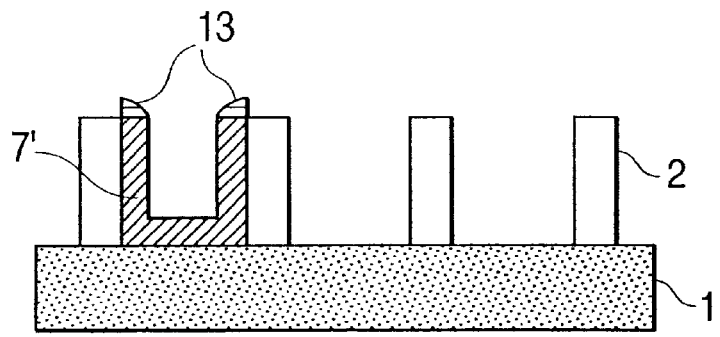
FIG. 9 is one embodiment after completion of the step (IVa) in the process for preparing a phosphor pattern of the present invention.

When the phosphor-containing photosensitive resin composition layer (A) 7 remains on the convex portion as shown in FIG. 6, by carrying out this step (the step (IIIa)), a state shown in FIG. 9 tends to occur depending on the exposure and development conditions and positional displacement of the photomask. When the thermoplastic resin layer (B) 8 is a photosensitive resin composition, a state shown in FIG. 10 tends to occur from the same reason.

In this case, when the phosphor-containing photosensitive resin composition layer (the unnecessary portion) after photocuring, which remains on a portion other than the inner surface of the concave portion and the thermoplastic resin layer (B) 8 is a photosensitive resin composition, the thermoplastic resin layer (the unnecessary portion) after photocuring may be removed completely by polishing or the like.

Figure 10:
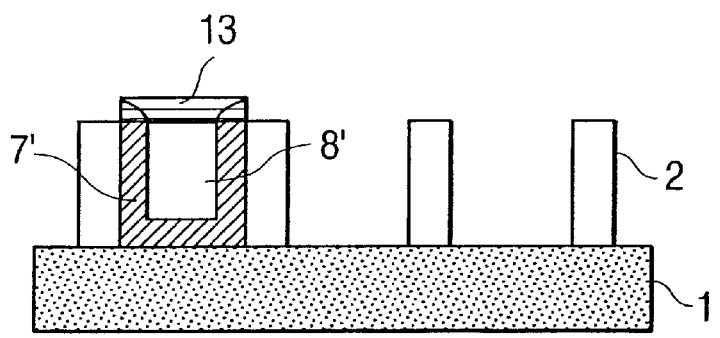
FIG. 10 is one embodiment after completion of the step (IVa) in the process for preparing a phosphor pattern of the present invention.

FIG. 9 is a schematical view showing a state of the case where after this step (the step (IIIa)) is carried out, the phosphor-containing photosensitive resin composition layer (A) 7' after photocuring remains on a portion other than the inner surface of the concave portion. In FIG. 9, 13 is an unnecessary portion (a portion to be removed completely by polishing or the like). FIG. 10 shows a schematical view of the same case in which the thermoplastic resin layer (B) 8' after photocuring is a photosensitive resin composition.

Also, only the unnecessary portion 13 can be also removed physically by adhering an adhesive tape to the unnecessary portion 13 and then peeling the adhesive tape in place of carrying out polishing as described above.

On the supposition that the unnecessary portion remains, after forming a multilayer pattern comprising photosensitive resin composition layers each containing a phosphor which emits red, green or blue light described below and before a calcination step described below, a black inorganic material paste containing a black inorganic pigment such as iron oxide, chromium oxide and copper oxide and a low melting point glass frit or the like is coated or printed on the convex portion, or black strips are formed by using a black inorganic material-containing photosensitive element, and then calcination described below can be carried out.

As described above, as shown in FIG. 5(a) and FIG. 8, the phosphor-containing photosensitive resin composition layer (A) 7' after photocuring can be formed on the inner surface (the wall surface of the barrier rib 2 and the surface of the substrate 1) of the concave portion of the substrate having unevenness (the substrate for PDP) with a good shape and good operatability.

<(IVa) Step of removing unnecessary components from the phosphor-containing photosensitive resin composition layer (A) and/or the thermoplastic resin layer (B) by calcination>

Figures 5A, 5B:
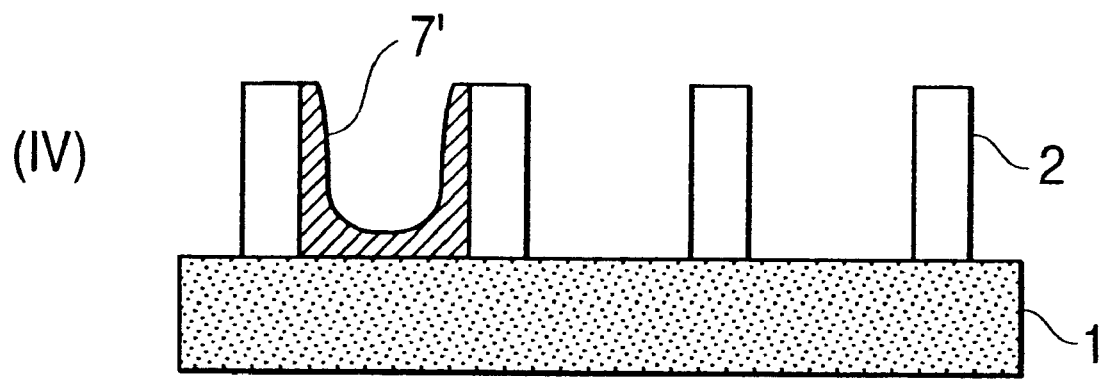
FIG. 5 is a schematical view showing the respective steps of (IIIa) and (IVa) in the process for preparing a phosphor pattern of the present invention.

FIG. 5(b) shows a state that a phosphor pattern after removing unnecessary components by calcination is formed is shown. In FIG. 5(b), 5 is a phosphor pattern.

In FIG. 5(b), a calcination method is not particularly limited, and the phosphor pattern 5 can be formed by removing unnecessary components other than the phosphor and the binding agent according to a known calcination method.

The temperature-elevating rate at the time of calcination is preferably 0.5 to 50° C./min, more preferably 1 to 45° C./min. The highest calcination temperature is preferably 350 to 800° C., more preferably 400 to 600° C. The calcination time at the highest calcination temperature is preferably 3 to 120 minutes, more preferably 5 to 90 minutes. Between 350 to 450° C. before reaching the highest calcination temperature, a step of maintaining that temperature may be provided, and the maintaining time is preferably 5 to 100 minutes.

As described above, as shown in FIG. 5(b), the phosphor pattern 5 can be formed on the inner surface (the wall surface of the barrier rib 2 and the surface of the substrate 1) of the concave portion of the substrate having unevenness (the substrate for PDP) with a good shape and good operatability.

In the process for preparing a phosphor pattern of the present invention, from the point of reducing the number of steps, it is preferred that after a multicolor pattern comprising photosensitive resin composition layers each containing a phosphor which emits red, green or blue light is formed by repeating the respective steps of (Ia) to (IIIa) of the above process of the present invention for every color, the step of (IVa) is carried out to form a multicolor phosphor pattern.

In the present invention, in the phosphor-containing photosensitive resin composition layer (A) 7 containing phosphors which emit red, blue and green lights, respectively, pattern formations of red, blue and green may be carried out in any order.

Figure 11:
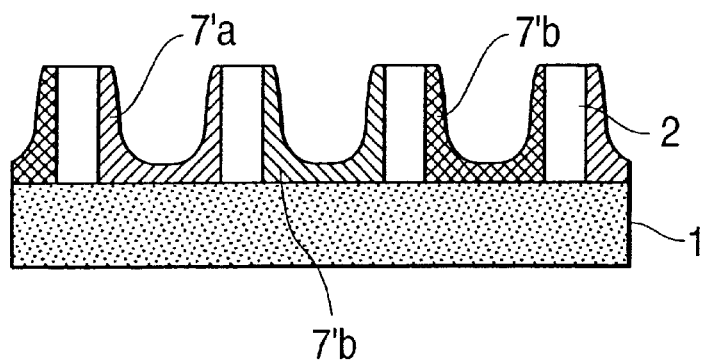
FIG. 11 is a schematical view showing a state that a multicolor pattern comprising phosphor-containing photosensitive resin composition layers is formed.

FIG. 11 shows a state that a multicolor pattern comprising photosensitive resin composition layers each containing a phosphor which emits red, green or blue light is formed by repeating the respective steps (Ia) to (IIIa) in the present invention for every color. In FIG. 11, 7'a is a pattern of a first color, 7'b is a pattern of a second color, and 7'c is a pattern of a third color.

Figure 12:
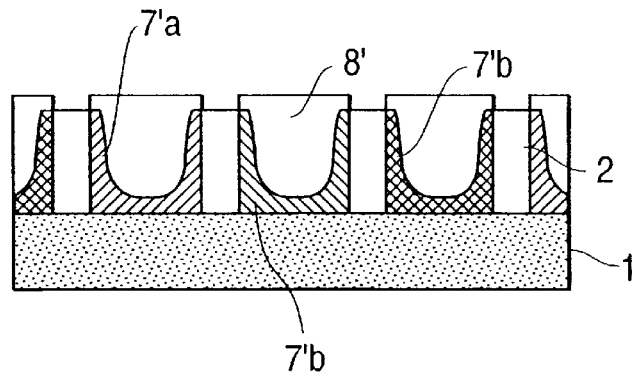
FIG. 12 is a schematical view showing a state that a multicolor pattern comprising phosphor-containing photosensitive resin composition layers is formed.

FIG. 12 shows a state that in the case where the thermoplastic resin layer (B) 8 is a photosensitive resin composition, a multicolor pattern comprising photosensitive resin composition layers each containing a phosphor which emits red, green or blue light is formed by repeating the respective steps (Ia) to (IIIa) in the present invention for every color.

Figure 13:
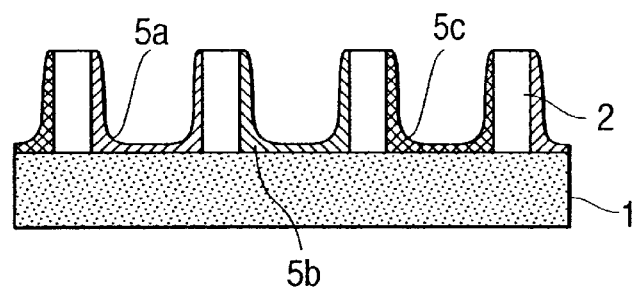
FIG. 13 is a schematical view showing a state that a multicolor phosphor pattern is formed.

FIG. 13 shows a state that a multicolor phosphor pattern is formed by carrying out the step of (IVa) in the present invention. In FIG. 13, 5a is a phosphor pattern of a first color, 5b is a phosphor pattern of a second color, and 5c is a phosphor pattern of a third color.

In the process for preparing a phosphor pattern of the present invention, from the point of suppressing decrease in the thickness of the phosphor-containing photosensitive resin composition layer (A) 7' after photocuring, it is preferred that a multicolor phosphor pattern which emit red, green and blue lights is formed by repeating the respective steps of (Ia) to (IVa) in the above process of the present invention for every color.

As described above, as shown in FIG. 13, a multicolor phosphor pattern can be formed on the inner surface (the wall surface of the barrier rib 2 and the surface of the substrate 1) of the concave portion of the substrate having unevenness (the substrate for PDP) with a good shape and good operatability.

Also, as a process for forming the phosphor pattern (comprising a phosphor layer) in the present invention, there may be mentioned, for example, a process including (Ib) a step of heating and pressurizing a photosensitive element having a support film, the thermoplastic resin layer (B) provided on the support film and the phosphor-containing photosensitive resin composition layer (A) provided thereon so that the phosphor-containing photosensitive resin composition layer (A) is contacted with an uneven surface of a substrate having unevenness, to laminate the phosphor-containing photosensitive resin composition layer (A) and the thermoplastic resin layer (B) on the uneven surface; (IIb) a step of irradiating the phosphor-containing photosensitive resin composition layer (A) and/or the thermoplastic resin layer (B) imagewisely with active light; (IIIb) a step of removing unnecessary portions from the phosphor-containing photosensitive resin composition layer (A) and/or the thermoplastic resin layer (B) by development; and (IVb) a step of removing unnecessary components from the phosphor-containing photosensitive resin composition layer (A) and/or the thermoplastic resin layer (B) by calcination.

The photosensitive element in the present invention has a support film, the thermoplastic resin layer (B) on the support film and the phosphor-containing photosensitive resin composition layer (A) thereon.

The photosensitive element in the present invention can be obtained by dissolving the above resin constituting the thermoplastic resin layer (B) in or mixing said resin with a solvent which dissolves said resin to prepare a uniform solution, coating the solution on the above support film by using a known coating method such as a knife coating method, a roll coating method, a spray coating method, a gravure coating method, a bar coating method and a curtain coating method, followed by drying, dissolving the above respective components constituting the phosphor-containing photosensitive resin composition layer (A) in or mixing said components with a solvent which can dissolve or disperse said components to prepare a solution in which said components are dispersed uniformly and coating the solution on the thermoplastic resin layer (B) provided as described above by using a known coating method such as a knife coating method, a roll coating method, a spray coating method, a gravure coating method, a bar coating method and a curtain coating method, followed by drying.

As the solvent which dissolves the resin constituting the thermoplastic resin layer (B) and the above respective components constituting the phosphor-containing photosensitive resin composition layer (A), there may be mentioned, for example, water, toluene, acetone, methyl ethyl ketone, methyl isobutyl ketone, methyl cellosolve, ethyl cellosolve, γ-butyrolactone, N-methylpyrrolidone, dimethylformamide, tetramethylsulfone, diethylene glycol dimethyl ether, diethylene glycol monobutyl ether, chloroform, methylene chloride, methyl alcohol and ethyl alcohol. These solvents are used singly or in combination of two or more of them.

In the coating step, the material of a portion of a coating apparatus, contacted with the solution in which the above respective components constituting the phosphor-containing photosensitive resin composition layer (A) are dispersed uniformly by dissolving said components in or mixing said components with the solvent which can dissolve or disperse said components is preferably a non-metallic material. When the material of a portion of a coating apparatus, contacted with the solution constituting the phosphor-containing photosensitive resin composition layer (A) is a metal, the coating apparatus contacted with the solution constituting the phosphor-containing photosensitive resin composition layer (A) is polished by the phosphor in said solution, and powder generated by polishing tends to migrate, as impurity, into the solution constituting the phosphor-containing photosensitive resin composition layer (A).

The drying temperature is preferably 60 to 130° C., and the drying time is preferably 3 minutes to 1 hour.

The thickness of the phosphor-containing photosensitive resin composition layer (A) in the present invention is not particularly limited, but it is preferably 10 to 200 µm, more preferably 15 to 150 µm, particularly preferably 20 to 100 µm. If the thickness is less than 10 µm, a phosphor pattern after calcination described below tends to be thin to lower light emission efficiency, while if it exceeds 200 µm, a phosphor pattern after calcination tends to be thick to reduce a light emission area of a phosphor surface, which results in lowering of light emission efficiency.

The thickness of the thermoplastic resin layer (B) in the present invention is not particularly limited, but it is preferably 10 to 200 µm, more preferably 15 to 150 µm, particularly preferably 20 to 100 µm. If the thickness is less than 10 µm, a phosphor pattern after calcination described below tends to be thin to lower light emission efficiency, while if it exceeds 200 µm, a phosphor pattern after calcination tends to be thick to reduce a light emission area of a phosphor surface, which results in lowering of light emission efficiency.

On the phosphor-containing photosensitive resin composition layer (A) of the photosensitive element in the present invention, the above peelable cover film may be further laminated.

As the cover film, there may be mentioned polyethylene, polypropylene, polyethylene terephthalate and polycarbonate. It is preferred that the adhesive strength of the cover film to the phosphor-containing photosensitive resin composition layer (A) is smaller than the adhesive strength of the support film to the thermoplastic resin layer (B) and the adhesive strength of the thermoplastic resin layer (B) to the phosphor-containing photosensitive resin composition layer (A).

The photosensitive element of the present invention can be also obtained by coating the solution in which the above respective components constituting the phosphor-containing photosensitive resin composition layer (A) are dispersed uniformly obtained by dissolving said components in or mixing said components with the above solvent which can dissolve or disperse said components, on the above support film by using a known coating method such as a knife coating method, a roll coating method, a spray coating method, a gravure coating method, a bar coating method and a curtain coating method, followed by drying, to form the phosphor-containing photosensitive resin composition layer (A) and then pasting the phosphor-containing photosensitive resin composition layer (A) and the thermoplastic resin layer (B) provided on the above support film so that both layers are contacted.

In this case, it is preferred that the adhesive strength of the support film with which the phosphor-containing photosensitive resin composition layer (A) is contacted to the phosphor-containing photosensitive resin composition layer (A) is smaller than the adhesive strength of the support film with which the thermoplastic resin layer (B) is contacted to the thermoplastic resin layer (B) and the adhesive strength of the thermoplastic resin layer (B) to the phosphor-containing photosensitive resin composition layer (A).

The photosensitive element of the present invention obtained as described above can be stored by being wound in a roll state.

Figure 14:
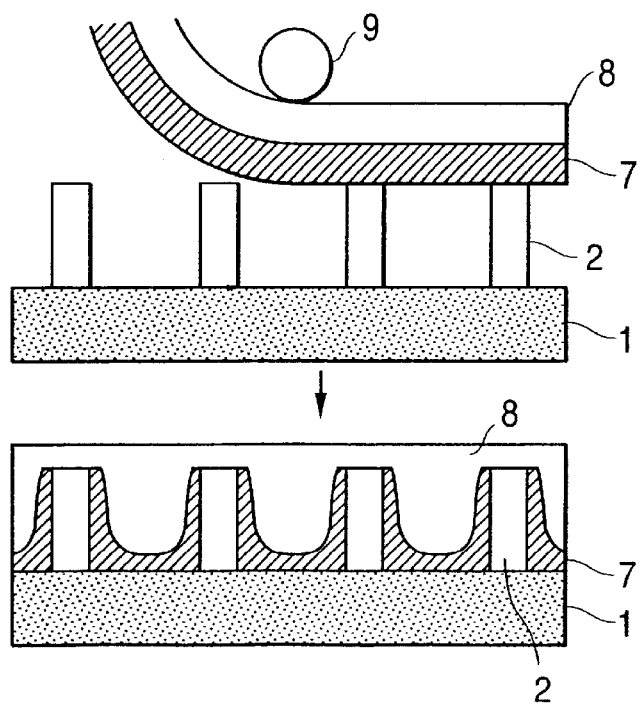
FIG. 14 is a schematical view of the step (Ib) in the process for preparing a phosphor pattern of the present invention.

In the following, the respective steps of the process for preparing a phosphor pattern of the p resent invention, including (Ib) a step of heating and pressurizing a photosensitive element having a support film, the thermoplastic resin layer (B) provided on the support film and the phosphor-containing photosensitive resin composition layer (A) provided thereon so that the phosphor-containing photosensitive resin composition layer (A) is contacted with an uneven surface of a substrate having unevenness, to laminate the phosphor-containing photosensitive resin composition layer (A) and the thermoplastic resin layer (B) on the uneven surface; (IIb) a step of irradiating the phosphor-containing photosensitive resin composition layer (A) and/or the thermoplastic resin layer (B) imagewisely with active light; (IIIb) a step of removing unnecessary portions from the phosphor-containing photosensitive resin composition layer (A) and/or the thermoplastic resin layer (B) by development; and (IVb) a step of removing unnecessary components from the phosphor-containing photosensitive resin composition layer (A) and/or the thermoplastic resin layer (B) by calcination are explained in detail by referring to FIG. 6 and FIG. 14. FIG. 6 and FIG. 14 each show a schematical view showing the respective steps of the process for preparing a phosphor pattern of the present invention.

<(Ib) Step of heating and pressurizing a photosensitive element having a support film, the thermoplastic resin layer (B) provided on the support film and the phosphor-containing photosensitive resin composition layer (A) provided thereon so that the phosphor-containing photosensitive resin composition layer (A) is contacted with an uneven surface of a substrate having unevenness, to laminate the phosphor-containing photosensitive resin composition layer (A) and the thermoplastic resin layer (B) on the uneven surface>

FIG. 14 shows a state that the photosensitive element of the present invention including the thermoplastic resin layer (B) 8 and the phosphor-containing photosensitive resin composition layer (A) 7 is laminated by using a heating roll 9, on the uneven surface of the above substrate 1 for PDP (the substrate having unevenness) on which the barrier rib 2 is formed.

In the step of FIG. 14, as a method for laminating the photosensitive element of the present invention including the thermoplastic resin layer (B) 8 and the phosphor-containing photosensitive resin composition layer (A) 7 on the substrate 1 for PDP on which the barrier rib 2 is formed, there may be mentioned, for example, a method in which when a cover film exists on the photosensitive element, after the cover film is removed (when a photosensitive element obtained by pasting the thermoplastic resin layer (B) formed on a support film and the phosphor-containing photosensitive resin composition layer (A) formed on a support film is used, after the support film of the phosphor-containing photosensitive resin composition layer (A) is removed), lamination is carried out by contact bonding under heating of the photosensitive element by the heating roll 9 so that the phosphor-containing photosensitive resin composition layer (A) 7 is contacted with the surface on which the barrier rib 2 is formed, of the substrate 1 for PDP.

The heating temperature at the time of contact bonding under heating is preferably 10 to 140° C., more preferably to 135° C., particularly preferably 30 to 130° C. If the heating temperature is lower than 10° C., property of embedding the phosphor-containing photosensitive resin composition layer (A) 7 in the space of the substrate for PDP tends to be lowered, while if it exceeds 140° C., the phosphor-containing photosensitive resin composition layer (A) 7 tends to be thermoset.

The contact bonding pressure at the time of contact bonding under heating is preferably 50 to $1 \times 10^5$ N/m, more preferably $2.5 \times 10^2$ to $5 \times 10^4$ N/m, particularly preferably $5 \times 10^2$ to $4 \times 10^4$ N/m in terms of line pressure. If the contact bonding pressure is less than 50 N/m, property of embedding the phosphor-containing photosensitive resin composition layer (A) 7 in the space of the concave portion of the substrate for PDP tends to be lowered, while if it exceeds $1 \times 10^5$ N/m, the barrier rib on the substrate for PDP tends to be broken.

When the photosensitive element of the present invention including the thermoplastic resin layer (B) 8 and the phosphor-containing photosensitive resin composition layer (A) 7 is heated as described above, it is not necessary to carry out preheat treatment of the substrate for PDP. However, from the point that property of embedding the phosphor-containing photosensitive resin composition layer (A) 7 in the space of the concave portion is further improved, it is preferred to carry out preheat treatment of the substrate for PDP.

The preheating temperature is preferably 30 to 140° C., and the preheating time is preferably 0.5 to 20 minutes.

From the point that property of embedding the phosphor-containing photosensitive resin composition layer (A) 7 in the space of the concave portion is further improved, the above heating roll 9 having a surface made of a material abundant in flexibility, such as rubber and plastics may be used.

The thickness of the layer of the material abundant in flexibility is preferably 200 to 400 μm.

Further, for the same purpose, operations of the above contact bonding and contact bonding under heating may be carried out under a reduced pressure of $5 \times 10^4$ Pa or less.

After lamination is completed, heating may be carried out at a temperature range of 30 to 150° C. for 1 to 120 minutes. At the time of heating, when a support film exists on the thermoplastic resin layer (B) 8, the support film may be removed, if necessary.

As described above, the phosphor-containing photosensitive resin composition layer (A) 7 can be formed uniformly in the space of the concave portion of the substrate for PDP.

By changing a combination of the respective conditions such as the heating conditions and contact bonding pressure condition at the time of contact bonding under heating of the photosensitive element of the present invention, the preheating conditions of the substrate for PDP, the layer thicknesses of the phosphor-containing photosensitive resin composition layer (A) 7 and the thermoplastic resin layer (B) 8 and the like, the layers can be laminated in a state as shown in FIG. 6.

With respect to the layer thicknesses of the phosphor-containing photosensitive resin composition layer (A) 7 and the thermoplastic resin layer (B) 8, from the point that a phosphor pattern with high precision and a uniform shape can be formed, it is preferred that in the phosphor-containing photosensitive resin composition layer (A) and the thermoplastic resin layer (B) in a region which is the same as the region where unevenness is formed on a substrate having unevenness (a substrate for PDP), the ratio $(V^1)/(V^2)$ of the total volume $(V^1)$ of the phosphor-containing photosensitive resin composition layer (A) and the thermoplastic resin layer (B) to the volume $(V^2)$ of the space of a concave portion of the substrate having unevenness is in the range of 1 to 2. If $(V^1)/(V^2)$ is in the range of 1 to 1.05, the phosphor-containing photosensitive resin composition layer (A) 7 tends to be formed on the inner surface of the concave portion in a state that almost none of the phosphor-containing photosensitive resin composition layer (A) 7 remains on the convex portion as shown in FIG. 14. If $(V^1)/(V^2)$ exceeds 1.05 and is 2 or less, the phosphor-containing photosensitive resin composition layer (A) 7 tends to be formed on the inner surface of the concave portion in a state that the phosphor-containing photosensitive resin composition layer (A) 7 remains on the convex portion as shown in FIG. 6. Here, if $(V^1)/(V^2)$ is less than 1, a portion of the inner surface of the concave portion to which the phosphor-containing photosensitive resin composition layer (A) 7 cannot be adhered tends to be generated, while if it exceeds 2, the sectional shape of a multicolor phosphor pattern described below tends to be non-uniform.

In preparation of the substrate for PDP before the photosensitive element is laminated, there is a case where entire or partial shrinkage of the substrate for PDP is caused by heating or the like, and there is a case where almost no shrinkage of the substrate for PDP is caused by heating or the like. In the case where entire or partial shrinkage of the substrate for PDP is caused, positional displacement between the substrate for PDP and a photomask may be caused. Therefore, in the case where entire or partial shrinkage of the substrate for PDP is caused, from the point that tolerance of registration precision of a photomask is enlarged in the step (IIb) of irradiating the phosphor-containing photosensitive resin composition layer (A) and/or the thermoplastic resin layer (B) imagewisely with active light described below, it is preferred that the phosphor-containing photosensitive resin composition layer (A) 7 is laminated on the inner surface of the concave portion so that almost none of the phosphor-containing photosensitive resin composition layer (A) 7 remains on the convex portion as shown in FIG. 14. In the case where almost no shrinkage of the substrate for PDP is caused, lamination may be carried out as shown in FIG. 14, or lamination may be carried out in a state that the phosphor-containing photosensitive resin composition layer (A) 7 remains on the convex portion as shown in FIG. 6.

As described above, as shown in FIG. 14 (II) or FIG. 6, the phosphor-containing photosensitive resin composition layer (A) 7 can be laminated uniformly on the surface (on the uneven surface) of the substrate 1 for PDP on which the barrier rib 2 is formed.

<(IIb) Step of irradiating the phosphor-containing photosensitive resin composition layer (A) and/or the thermoplastic resin layer (B) imagewisely with active light>

As a method for irradiating the phosphor-containing photosensitive resin composition layer (A) and/or the thermoplastic resin layer (B) imagewise with active light, there may be used all of the same methods as in the above step (IIa) of irradiating the phosphor-containing photosensitive resin composition layer (A) and/or the thermoplastic resin layer (B) imagewisely with active light.

<(IIIb) Step of removing unnecessary portions from the phosphor-containing photosensitive resin composition layer (A) and/or the thermoplastic resin layer (B) by development>

As a method for removing unnecessary portions from the phosphor-containing photosensitive resin composition layer (A) and/or the thermoplastic resin layer (B) by development, there may be used all of the same methods as in the above step (IIIa) of removing unnecessary portions from the phosphor-containing photosensitive resin composition layer (A) and/or the thermoplastic resin layer (B) by development.

<(IVb) Step of removing unnecessary components from the phosphor-containing photosensitive resin composition layer (A) and/or the thermoplastic resin layer (B) by calcination>

As a method for removing unnecessary components from the phosphor-containing photosensitive resin composition layer (A) and/or the thermoplastic resin layer (B) by calcination, there may be used all of the same methods as in the above step (IVa) of removing unnecessary components from the phosphor-containing photosensitive resin composition layer (A) and/or the thermoplastic resin layer (B) by calcination.

In the process for preparing a phosphor pattern of the present invention, from the point of reducing the number of steps, it is preferred that after a multicolor pattern comprising photosensitive resin composition layers each containing a phosphor which emits red, green or blue light is formed by repeating the respective steps of (Ib) to (IIIb) of the above process of the present invention for every color, the step of (IVb) is carried out to form a multicolor phosphor pattern.

In the present invention, in the phosphor-containing photosensitive resin composition layer (A) 7 containing phosphors which emit red, blue and green lights, respectively, pattern formations of red, blue and green may be carried out in any order.

In the process for preparing a phosphor pattern of the present invention, from the point of suppressing decrease in phosphor-containing photosensitive resin composition layer thickness, it is preferred that a multicolor phosphor pattern which emit red, green and blue lights is formed by repeating the respective steps of (Ib) to (IVb) in the above process of the present invention for every color.

Also, as a process for forming the phosphor pattern (comprising a phosphor layer) in the present invention, there may be mentioned, for example, a process including (Ic) a step of heating and pressurizing an embedding layer (C) in a state that the embedding layer (C) is superposed on the phosphor-containing photosensitive resin composition layer (A) on an uneven surface of a substrate having unevenness, to laminate the phosphor-containing photosensitive resin composition layer (A) and the embedding layer (C) on the uneven surface; (IIc) a step of peeling the embedding layer (C); (IIIc) a step of irradiating the phosphor-containing photosensitive resin composition layer (A) imagewisely with active light; (IVc) a step of removing an unnecessary portion from the phosphor-containing photosensitive resin composition layer (A) by development; and (Vc) a step of removing unnecessary components from the phosphor-containing photosensitive resin composition layer (A) by calcination.

A material constituting the embedding layer (C) in the present invention is not particularly limited so long as it is deformed by stress from the outside and can be peeled off from the phosphor-containing photosensitive resin composition layer (A). As the material, there may be mentioned, for example, polyethylene, polypropylene, polymethylpentene, polycarbonate, polyurethane, Teflon (trade name, produced by E.I. du Pont de Nemours & Co. Inc.), rubbers (e.g., butadiene rubber, styrene-butadiene rubber and silicone rubber), polyvinyl chloride, polyvinyl acetate, polyvinylidene chloride, polystyrene, polyvinyltoluene, polyacrylate, polymethacrylate, a copolymer of ethylene and vinyl acetate, a copolymer of ethylene and acrylate, a copolymer of vinyl chloride and vinyl acetate, a copolymer of styrene and acrylate or methacrylate, a copolymer of vinyltoluene and acrylate or methacrylate, a polyvinyl alcohol type resin (e.g., a hydrolyzate of polyacrylate or polymethacrylate, a hydrolyzate of polyvinyl acetate, a hydrolyzate of a copolymer of ethylene and vinyl acetate, a hydrolyzate of a copolymer of ethylene and acrylate, a hydrolyzate of a copolymer of vinyl chloride and vinyl acetate, a hydrolyzate of a copolymer of styrene and acrylate or methacrylate and a hydrolyzate of a copolymer of vinyltoluene and acrylate or methacrylate), a water-soluble salt of carboxyalkyl cellulose, water-soluble cellulose ethers, a water-soluble salt of carboxyalkyl starch, polyvinyl pyrrolidone and a resin having a carboxyl group obtained by copolymerizing an unsaturated carboxylic acid and an unsaturated monomer which is copolymerizable therewith. These materials are used singly or in combination of two or more of them.

From the point of suppressing migration of the photopolymerization initiator (c) which produces free radical by irradiation of active light in the phosphor-containing photosensitive resin composition layer (A) into the embedding layer (C), the embedding layer (C) in the present invention may be also constituted by a resin composition comprising the material constituting the embedding layer (C) and a photopolymerization initiator which produces free radical by irradiation of active light.

As the photopolymerization initiator which produces free radical by irradiation of active light, there may be used the above photopolymerization initiator (c) which produces free radical by irradiation of active light, which can be used in the photosensitive resin composition constituting the phosphor-containing photosensitive resin composition layer (A).

From the point of suppressing migration of the photopolymerizable unsaturated compound (b) having an ethylenic unsaturated group in the phosphor-containing photosensitive resin composition layer (A) into the embedding layer (C), the embedding layer (C) in the present invention may be also constituted by a resin composition comprising the material constituting the embedding layer (C) and a photopolymerizable unsaturated compound having an ethylenic unsaturated group.

As the photopolymerizable unsaturated compound having an ethylenic unsaturated group, there may be used the above photopolymerizable unsaturated compound (b) having an ethylenic unsaturated group, which can be used in the photosensitive resin composition constituting the phosphor-containing photosensitive resin composition layer (A).

Among the materials described above, for example, polyethylene, polypropylene, Teflon or the like formed into a film shape by a melt extrusion method or the like may be used as the embedding layer (C).

The embedding layer (C) in the present invention can be also obtained as a film or a sheet by dissolving the above resin and others constituting the embedding layer (C) in or mixing the above resin and others with a solvent which can dissolve or disperse the above resin and others to prepare a solution in which the above resin and others are dissolved or dispersed uniformly and coating the solution of the support film described above, followed by drying.

As a coating method, a known method may be used, and there may be mentioned, for example, a knife coating method, a roll coating method, a spray coating method, a gravure coating method, a bar coating method and a curtain coating method.

The drying temperature is preferably 60 to 130° C., and the drying time is preferably 3 minutes to 1 hour.

The thickness of the embedding (C) in the present invention is not particularly limited, but it is preferably 10 to 200 μm, more preferably 15 to 150 μm, particularly preferably 20 to 100 μm. If the thickness is less than 10 μm, a phosphor pattern after calcination described below tends to be thin to lower light emission efficiency, while if it exceeds 200 μm, a phosphor pattern after calcination tends to be thick to reduce a light emission area of a phosphor surface, which results in lowering of light emission efficiency.

The viscosity at 100° C. of the embedding layer (C) in the present invention is preferably 1 to $1 \times 10^9$ Pa·sec, more preferably 2 to $1 \times 10^8$ Pa·sec, particularly preferably 5 to $1 \times 10^7$ Pa·sec, extremely preferably 10 to $1 \times 10^6$ Pa·sec. If the viscosity at 100° C. is less than 1 Pa·sec, the viscosity at room temperature becomes too low so that when a photosensitive element is prepared, the embedding layer (C) tends to be exuded from an edge portion by flowing, and film-forming property tends to be lowered. If the viscosity at 100° C. exceeds $1 \times 10^9$ Pa·sec, property of forming the phosphor-containing photosensitive resin composition layer (A) on the inner surface of a concave portion of a substrate having unevenness described below tends to be lowered.

On the embedding layer (C) in the present invention, the above peelable cover film may be further laminated. It is preferred that the adhesive strength of the cover film to the embedding layer (C) is smaller than the adhesive strength of the support film to the embedding layer (C).

In order to obtain good peeling property of the embedding layer (C) in the step of peeling the embedding layer (C) described below, a film or the like for facilitating separation of the embedding layer (C) from the phosphor-containing photosensitive resin composition layer (A), in which the adhesive strength to the phosphor-containing photosensitive resin composition layer (A) to the cover film is smaller than the adhesive strength to the embedding layer (C) may be laminated between the embedding layer (C) and the cover film.

The embedding layer (C) having a film shape or sheet shape as described above can be stored by being wound in a roll state.

In the following, the respective steps of the process for preparing a phosphor pattern of the present invention, including (Ic) a step of heating and pressurizing an embedding layer (C) in a state that the embedding layer (C) is superposed on the phosphor-containing photosensitive resin composition layer (A) on an uneven surface of a substrate having unevenness, to laminate the phosphor-containing photosensitive resin composition layer (A) and the embedding layer (C) on the uneven surface; (IIc) a step of peeling the embedding layer (C); (IIIc) a step of irradiating the phosphor-containing photosensitive resin composition layer (A) imagewisely with active light; (IVc) a step of removing an unnecessary portion from the phosphor-containing photosensitive resin composition layer (A) by development; and (Vc) a step of removing unnecessary components from the phosphor-containing photosensitive resin composition layer (A) by calcination are explained in detail by referring to FIG. 15 and FIG. 16. FIG. 15 and FIG. 16 each show a schematical view showing the respective steps of the process for preparing a phosphor pattern of the present invention.

<(Ic) Step of heating and pressurizing an embedding layer (C) in a state that the embedding layer (C) is superposed on the phosphor-containing photosensitive resin composition layer (A) on an uneven surface of a substrate having unevenness, to laminate the phosphor-containing photosensitive resin composition layer (A) and the embedding layer (C) on the uneven surface>

Figure 15A:
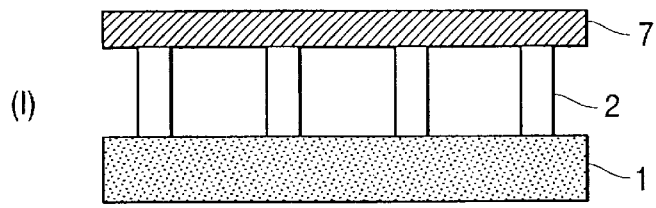
FIG. 15 is a schematical view showing the respective steps of (Ic) to (IVc) in the process for preparing a phosphor pattern of the present invention.
Figure 15B:
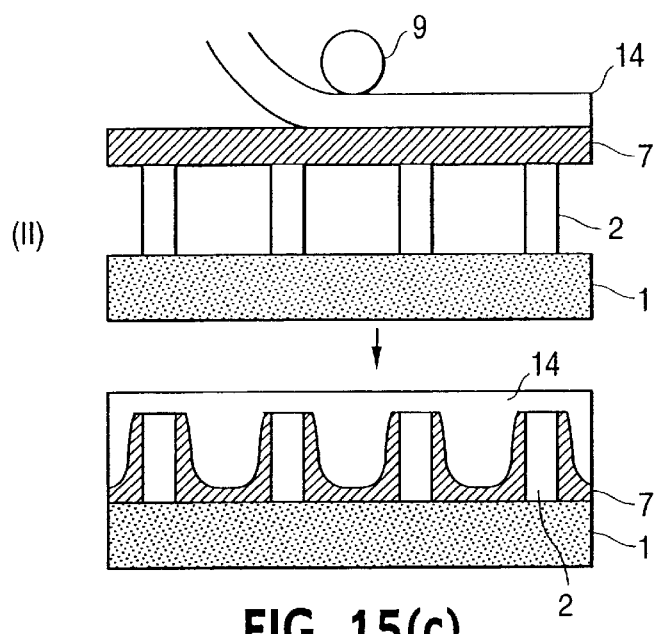
Figure 16:
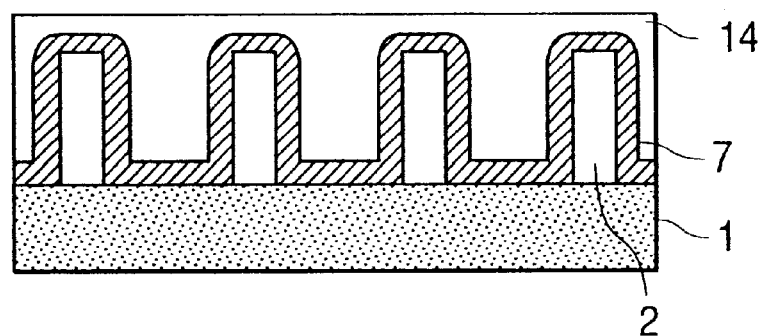
FIG. 16 is one embodiment after completion of the step (Ic) in the process for preparing a phosphor pattern of the present invention.

FIG. 15(a) and FIG. 15(b) each show one embodiment of the step (Ic) of heating and pressurizing an embedding layer (C) in a state that the embedding layer (C) is superposed on the phosphor-containing photosensitive resin composition layer (A) on an uneven surface of a substrate having unevenness, to laminate the phosphor-containing photosensitive resin composition layer (A) and the embedding layer (C) on the uneven surface.

FIG. 15(a) shows a state that the phosphor-containing photosensitive resin composition layer (A) 7 is laminated on the substrate 1 for PDP (the substrate having unevenness) on which the barrier rib 2 is formed.

In FIG. 15(a), as a method for laminating the phosphor-containing photosensitive resin composition layer (A) 7 on the substrate 1 for PDP on which the barrier rib 2 is formed, there may be mentioned, for example, the above lamination method by using the photosensitive element.

In the case where the photosensitive element is used, when a cover film exists on the photosensitive element, after the cover film is removed, the photosensitive element can be laminated by contact bonding using a contact bonding roll or the like so that the phosphor-containing photosensitive resin composition layer (A) 7 is contacted with the surface on which the barrier rib is formed, of the substrate for PDP.

The contact bonding pressure when pressurization is carried out is preferably 50 to $1 \times 10^5$ N/m, more preferably $2.5 \times 10^2$ to $5 \times 10^4$ N/m, particularly preferably $5 \times 10^2$ to $4 \times 10^4$ N/m in terms of line pressure. If the contact bonding pressure is less than 50 N/m, property of embedding the phosphor-containing photosensitive resin composition layer (A) 7 in the space of a concave portion of the substrate for PDP tends to be lowered, while if it exceeds $1 \times 10^5$ N/m, the barrier rib on the substrate for PDP tends to be broken.

From the point that property of embedding the phosphor-containing photosensitive resin composition layer (A) 7 in the space is further improved, the above contact bonding roll having a surface made of a material abundant in flexibility, such as rubber and plastics may be used.

The thickness of the layer of the material abundant in flexibility is preferably 200 to 400 μm.

From the point that property of embedding the phosphor-containing photosensitive resin composition layer (A) 7 in the space is further improved, lamination may be carried out by contact bonding of the photosensitive element to the surface on which the barrier rib is formed, of the substrate for PDP while heating the photosensitive element by a heating roll or the like.

The heating temperature at the time of contact bonding under heating is preferably 10 to 140° C., more preferably 20 to 135° C., particularly preferably 30 to 130° C. If the heating temperature is lower than 10° C., the phosphor-containing photosensitive resin composition layer (A) 7 tends not to be adhered to the substrate for PDP sufficiently, while if it exceeds 140° C., the phosphor-containing photosensitive resin composition layer (A) 7 tends to be thermoset.

The contact bonding pressure at the time of contact bonding under heating is preferably 50 to $1\times10^5$ N/m, more preferably $2.5\times10^2$ to $5\times10^4$ N/m, particularly preferably $5\times10^2$ to $4\times10^4$ N/m in terms of line pressure. If the contact bonding pressure is less than 50 N/m, property of embedding the phosphor-containing photosensitive resin composition layer (A) 7 in the space of the concave portion of the substrate for PDP tends to be lowered, while if it exceeds $1\times10^5$ N/m, the barrier rib on the substrate for PDP tends to be broken.

When the photosensitive element is heated as described above, it is not necessary to carry out preheat treatment of the substrate for PDP on which the barrier rib is formed. However, from the point that property of embedding the phosphor-containing photosensitive resin composition layer (A) 7 in the space of the concave portion is further improved, it is preferred to carry out preheat treatment of the above substrate for PDP.

The preheating temperature is preferably 30 to 130° C., and the preheating time is preferably 0.5 to 20 minutes.

Further, for the same purpose, operations of the above contact bonding and contact bonding under heating may be carried out under a reduced pressure of $5\times10^4$ Pa or less.

After lamination is completed as described above, heating may be carried out at a temperature range of 30 to 150° C. for 1 to 120 minutes. At the time of heating, a support film may be removed, if necessary.

As described above, as shown in FIG. 15(*a*), the phosphor-containing photosensitive resin composition layer (A) 7 can be laminated on the substrate 1 for PDP on which the barrier rib 2 is formed.

FIG. 15(*b*) shows a state that an embedding layer (C) 14 is superposed on the phosphor-containing photosensitive resin composition layer (A) 7, and contact bonding of the embedding layer (C) 14 is carried out to embed the phosphor-containing photosensitive resin composition layer (A) 7 and the embedding layer (C) 14 in a space surrounded with the wall surface of the barrier rib 2 of the substrate 1 (the substrate having unevenness) for PDP on which said barrier rib is formed and the bottom of said substrate.

In FIG. 15(*b*), as a method for superposing the embedding layer (C) 14 on the phosphor-containing photosensitive resin composition layer (A) 7 and carrying out contact bonding, there may be mentioned, for example, a method in which when a support film exists on the phosphor-containing photosensitive resin composition layer (A) 7 in the state of FIG. 15(*a*), after the support film is removed, (when a cover film exists on the embedding layer (C) 14, after the cover film is removed), the embedding layer (C) 14 is superposed on the phosphor-containing photosensitive resin composition layer (A) 7, and contact bonding is carried out by a contact bonding roll or the like.

In order that property of embedding the phosphor-containing photosensitive resin composition layer (A) 7 in the space of the concave portion of the substrate for PDP is further improved, when a support film exists on the embedding layer (C) 14, contact bonding may be carried out by the contact bonding roll or the like while removing the support film, if necessary.

The contact bonding pressure at the time of contact bonding under heating is preferably 50 to $1\times10^5$ N/m, more preferably $2.5\times10^2$ to $5\times10^4$ N/m, particularly preferably $5\times10^2$ to $4\times10^4$ N/m in terms of line pressure. If the contact bonding pressure is less than 50 N/m, property of embedding the phosphor-containing photosensitive resin composition layer (A) 7 in the space of the concave portion of the substrate for PDP tends to be lowered, while if it exceeds $1\times10^5$ N/m, the barrier rib on the substrate for PDP tends to be broken.

From the point that property of embedding the phosphor-containing photosensitive resin composition layer (A) 7 in the space of the concave portion is further improved, the above contact bonding roll having a surface made of a material abundant in flexibility, such as rubber and plastics may be used.

The thickness of the layer of the material abundant in flexibility is preferably 200 to 400 $\mu$m.

From the point that property of embedding the phosphor-containing photosensitive resin composition layer (A) 7 in the space is further improved, lamination may be carried out by contact bonding of the embedding layer (C) 14 to the surface on which the barrier rib is formed, of the substrate for PDP while heating the embedding layer (C) 14 by a heating roll 9 or the like.

The heating temperature when heating is carried out is preferably 10 to 140° C., more preferably 20 to 135° C., particularly preferably 30 to 130° C. If the heating temperature is lower than 10° C., property of embedding the phosphor-containing photosensitive resin composition layer (A) 7 in the space of the substrate for PDP tends to be lowered, while if it exceeds 140° C., the phosphor-containing photosensitive resin composition layer (A) 7 tends to be thermoset.

When the embedding layer (C) 14 is heated as described above, it is not necessary to carry out preheat treatment of the substrate for PDP on which the phosphor-containing photosensitive resin composition layer (A) 7 is laminated. However, from the point that property of embedding the phosphor-containing photosensitive resin composition layer (A) 7 in the space of the concave portion is further improved, it is preferred to carry out preheat treatment of the substrate for PDP on which the phosphor-containing photosensitive resin composition layer (A) 7 is laminated.

The preheating temperature is preferably 30 to 130° C., and the preheating time is preferably 0.5 to 20 minutes.

From the point that property of embedding the phosphor-containing photosensitive resin composition layer (A) 7 in the space of the concave portion is further improved, the above contact bonding roll under heating having a surface made of a material abundant in flexibility, such as rubber and plastics may be used.

The thickness of the layer of the material abundant in flexibility is preferably 200 to 400 $\mu$m.

Further, for the same purpose, operations of the above contact bonding and contact bonding under heating may be carried out under a reduced pressure of $5\times10^4$ Pa or less.

After lamination is completed, heating may be carried out at a temperature range of 30 to 150° C. for 1 to 120 minutes. At the time of heating, when a support film exists on the embedding layer (C) 14, the support film may be removed, if necessary.

As described above, the phosphor-containing photosensitive resin composition layer (A) 7 can be formed uniformly in the space of the substrate for PDP.

In the step (Ic) in the present invention, both of the phosphor-containing photosensitive resin composition layer (A) 7 and the embedding layer (C) 14 may be laminated simultaneously which carrying out contact bonding under heating.

As conditions of contact bonding under heating when contact bonding under heating of both of the layers is carried out simultaneously, there may be used the above conditions under which contact bonding under heating of the embedding layer (C) 14 is carried out.

In order to facilitate peeling of the embedding layer (C) in the step (IIc) of peeling the embedding layer (C) described below, the substrate for PDP may be cooled (generally in a range of −50 to 50° C.) after the step of (Ic).

By changing a combination of the respective conditions such as the heating conditions and contact bonding pressure condition at the time of contact bonding under heating, the preheating conditions of the substrate for PDP, the layer thicknesses of the phosphor-containing photosensitive resin composition layer (A) 7 and the embedding layer (C) 14 and the like, the layers can be laminated in a state as shown in FIG. 16.

With respect to the layer thicknesses of the phosphor-containing photosensitive resin composition layer (A) 7 and the embedding layer (C) 14, from the point that a phosphor pattern with high precision and a uniform shape can be formed, it is preferred that in the phosphor-containing photosensitive resin composition layer (A) and the embedding layer (C) in a region which is the same as the region where unevenness is formed on a substrate having unevenness, the ratio $(V'^1)/(V'^2)$ of the total volume $(V'^1)$ of the phosphor-containing photosensitive resin composition layer (A) and the embedding layer (C) to the volume $(V'^2)$ of the space of a concave portion of the substrate having unevenness is in the range of 1 to 2. If $(V'^1)/(V'^2)$ is in the range of 1 to 1.05, the phosphor-containing photosensitive resin composition layer (A) 7 tends to be formed on the inner surface of the concave portion in a state that almost none of the phosphor-containing photosensitive resin composition layer (A) 7 remains on the convex portion as shown in FIG. 15(b). If $(V'^1)/(V'^2)$ exceeds 1.05 and is 2 or less, the phosphor-containing photosensitive resin composition layer (A) 7 tends to be formed on the inner surface of the concave portion in a state that the phosphor-containing photosensitive resin composition layer (A) 7 remains on the convex portion as shown in FIG. 16. Here, if $(V'^1)/(V'^2)$ is less than 1, a portion of the inner surface of the concave portion to which the phosphor-containing photosensitive resin composition layer (A) 7 cannot be adhered tends to be generated, while if it exceeds 2, the sectional shape of a multicolor phosphor pattern described below tends to be non-uniform.

In preparation of the substrate for PDP before the photosensitive element is laminated, there is a case where entire or partial shrinkage of the substrate for PDP is caused by heating or the like, and there is a case where almost no shrinkage of the substrate for PDP is caused by heating or the like. In the case where entire or partial shrinkage of the substrate for PDP is caused, positional displacement between the substrate for PDP and a photomask may be caused. Therefore, in the case where entire or partial shrinkage of the substrate for PDP is caused, from the point that tolerance of registration precision of a photomask is enlarged in the step (IIIC) of irradiating the phosphor-containing photosensitive resin composition layer (A) imagewisely with active light described below, it is preferred that the phosphor-containing photosensitive resin composition layer (A) 7 is laminated on the inner surface of the concave portion so that almost none of the phosphor-containing photosensitive resin composition layer (A) 7 remains on the convex portion as shown in FIG. 15(b). In the case where almost no shrinkage of the substrate for PDP is caused, lamination may be carried out as shown in FIG. 15(b), or lamination may be carried out in a state that the phosphor-containing photosensitive resin composition layer (A) 7 remains on the convex portion as shown in FIG. 16.

As described above, as shown in FIG. 15(b) or FIG. 16, the phosphor-containing photosensitive resin composition layer (A) 7 can be formed on the inner surface (the wall surface of the barrier rib 2 and the surface of the substrate 1) of the substrate having unevenness (the substrate for PDP) with a good shape and good operatability.

<(IIc) Step of peeling the embedding layer (C)>

Figure 15C:
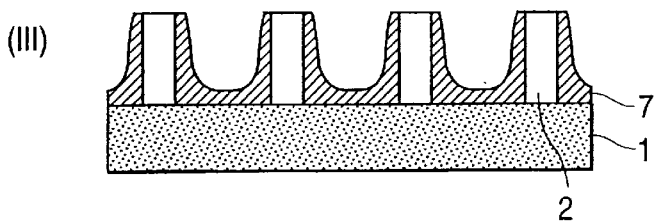

FIG. 15(c) shows a state that the embedding layer (C) 14 is peeled off.

In FIG. 15(c), as a method for peeling the embedding layer (C) 14, there may be mentioned, for example, a method of peeling the embedding layer (C) 14 physically by adhering an adhesive tape on the embedding layer (C) 14 or using a hook-shaped jig or the like.

For the purpose of improving operatability, there may be also used a method of peeling the embedding layer (C) 14 by utilizing electrostatic or sucking force.

Also, immediately after the embedding layer (C) 14 is peeled off, the embedding layer (C) 14 may be wound by using a winding roll or the like.

As described above, as shown in FIG. 15(c), the phosphor-containing photosensitive resin composition layer (A) 7 can be formed on the inner surface (the wall surface of the barrier rib 2 and the surface of the substrate 1) of the concave portion of the substrate having unevenness (the substrate for PDP) with a good shape and good operatability.

<(IIIc) Step of irradiating the phosphor-containing photosensitive resin composition layer (A) imagewisely with active light>

Figure 15D:
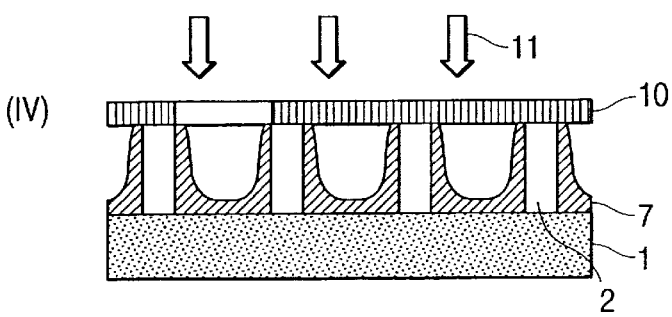

FIG. 15(d) shows a state that active light 11 is irradiated imagewisely.

In FIG. 15(d), as a method for irradiating the active light 11 imagewisely, there may be used a method of irradiating the active light 11 imagewisely through a photomask 10 such as a negative film and a positive film, provided above the phosphor-containing photosensitive resin composition layer (A) 7 in the state of FIG. 15(c).

At the time of irradiation, the active light 11 may be also irradiated imagewisely after the phosphor-containing photosensitive resin composition layer (A) 7 is newly covered with the support film described above.

When the embedding layer (C) 14 comprises a material through which the active light 11 can permeate, the above step (IIc) of peeling the embedding layer (C) may be carried out after this step (IIIc) is carried out in a state that the embedding layer (C) 14 is superposed.

In preparation of the substrate for PDP before the photosensitive element is laminated, in the case where entire or partial shrinkage of the substrate for PDP is caused by heating or the like or in the case where almost none of the phosphor-containing photosensitive resin composition layer (A) 7 remains on the convex portion as shown in FIG. 15 (c), from the point that tolerance of registration precision is enlarged, it is preferred that the permeation width of the active light 11 of the photomask 10 is the same permeation width as the opening width of the concave portion of the substrate for PDP or wider than the opening width of the concave portion of the substrate for PDP.

Also, in preparation of the substrate for PDP before the photosensitive element is laminated, in the case where almost no shrinkage of the substrate for PDP is caused by heating or the like and the phosphor-containing photosensitive resin composition layer (A) 7 remains on the convex portion as shown in FIG. 16, from the point that a phosphor pattern can be formed on the inner surface of the concave portion with good operatability, it is preferred that photomask 10 has an active light permeation width which is narrower than the opening width of the concave portion.

When the opening width of the concave portion is W ($\mu$m), the active light permeation width which is narrower than the opening width of the concave portion is preferably 0.3×W to 0.99999×W, more preferably 0.5×W to 0.999×W, particularly preferably 0.6×W to 0.99×W.

If the active light permeation width which is narrower than the opening width of the concave portion is less than 0.3×W, photocuring of the phosphor-containing photosensitive resin composition layer (A) 7 formed on the inner surface of the concave portion tends to be insufficient. In development described below, developing solution resistance (property that a portion which remains without being removed by development and becomes a pattern is not corroded by development) of the phosphor-containing photosensitive resin composition layer (A) 7 formed on the inner surface of the concave portion tends to be lowered, and even a necessary portion of the phosphor-containing photosensitive resin composition layer (A) 7 formed on the inner surface of the concave portion tends to be removed. If the active light permeation width which is narrower than the opening width of the concave portion is a width exceeding 0.99999×W, even a portion other than the inner surface of the concave portion to be photocured tends to be photocured, and an unnecessary portion tends to remain after development described below.

As the active light 11, a known active light source may be used, and there may be mentioned, for example, light generated from carbon arc, mercury vapor arc, xenon arc or the like.

The sensitivity of a photopolymerization initiator is generally the largest in a UV ray region so that in that case, an active light source which radiates UV ray effectively should be used. When the photopolymerization initiator is sensitive to visible rays, for example, it is 9,10-phenanthrenequinone, visible light can be used as the active light 11, and as a light source thereof, there may be also used, in addition to the above light sources, a flood bulb for photographs and a solar lamp.

Also, as the active light 11 in the present invention, there may be mentioned parallel light, non-parallel light and scattered light. Either of parallel light, non-parallel light or scattered light may be used, one or two or all of them may be used in one step, and two of them may be used in two stages or all of them may be used in all stages separately. When two of them are used in two stages or all of them are used in all stages separately, either of them may be used firstly.

The irradiation dose of the active light 11 is preferably 3 mJ/cm$^2$ to 3 J/cm$^2$, more preferably 5 mJ/cm$^2$ to 1 J/cm$^2$, particularly preferably 10 mJ/cm$^2$ to 1 J/cm$^2$.

As described above, as shown in FIG. 15(*d*), active light can be irradiated imagewisely with high precision and good operatability.

<(IVc) Step of removing an unnecessary portion from the phosphor-containing photosensitive resin composition layer (A) by development>

As a method for removing an unnecessary portion from the phosphor-containing photosensitive resin composition layer (A) by development, there may be used all of the same methods as in the above step (IIIa) of removing unnecessary portions from the phosphor-containing photosensitive resin composition layer (A) and/or the thermoplastic resin layer (B) by development.

<(Vc) Step of removing unnecessary components from the phosphor-containing photosensitive resin composition layer (A) by calcination>

As a method for removing unnecessary components by calcination, there may be used all of the same methods as in the above step (IVa) of removing unnecessary components from the phosphor-containing photosensitive resin composition layer (A) and/or the thermoplastic resin layer (B) by calcination.

In the process for preparing a phosphor pattern of the present invention, from the point of reducing the number of steps, it is preferred that after a multicolor pattern comprising photosensitive resin composition layers each containing a phosphor which emits red, green or blue light is formed by repeating the respective steps of (Ic) to (IVc) of the above process of the present invention for every color, the step of (Vc) is carried out to form a multicolor phosphor pattern.

In the present invention, in the phosphor-containing photosensitive resin composition layer (A) 7 containing phosphors which emit red, blue and green lights, respectively, pattern formations of red, blue and green may be carried out in any order.

In the process for preparing a phosphor pattern of the present invention, from the point of suppressing decrease in phosphor-containing photosensitive resin composition layer thickness, it is preferred that a multicolor phosphor pattern which emit red, green and blue lights is formed by repeating the respective steps of (Ic) to (Vc) in the above process of the present invention for every color.

Also, as a process for forming the phosphor pattern (comprising a phosphor layer) in the present invention, there may be mentioned, for example, a process including (Id) a step of heating and pressurizing a photosensitive element having a support film, the embedding layer (C) provided on the support film and the phosphor-containing photosensitive resin composition layer (A) provided thereon so that the phosphor-containing photosensitive resin composition layer (A) is contacted with an uneven surface of a substrate having unevenness, to laminate the phosphor-containing photosensitive resin composition layer (A) and the embedding layer (C) on the uneven surface; (IId) a step of peeling the embedding layer (C); (IIId) a step of irradiating the phosphor-containing photosensitive resin composition layer (A) imagewisely with active light; (IVd) a step of removing an unnecessary portion from the phosphor-containing photosensitive resin composition layer (A) by development; and (Vd) a step of removing unnecessary components from the phosphor-containing photosensitive resin composition layer (A) by calcination.

The photosensitive element in the present invention has a support film, the embedding layer (C) on the support film and the phosphor-containing photosensitive resin composition layer (A) thereon.

The photosensitive element in the present invention can be obtained by dissolving the above resin constituting the embedding layer (C) in or mixing said resin with a solvent which dissolves said resin to prepare a uniform solution, coating the solution on the above support film by using a known coating method such as a knife coating method, a roll coating method, a spray coating method, a gravure coating method, a bar coating method and a curtain coating method, followed by drying, dissolving the above respective components constituting the phosphor-containing photosensitive resin composition layer (A) in or mixing said components with a solvent which can dissolve or disperse said components to prepare a solution in which said components are dispersed uniformly and coating the solution on the embedding layer (C) provided as described above by using a known coating method such as a knife coating method, a roll coating method, a spray coating method, a gravure coating method, a bar coating method and a curtain coating method, followed by drying.

As the solvent which dissolves the resin constituting the embedding layer (C) and the above respective components constituting the phosphor-containing photosensitive resin composition layer (A), there may be mentioned, for example, water, toluene, acetone, methyl ethyl ketone, methyl isobutyl ketone, methyl cellosolve, ethyl cellosolve, γ-butyrolactone, N-methylpyrrolidone, dimethylformamide, tetramethylsulfone, diethylene glycol dimethyl ether, diethylene glycol monobutyl ether, chloroform, methylene chloride, methyl alcohol and ethyl alcohol. These solvents are used singly or in combination of two or more of them.

In the coating step, the material of a portion of a coating apparatus, contacted with the solution in which the above respective components constituting the phosphor-containing photosensitive resin composition layer (A) are dispersed uniformly by dissolving said components in or mixing said components with the solvent which can dissolve or disperse said components is preferably a non-metallic material. When the material of a portion of a coating apparatus, contacted with the solution constituting the phosphor-containing photosensitive resin composition layer (A) is a metal, the coating apparatus contacted with the solution constituting the phosphor-containing photosensitive resin composition layer (A) is polished by the phosphor in said solution, and powder generated by polishing tends to migrate, as impurity, into the solution constituting the phosphor-containing photosensitive resin composition layer (A).

The drying temperature is preferably 60 to 130° C., and the drying time is preferably 3 minutes to 1 hour.

The thickness of the phosphor-containing photosensitive resin composition layer (A) in the present invention is not particularly limited, but it is preferably 10 to 200 μm, more preferably 15 to 150 μm, particularly preferably 20 to 100 μm. If the thickness is less than 10 μm, a phosphor pattern after calcination described below tends to be thin to lower light emission efficiency, while if it exceeds 200 μm, a phosphor pattern after calcination tends to be thick to reduce a light emission area of a phosphor surface, which results in lowering of light emission efficiency.

The thickness of the embedding layer (C) in the present invention is not particularly limited, but it is preferably 10 to 200 μm, more preferably 15 to 150 μm, particularly preferably 20 to 100 μm. If the thickness is less than 10 μm, a phosphor pattern after calcination described below tends to be thin to lower light emission efficiency, while if it exceeds 200 μm, a phosphor pattern after calcination tends to be thick to reduce a light emission area of a phosphor surface, which results in lowering of light emission efficiency.

On the phosphor-containing photosensitive resin composition layer (A) of the photosensitive element in the present invention, the above peelable cover film may be further laminated.

As the cover film, there may be mentioned polyethylene, polypropylene, polyethylene terephthalate and polycarbonate. It is preferred that the adhesive strength of the cover film to the phosphor-containing photosensitive resin composition layer (A) is smaller than the adhesive strength of the support film to the embedding layer (C) and the adhesive strength of the embedding layer (C) to the phosphor-containing photosensitive resin composition layer (A).

The photosensitive element of the present invention can be also obtained by coating the solution in which the above respective components constituting the phosphor-containing photosensitive resin composition layer (A) are dispersed uniformly obtained by dissolving said components in or mixing said components with the above solvent which can dissolve or disperse said components, on the above support film by using a known coating method such as a knife coating method, a roll coating method, a spray coating method, a gravure coating method, a bar coating method and a curtain coating method, followed by drying, to form the phosphor-containing photosensitive resin composition layer (A) and then pasting the phosphor-containing photosensitive resin composition layer (A) and the embedding layer (C) provided on the above support film so that both layers are contacted.

In this case, it is preferred that the adhesive strength of the support film with which the phosphor-containing photosensitive resin composition layer (A) is contacted to the phosphor-containing photosensitive resin composition layer (A) is smaller than the adhesive strength of the support film with which the embedding layer (C) is contacted to the embedding layer (C) and the adhesive strength of the embedding layer (C) to the phosphor-containing photosensitive resin composition layer (A).

The photosensitive element of the present invention obtained as described above can be stored by being wound in a roll state.

Figure 17:
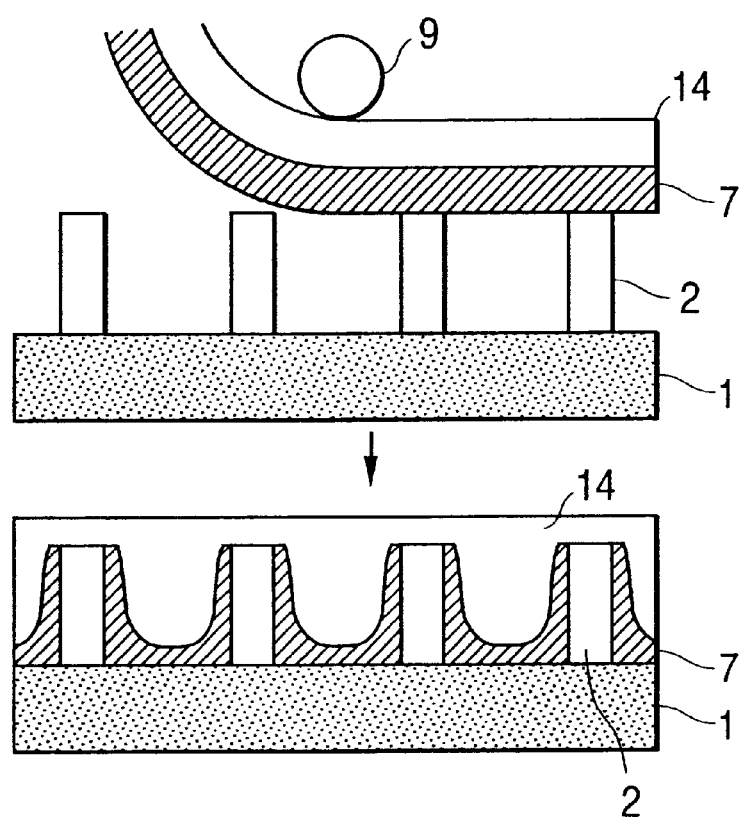
FIG. 17 is a schematical view showing the step (Id) in the process for preparing a phosphor pattern of the present invention.

In the following, the respective steps of the process for preparing a phosphor pattern of the present invention, including (Id) a step of heating and pressurizing a photosensitive element having a support film, the embedding layer (C) provided on the support film and the phosphor-containing photosensitive resin composition layer (A) provided thereon so that the phosphor-containing photosensitive resin composition layer (A) is contacted with an uneven surface of a substrate having unevenness, to laminate the phosphor-containing photosensitive resin composition layer (A) and the embedding layer (C) on the uneven surface; (IId) a step of peeling the embedding layer (C); (IIId) a step of irradiating the phosphor-containing photosensitive resin composition layer (A) imagewisely with active light; (IVd) a step of removing an unnecessary portion from the phosphor-containing photosensitive resin composition layer (A) by development; and (Vd) a step of removing unnecessary components from the phosphor-containing photosensitive resin composition layer (A) by calcination are explained in detail by referring to FIG. 16 and FIG. 17. FIG. 16 and FIG. 17 each show a schematical view showing the respective steps of the process for preparing a phosphor pattern of the present invention.

<(Id) Step of heating and pressurizing a photosensitive element having a support film, the embedding layer (C) provided on the support film and the phosphor-containing photosensitive resin composition layer (A) provided thereon so that the phosphor-containing photosensitive resin composition layer (A) is contacted with an uneven surface of a substrate having unevenness, to laminate the phosphor-containing photosensitive resin composition layer (A) and the embedding layer (C) on the uneven surface>

FIG. 16 shows a state that the photosensitive element of the present invention including the embedding layer (C) 14 and the phosphor-containing photosensitive resin composition layer (A) 7 is laminated by using a heating roll 9, on the uneven surface of the above substrate 1 for PDP (the substrate having unevenness) on which the barrier rib 2 is formed.

In the step of FIG. 16, as a method for laminating the photosensitive element of the present invention including the embedding layer (C) 14 and the phosphor-containing photosensitive resin composition layer (A) 7 on the substrate 1 for PDP on which the barrier rib 2 is formed, there may be mentioned, for example, a method in which when a cover film exists on the photosensitive element, after the cover film is removed (when a photosensitive element obtained by pasting the embedding layer (C) 14 formed on a support film and the phosphor-containing photosensitive resin composition layer (A) 7 formed on a support film is used, after the support film of the phosphor-containing photosensitive resin composition layer (A) 7 is removed), lamination is carried out by contact bonding under heating of the photosensitive element by the heating roll 9 so that the phosphor-containing photosensitive resin composition layer (A) 7 is contacted with the surface on which the barrier rib 2 is formed, of the substrate 1 for PDP.

The heating temperature at the time of contact bonding under heating is preferably 10 to 140° C., more preferably 20 to 135° C., particularly preferably 30 to 130° C. If the heating temperature is lower than 10° C., property of embedding the phosphor-containing photosensitive resin composition layer (A) 7 in the space of the substrate for PDP tends to be lowered, while if it exceeds 140° C., the phosphor-containing photosensitive resin composition layer (A) 7 tends to be thermoset.

The contact bonding pressure at the time of contact bonding under heating is preferably 50 to $1 \times 10^5$ N/m, more preferably $2.5 \times 10^2$ to $5 \times 10^4$ N/m, particularly preferably $5 \times 10^2$ to $4 \times 10^4$ N/m in terms of line pressure. If the contact bonding pressure is less than 50 N/m, property of embedding the phosphor-containing photosensitive resin composition layer (A) 7 in the space of the concave portion of the substrate for PDP tends to be lowered, while if it exceeds $1 \times 10^5$ N/m, the barrier rib on the substrate for PDP tends to be broken.

When the photosensitive element of the present invention including the embedding layer (C) 14 and the phosphor-containing photosensitive resin composition layer (A) 7 is heated as described above, it is not necessary to carry out preheat treatment of the substrate for PDP. However, from the point that property of embedding the phosphor-containing photosensitive resin composition layer (A) 7 in the space of the concave portion is further improved, it is preferred to carry out preheat treatment of the substrate for PDP.

The preheating temperature is preferably 30 to 140° C., and the preheating time is preferably 0.5 to 20 minutes.

From the point that property of embedding the phosphor-containing photosensitive resin composition layer (A) 7 in the space of the concave portion is further improved, the above heating roll 9 having a surface made of a material abundant in flexibility, such as rubber and plastics may be used.

The thickness of the layer of the material abundant in flexibility is preferably 200 to 400 $\mu$m.

Further, for the same purpose, operations of the above contact bonding and contact bonding under heating may be carried out under a reduced pressure of $5 \times 10^4$ Pa or less.

After lamination is completed, heating may be carried out at a temperature range of 30 to 150° C. for 1 to 120 minutes. At the time of heating, when a support film exists on the embedding layer (C) 14, the support film may be removed, if necessary.

As described above, the phosphor-containing photosensitive resin composition layer (A) 7 can be formed uniformly in the space of the concave portion of the substrate for PDP.

In order to facilitate peeling of the embedding layer (C) in the step (IId) of peeling the embedding layer (C) described below, the substrate for PDP may be cooled (generally in a range of −50 to 50° C.) after the step of (Id).

By changing a combination of the respective conditions such as the heating conditions and contact bonding pressure condition at the time of contact bonding under heating of the photosensitive element of the present invention, the preheating conditions of the substrate for PDP, the layer thicknesses of the phosphor-containing photosensitive resin composition layer (A) 7 and the embedding layer (C) 14 and the like, the layers can be laminated in a state as shown in FIG. 16.

With respect to the layer thicknesses of the phosphor-containing photosensitive resin composition layer (A) 7 and the embedding layer (C) 14, from the point that a phosphor pattern with high precision and a uniform shape can be formed, it is preferred that in the phosphor-containing photosensitive resin composition layer (A) and the embedding layer (C) in a region which is the same as the region where unevenness is formed on a substrate having unevenness, the ratio $(V'^1)/(V'^2)$ of the total volume $(V'^1)$ of the phosphor-containing photosensitive resin composition layer (A) and the embedding layer (C) to the volume $(V'^2)$ of the space of a concave portion of the substrate having unevenness is in the range of 1 to 2. If $(V'^1)/(V'^2)$ is in the range of 1 to 1.05, the phosphor-containing photosensitive resin composition layer (A) 7 tends to be formed on the inner surface of the concave portion in a state that almost none of the phosphor-containing photosensitive resin composition layer (A) 7 remains on the convex portion as shown in FIG. 17. If $(V'^1)/(V'^2)$ exceeds 1.05 and is 2 or less, the phosphor-containing photosensitive resin composition layer (A) 7 tends to be formed on the inner surface of the concave portion in a state that the phosphor-containing photosensitive resin composition layer (A) 7 remains on the convex portion as shown in FIG. 16. Here, if $(V'^1)/(V'^2)$ is less than 1, a portion of the inner surface of the concave portion to which the phosphor-containing photosensitive resin composition layer (A) 7 cannot be adhered tends to be generated, while if it exceeds 2, the sectional shape of a multicolor phosphor pattern described below tends to be non-uniform.

In preparation of the substrate for PDP before the photosensitive element is laminated, there is a case where entire or partial shrinkage of the substrate for PDP is caused by heating or the like, and there is a case where almost no shrinkage of the substrate for PDP is caused by heating or the like. In the case where entire or partial shrinkage of the substrate for PDP is caused, positional displacement between the substrate for PDP and a photomask may be caused. Therefore, in the case where entire or partial shrinkage of the substrate for PDP is caused, from the point that tolerance of registration precision of a photomask is enlarged in the step (IIId) of irradiating the phosphor-containing photosensitive resin composition layer (A) imagewisely with active light described below, it is preferred that the phosphor-containing photosensitive resin composition layer (A) 7 is laminated on the inner surface of the concave portion so that almost none of the phosphor-containing photosensitive resin composition layer (A) 7 remains on the convex portion as shown in FIG. 17. In the case where almost no shrinkage of the substrate for PDP is caused, lamination may be carried out as shown in FIG. 17, or lamination may be carried out in a state that the phosphor-containing photosensitive resin composition layer (A) 7 remains on the convex portion as shown in FIG. 16.

As described above, as shown in FIG. 16 or FIG. 17, the phosphor-containing photosensitive resin composition layer (A) 7 can be laminated uniformly on the surface (on the uneven surface) of the substrate 1 for PDP on which the barrier rib 2 is formed.

<(Id) Step of peeling the embedding layer (C)>

As a method for peeling the embedding layer (C), there may be used all of the same methods as in the above step (IIc) of peeling the embedding layer (C).

<(IIId) Step of irradiating the phosphor-containing photosensitive resin composition layer (A) imagewisely with active light>

As a method for irradiating active light imagewisely, there may be used all of the same methods as in the above step (IIIc) of irradiating the phosphor-containing photosensitive resin composition layer (A) imagewisely with active light.

<(IVd) Step of removing an unnecessary portion from the phosphor-containing photosensitive resin composition layer (A) by development>

As a method for removing an unnecessary portion by development, there may be used all of the same methods as in the above step (IVc) of removing an unnecessary portion from the phosphor-containing photosensitive resin composition layer (A) by development.

<(Vd) Step of removing unnecessary components from the phosphor-containing photosensitive resin composition layer (A) by calcination>

As a method for removing unnecessary components by calcination, there may be used all of the same methods as in the above step (Vc) of removing unnecessary components from the phosphor-containing photosensitive resin composition layer (A) by calcination. removing an unnecessary portion from the phosphor-containing photosensitive resin composition layer (A) by development; and (IVe) a step of removing unnecessary components from the phosphor-containing photosensitive resin composition layer (A) by calcination.

Figure 18:
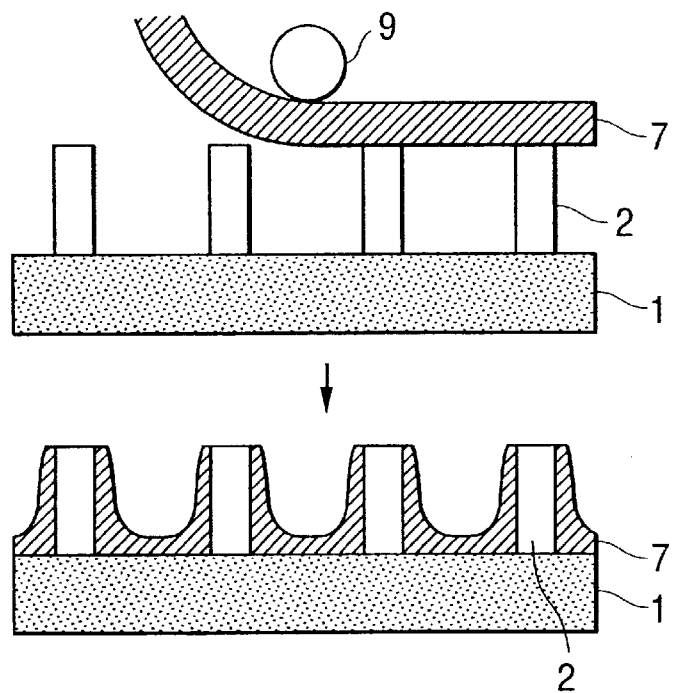
FIG. 18 is a schematical view showing the step (Ie) in the process for preparing a phosphor pattern of the present invention.

In the following, the respective steps of the above process for preparing a phosphor pattern of the present invention are explained in detail by referring to FIG. 18. FIG. 18 is a schematical view showing the respective steps of the process for preparing a phosphor pattern of the present invention.

<(Ie) Step of pressurizing the phosphor-containing photosensitive resin composition layer (A) in a state that the phosphor-containing photosensitive resin composition layer (A) is superposed on a substrate having unevenness, to adhere the phosphor-containing photosensitive resin composition layer (A) to the inner surface of a concave portion on the substrate having unevenness>

As a method for adhering the phosphor-containing photosensitive resin composition layer (A) 7 to a substrate having unevenness in a state that the phosphor-containing photosensitive resin composition layer (A) 7 is superposed on the substrate while applying pressure in the present invention, there may be mentioned, for example, a method of applying atmospheric pressure, wind pressure, hydraulic pressure or the like, a method of carrying out pressurization using a roll having a surface made of a soft and elastic material such as a sponge, rubber, polyethylene, polymethylpentene and a blend of polyethylene and an acryl resin, a method of carrying out pressurization entirely and uniformly by placing a sheet made of a soft and elastic material such as a sponge, rubber, polyethylene, polymethylpentene and a blend of polyethylene and an acryl resin thereon, a method of reducing pressure in a space surrounded with the substrate 1 for PDP, the barrier rib 2 and the phosphor-containing photosensitive resin composition layer (A) 7 to embed the phosphor-containing photosensitive resin composition layer (A) 7 in the space of a concave portion of the substrate having unevenness, and a method in which after the phosphor-containing photosensitive resin composition layer (A) 7 is laminated on the substrate 1 for PDP and pressure is reduced to 5 to 500 Pa or after the phosphor-containing photosensitive resin composition layer (A) 7 is laminated on the substrate 1 for PDP under a reduced pressure of 5 to 500 Pa, pressure is made atmospheric pressure in a state that a space surrounded with the substrate 1 for PDP, the barrier rib 2 and the phosphor-containing photosensitive resin composition layer (A) 7 is closed tightly, to embed the phosphor-containing photosensitive resin composition layer (A) 7 in the space of a concave portion of the substrate for PDP by atmospheric pressure.

At the time of adhering, a support film existing on the phosphor-containing photosensitive resin composition layer (A) 7 is generally removed, but adhering may be carried out in a state that the support film exists thereon.

In the case where the phosphor-containing photosensitive resin composition layer (A) 7 is made to exist under reduced pressure, when the photopolymerizable unsaturated compound (b) having an ethylenic unsaturated group constituting the phosphor-containing photosensitive resin composition layer (A) 7 is a photopolymerizable unsaturated compound, its boiling point (760 mmHg) is preferably 300° C. or higher, more preferably 350° C. or higher, particularly preferably 400° C. or higher, from the points of stability and operatability when heating is carried out under reduced pressure.

In this case, the weight average molecular weight of the photopolymerizable unsaturated compound (b) having an ethylenic unsaturated group constituting the phosphor-containing photosensitive resin composition layer (A) 7 is not particularly limited, but it is preferably 400 or more, more preferably 500 or more, particularly preferably 600 or more, from the points of stability and operatability when heating is carried out under reduced pressure.

Also, application of pressure may be accompanied with heating.

Figure 19:
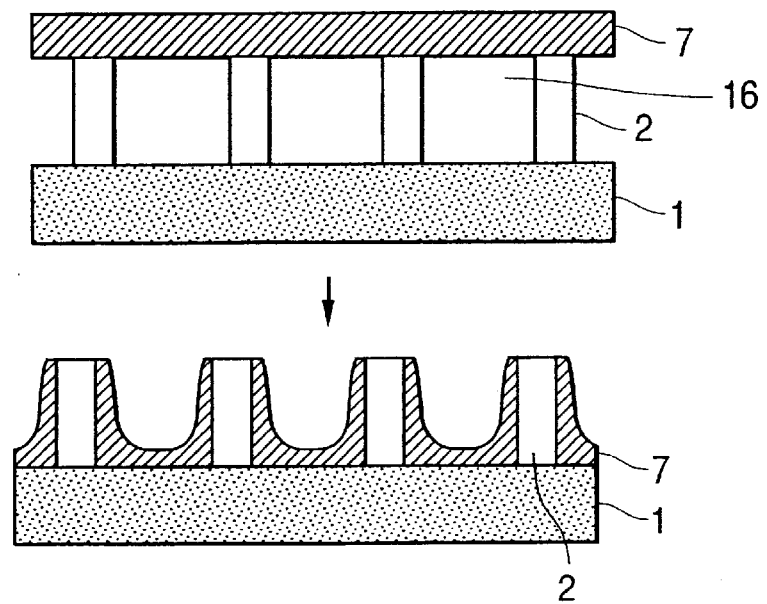
FIG. 19 is a schematical view showing the step (Ie) in the process for preparing a phosphor pattern of the present invention.

FIG. 18 and FIG. 19 each show an example of a state that the phosphor-containing photosensitive resin composition layer (A) 7 in the present invention is adhered to the inner surface of the concave portion on the substrate having unevenness by applying pressure.

In the step of FIG. 18, as a method for adhering the phosphor-containing photosensitive resin composition layer (A) 7 to the inner surface of the concave portion, there may be mentioned, for example, a method in which when a cover film exists on a photosensitive element including the phosphor-containing photosensitive resin composition layer (A) 7.

In the process for preparing a phosphor pattern of the present invention, from the point of reducing the number of steps, it is preferred that after a multicolor pattern comprising photosensitive resin composition layers each containing a phosphor which emits red, green or blue light is formed by repeating the respective steps of (Id) to (IVd) of the above process of the present invention for every color, the step of (Vd) is carried out to form a multicolor phosphor pattern.

In the present invention, in the phosphor-containing photosensitive resin composition layer (A) 7 containing phosphors which emit red, blue and green lights, respectively, pattern formations of red, blue and green may be carried out in any order.

In the process for preparing a phosphor pattern of the present invention, from the point of suppressing decrease in phosphor-containing photosensitive resin composition layer thickness, it is preferred that a multicolor phosphor pattern which emit red, green and blue lights is formed by repeating the respective steps of (Id) to (Vd) in the above process of the present invention for every color.

Also, as a process for forming the phosphor pattern (comprising a phosphor layer) in the present invention, there may be mentioned, for example, a process including (Ie) a step of pressurizing the phosphor-containing photosensitive resin composition layer (A) in a state that the phosphor-containing photosensitive resin composition layer (A) is superposed on a substrate having unevenness, to adhere the phosphor-containing photosensitive resin composition layer (A) to the inner surface of a concave portion on the substrate having unevenness; (IIe) a step of irradiating the phosphor-containing photosensitive resin composition layer (A) imagewisely with active light; (IIIe) a step of after the cover film is removed, and the phosphor-containing photosensitive resin composition layer (A) 7 is adhered to the inner surface of the concave portion of the above substrate for PDP so that the phosphor-containing photosensitive resin composition layer (A) 7 is contacted with the surface on which the barrier rib 2 is formed, of the substrate for PDP while applying pressure by a roll or the like on the phosphor-containing photosensitive resin composition layer (A) 7.

The pressure when adhesion is carried out by pressurization using the above roll or the like is preferably 50 to $1 \times 10^5$ N/m, more preferably $2.5 \times 10^2$ to $5 \times 10^4$ N/m, particularly preferably $5 \times 10^2$ to $4 \times 10^4$ N/m in terms of line pressure. If the adhesion pressure is less than 50 N/m, property of embedding the phosphor-containing photosensitive resin composition layer (A) 7 in the space of the concave portion of the substrate for PDP tends to be lowered, while if it exceeds $1 \times 10^5$ N/m, the barrier rib on the substrate for PDP tends to be broken.

The temperature when application of pressure is accompanied with heating is preferably 10 to 140° C., more preferably 20 to 135° C., particularly preferably 30 to 130° C. If the temperature is lower than 10° C., property of embedding the phosphor-containing photosensitive resin composition layer (A) 7 in the space of the concave portion of the substrate for PDP tends to be lowered, while if it exceeds 140° C., the phosphor-containing photosensitive resin composition layer (A) 7 tends to be cured.

When the phosphor-containing photosensitive resin composition layer (A) 7 is heated as described above, it is not necessary to carry out preheat treatment of the substrate 1 for PDP. However, from the point that embedding property for adhering the phosphor-containing photosensitive resin composition layer (A) 7 to the inner surface of the concave portion is further improved, it is preferred to carry out preheat treatment of the above substrate 1 for PDP.

The preheating temperature is preferably 30 to 130° C., and the preheating time is preferably 0.5 to 20 minutes.

After the phosphor-containing photosensitive resin composition layer (A) 7 is adhered to the inner surface of the concave portion, heating may be carried out at a temperature range of 30 to 150° C. for 1 to 120 minutes. At the time of heating, when a support film exists on the phosphor-containing photosensitive resin composition layer (A) 7, the support film may be removed, if necessary.

In the step (Ie) in the present invention, prior to the step of adhering the phosphor-containing photosensitive resin composition layer (A) 7 to the inner surface of the concave portion, the phosphor-containing photosensitive resin composition layer (A) 7 may be laminated so that it is contacted with the surface on which the barrier rib 2 is formed, of the substrate 1 for PDP, or the phosphor-containing photosensitive resin composition layer (A) 7 may be laminated and adhered to the inner surface of the concave portion while applying pressure in one step.

In the case where after the phosphor-containing photosensitive resin composition layer (A) 7 is laminated, the phosphor-containing photosensitive resin composition layer (A) 7 is adhered to the inner surface of the concave portion, lamination may be carried out only by superposing the phosphor-containing photosensitive resin composition layer (A) 7 on the surface on which the barrier rib 2 is formed, of the substrate 1 for PDP, may be carried out under pressurization or may be carried out under a reduced pressure of $5 \times 10^4$ or less. Also, lamination may be accompanied with heating.

The pressure when pressurization is carried out is preferably 50 to $1 \times 10^5$ N/m, more preferably $2.5 \times 10^2$ to $5 \times 10^4$ N/m, particularly preferably $5 \times 10^2$ to $4 \times 10^4$ N/m in terms of line pressure.

The temperature when application of pressure is accompanied with heating is preferably 10 to 140° C., more preferably 20 to 135° C., particularly preferably 30 to 130° C.

In the step of FIG. 19, as a method for adhering the phosphor-containing photosensitive resin composition layer (A) 7 to the inner surface of the concave portion, there may be mentioned, for example, a method in which after the phosphor-containing photosensitive resin composition layer (A) 7 is laminated on the substrate 1 for PDP and pressure is reduced to 5 to 500 Pa, pressure is made atmospheric pressure in a state that a space surrounded with the substrate 1 for PDP, the barrier rib 2 and the phosphor-containing photosensitive resin composition layer (A) 7 is closed tightly, to embed the phosphor-containing photosensitive resin composition layer (A) 7 in the space of the concave portion of the substrate for PDP by atmospheric pressure.

In FIG. 19, as a method for laminating the phosphor-containing photosensitive resin composition layer (A) 7 on the substrate 1 for PDP on which the barrier rib 2 is formed, there may be mentioned, for example, the above lamination method by using the photosensitive element constituted by the phosphor-containing photosensitive resin composition layer (A).

In the case where the photosensitive element is used, when a cover film exists on the photosensitive element, after the cover film is removed, the photosensitive element can be laminated by contact bonding using a contact bonding roll or the like so that the phosphor-containing photosensitive resin composition layer (A) 7 is contacted with the surface on which the barrier rib is formed, of the substrate for PDP.

The contact bonding pressure when pressurization is carried out is preferably 50 to $1 \times 10^5$ N/m, more preferably $2.5 \times 10^2$ to $5 \times 10^4$ N/m, particularly preferably $5 \times 10^2$ to $4 \times 10^4$ N/m in terms of line pressure. If the contact bonding pressure is less than 50 N/m, property of embedding the phosphor-containing photosensitive resin composition layer (A) 7 in the space of the concave portion of the substrate for PDP tends to be lowered, while if it exceeds $1 \times 10^5$ N/m, the barrier rib on the substrate for PDP tends to be broken.

From the point that property of embedding the phosphor-containing photosensitive resin composition layer (A) 7 in the space of the concave portion is further improved, the above contact bonding roll having a surface made of a material abundant in flexibility, such as rubber and plastics may be used.

The thickness of the layer of the material abundant in flexibility is preferably 200 to 400 μm.

From the point that property of embedding the phosphor-containing photosensitive resin composition layer (A) 7 in the space of the concave portion is further improved, lamination may be carried out by contact bonding of the photosensitive element to the surface on which the barrier rib is formed, of the substrate for PDP while heating the photosensitive element by a heating roll or the like.

The heating temperature at the time of contact bonding under heating is preferably 10 to 140° C., more preferably 20 to 135° C., particularly preferably 30 to 130° C. If the heating temperature is lower than 10° C., the phosphor-containing photosensitive resin composition layer (A) 7 tends not to be adhered to the substrate for PDP sufficiently, while if it exceeds 140° C., the phosphor-containing photosensitive resin composition layer (A) 7 tends to be thermoset.

The contact bonding pressure at the time of contact bonding under heating is preferably 50 to $1 \times 10^5$ N/m, more preferably $2.5 \times 10^2$ to $5 \times 10^4$ N/m, particularly preferably $5 \times 10^2$ to $4 \times 10^4$ N/m in terms of line pressure. If the contact bonding pressure is less than 50 N/m, property of embedding the phosphor-containing photosensitive resin composition layer (A) 7 in the space of the concave portion of the substrate for PDP tends to be lowered, while if it exceeds $1 \times 10^5$ N/m, the barrier rib on the substrate for PDP tends to be broken.

When the photosensitive element is heated as described above, it is not necessary to carry out preheat treatment of the substrate for PDP on which the barrier rib is formed. However, from the point that property of embedding the phosphor-containing photosensitive resin composition layer (A) 7 in the space of the concave portion is further improved, it is preferred to carry out preheat treatment of the above substrate for PDP.

The preheating temperature is preferably 30 to 130° C., and the preheating time is preferably 0.5 to 20 minutes.

Further, for the same purpose, operations of the above contact bonding and contact bonding under heating may be carried out under a reduced pressure of $5 \times 10^4$ Pa or less.

It is preferred that the phosphor-containing photosensitive resin composition layer (A) 7 is superposed on the surface on which the barrier rib 2 is formed, of the substrate 1 for PDP so that air passage through which air in a space 16 (a discharge space) surrounded with the substrate 1 for PDP, the barrier rib 2 and the phosphor-containing photosensitive resin composition layer (A) 7 can be exhausted in the step of reducing pressure described below is left. By the air passage, when exhaustion under vacuum is carried out in the step of reducing pressure described below, there can be prevented tendencies that the phosphor-containing photosensitive resin composition layer (A) 7 is swelled greatly, the thickness of the phosphor-containing photosensitive resin composition layer (A) 7 becomes non-uniform, and wrinkles of the phosphor-containing photosensitive resin composition layer (A) 7 are generated.

Also, in the step of heating described below, it is preferred that the phosphor-containing photosensitive resin composition layer (A) 7 is superposed so that the above air passage can be closed by heating the phosphor-containing photosensitive resin composition layer (A) 7.

After lamination is completed as described above, pressure can be reduced by putting the substrate 1 for PDP on which the phosphor-containing photosensitive resin composition layer (A) 7 is superposed, into a vacuum container horizontally, closing the vacuum container tightly and then exhausting air in the vacuum container.

The shape of the vacuum container is not particularly limited, but from the point that property of embedding the phosphor-containing photosensitive resin composition layer (A) 7 in the space of the concave portion is further improved after the step of heating described below, it is preferred that the vacuum container has a heating apparatus for heating the substrate 1 for PDP on which the phosphor-containing photosensitive resin composition layer (A) 7 is superposed.

The pressure in a vacuum container after reducing pressure is preferably 5 to 500 Pa, more preferably 10 to 200 Pa, particularly preferably 20 to 100 Pa. If the pressure is less than 5 Pa, exhaustion takes a long period of time so that operation efficiency tends to be lowered, while if exceeds 500 Pa, property of embedding the phosphor-containing photosensitive resin composition layer (A) 7 in the space of the concave portion of the substrate 1 for PDP tends to be lowered.

A heating method in the step of heating is not particularly limited, and there may be mentioned, for example, a method in which the substrate 1 for PDP is put on a heating apparatus such as a hot plate provided in a vacuum container and heating is carried out by heat transfer, and a method in which a light source of infrared ray is provided in a vacuum container and heating is carried out by radiation.

The heating temperature is preferably 10 to 140° C., more preferably 20 to 135° C., particularly preferably 30 to 130° C. If the heating temperature is lower than 10° C., property of embedding the phosphor-containing photosensitive resin composition layer (A) 7 in the space of the concave portion of the substrate 1 for PDP tends to be lowered, while if it exceeds 140° C., the phosphor-containing photosensitive resin composition layer (A) 7 tends to be thermoset.

The heating time is preferably 1 hour or shorter, more preferably 20 minutes or shorter, particularly preferably 10 minutes or shorter. If the heating time exceeds 1 hour, the phosphor-containing photosensitive resin composition layer (A) 7 tends to be thermoset.

Also, in the step of heating, it is preferred that the space 16 surrounded with the substrate 1 for PDP, the barrier rib 2 and the phosphor-containing photosensitive resin composition layer (A) 7 is in a tightly closed state.

The pressure in the vacuum container can be returned to atmospheric pressure by, for example, introducing air or the like into the vacuum container.

A time from starting to introduce air or the like into the vacuum container to returning the pressure to atmospheric pressure is preferably 30 minutes or shorter, more preferably 10 minutes or shorter, particularly preferably 5 minutes or shorter. If the time exceeds 30 minutes, property of embedding the phosphor-containing photosensitive resin composition layer (A) 7 in the space of the concave portion of the substrate 1 for PDP tends to be lowered.

As described above, as shown in FIG. 18 or FIG. 19, after the phosphor-containing photosensitive resin composition layer (A) 7 is laminated, the phosphor-containing photosensitive resin composition layer (A) 7 can be adhered uniformly to the inner surface of the concave portion by using the adhesion method described above.

<(IIe) Step of irradiating the phosphor-containing photosensitive resin composition layer (A) imagewisely with active light>

As a method for irradiating active light imagewisely, there may be used all of the same methods as in the above step (IIIc) of irradiating the phosphor-containing photosensitive resin composition layer (A) imagewisely with active light.

<(IIIe) Step of removing an unnecessary portion from the phosphor-containing photosensitive resin composition layer (A) by development>

As a method for removing an unnecessary portion by development, there may be used all of the same methods as in the above step (IVc) of removing an unnecessary portion from the phosphor-containing photosensitive resin composition layer (A) by development.

<(IVe) Step of removing unnecessary components from the phosphor-containing photosensitive resin composition layer (A) by calcination>

As a method for removing unnecessary components by calcination, there may be used all of the same methods as in the above step (Vc) of removing unnecessary components from the phosphor-containing photosensitive resin composition layer (A) by calcination.

In the process for preparing a phosphor pattern of the present invention, from the point of reducing the number of steps, it is preferred that after a multicolor pattern comprising photosensitive resin composition layers each containing a phosphor which emits red, green or blue light is formed by repeating the respective steps of (Ie) to (IIIe) of the above process of the present invention for every color, the step of (IVe) is carried out to form a multicolor phosphor pattern.

In the present invention, in the phosphor-containing photosensitive resin composition layer (A) 7 containing phosphors which emit red, blue and green lights, respectively, pattern formations of red, blue and green may be carried out in any order.

In the process for preparing a phosphor pattern of the present invention, from the point of suppressing decrease in phosphor-containing photosensitive resin composition layer thickness, it is preferred that a multicolor phosphor pattern which emit red, green and blue lights is formed by repeating the respective steps of (Ie) to (IVe) in the above process of the present invention for every color.

Figure 20:
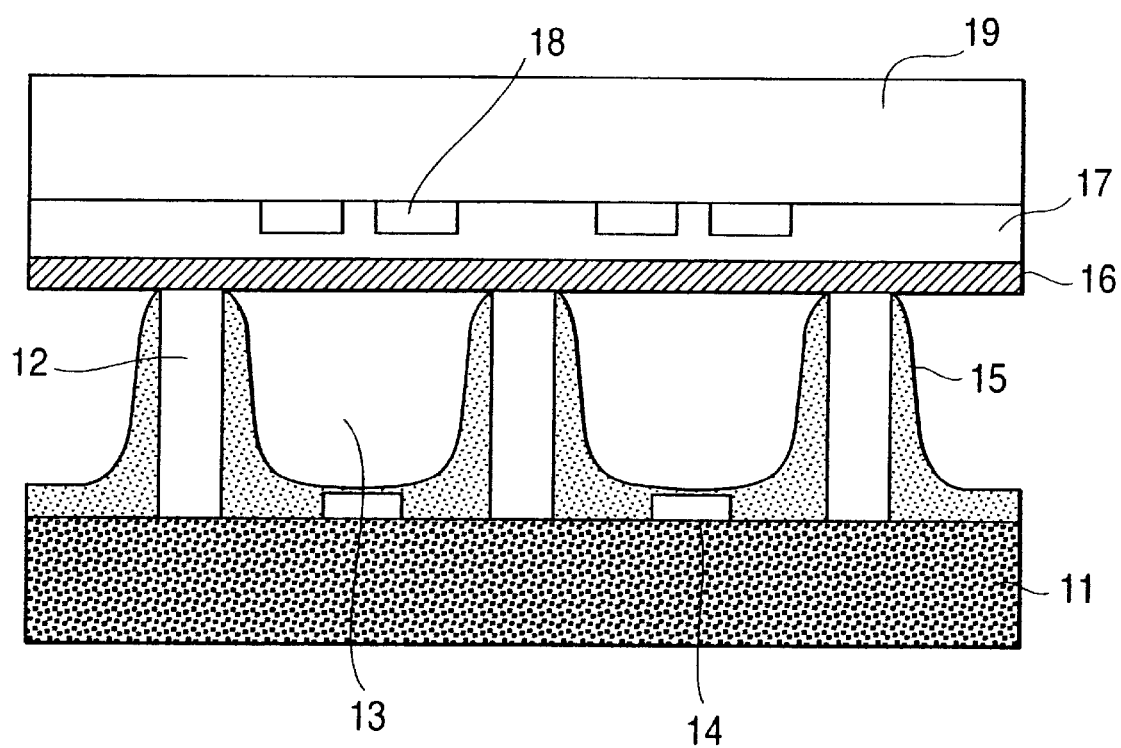
FIG. 20 is a schematic view showing a plasma display panel for an alternating current.

FIG. 20 is a schematic drawing showing a plasma display panel for an alternating current in which the reference numeral 11 is a substrate (or a back plate glass substrate), 12 is a barrier rib, 13 is a discharge space, 14 is an electrode for address, 15 is a phosphor-containing photosensitive resin composition, 16 is a protective film, 17 is a dielectric material layer, 18 is a display electrode (a transparent electrode) and 19 is a front glass substrate. In this figure, the front plate is the portion upper than the protective film 16 (inclusive) and the back plate is the portion not upper than the protective film 16 (exclusive).

In FIG. 20, an embodiment of applying the present invention to an alternating current plasma display panel is shown, but the composition of the present invention can be also applied to a plasma display panel for a direct current.

EXAMPLES

The present invention is described in detail by referring to Examples.

Preparation Example 1

<Preparation of Film property-imparting polymer (a-1)>

A flask equipped with a stirrer, a reflux condenser, an inert gas-introducing inlet and a thermometer was charged with (1) shown in Table 1, and the temperature of the mixture was raised to 80° C. under nitrogen gas atmosphere. While maintaining the reaction temperature at 80±2° C., (2) shown in Table 1 was uniformly added dropwise to the mixture over 4 hours.

After dropwise addition of (2), the resulting mixture was stirred at 80±2° C. for 6 hours to obtain Film property-imparting polymer (a-1) having a weight average molecular weight of 80,000 and an acid value of 130 mgKOH/g.

TABLE 1

|     | Material | Formulation amount |
| --- | --- | --- |
| (1) | Ethylene glycol monomethyl ether | 70 parts by weight |
|     | Toluene | 50 parts by weight |
| (2) | Methacrylic acid | 20 parts by weight |
|     | Methyl methacrylate | 55 parts by weight |
|     | Ethyl acrylate | 15 parts by weight |
|     | n-Butyl methacrylate | 10 parts by weight |
|     | 2,2'-Azobis(isobutyronitrile) | 0.5 part by weight |

Preparation Example 2

<Preparation of Film property-imparting film (a-2)>

In the same manner as in Preparation example 1 except for changing the amount of methacrylic acid of (2) from 20 parts by weight to 17.5 parts by weight, the amount of methyl methacrylate of (2) from 55 parts by weight to 53.5 parts by weight, the amount of ethyl acrylate of (2) from 15 parts by weight to 29.0 parts by weight and the amount of n-butyl methacrylate of (2) from 10 parts by weight to 0 part by weight, Film property-imparting polymer (a-2) having a weight average molecular weight of 80,000 and an acid value of 114 mgKOH/g was obtained.

Preparation Example 3

<Preparation of Film property-imparting film (a-3)>

In the same manner as in Preparation example 1 except for changing the amount of methacrylic acid of (2) from 20 parts by weight to 4 parts by weight, the amount of methyl methacrylate of (2) from 55 parts by weight to 86 parts by weight and the amount of ethyl acrylate of (2) from 15 parts by weight to 0 part by weight, Film property-imparting polymer (a-3) having a weight average molecular weight of 80,000 and an acid value of 26 mgKOH/g was obtained.

Preparation Example 4

<Preparation of Photopolymerizable high molecular weight binder (b-1) having an ethylenic unsaturated group at an end>

A flask equipped with a stirrer, a reflux condenser, an inert gas-introducing inlet and a thermometer was charged with (1) shown in Table 2, and the temperature of the mixture was raised to 80° C. under nitrogen gas atmosphere. While maintaining the reaction temperature at 80±2° C., (2) shown in Table 2 was uniformly added dropwise to the mixture over 4 hours.

After dropwise addition of (2), the resulting mixture was stirred at 80±2° C. for 6 hours, and then (3) shown in Table 2 was added thereto. After addition of (3), the temperature of the reaction system was raised to 100° C., and (4) shown in Table 2 was added dropwise thereto over 0.5 hour. After dropwise addition of (4), the resulting mixture was stirred at 100° C. for 20 hours and then cooled to room temperature to obtain Photopolymerizable high molecular weight binder (b-1) having an ethylenic unsaturated group in a side chain and having a weight average molecular weight of 60,000 and an acid value of 108 mgKOH/g.

TABLE 2

|     | Material | Formulation amount |
| --- | --- | --- |
| (1) | Ethylene glycol monomethyl ether | 110 parts by weight |
|     | Toluene | 65 parts by weight |
| (2) | Methacrylic acid | 50 parts by weight |
|     | Methyl methacrylate | 32 parts by weight |
|     | Ethyl acrylate | 18 parts by weight |
|     | 2,2'-Azobis(isobutyronitrile) | 2.2 parts by weight |
| (3) | Hydroquinone | 0.05 part by weight |
| (4) | Glycidyl methacrylate | 44.6 parts by weight |
|     | Benzyltrimethylammonium chloride | 0.1 part by weight |
|     | Ethylene glycol monomethyl ether | 60 parts by weight |
|     | Toluene | 60 parts by weight |

Preparation Example 5
<Preparation of Solution (A-1) for Phosphor-containing photosensitive resin composition layer (A)>

Materials shown in Table 3 were mixed for 15 minutes by using a stirring machine to prepare Solution (A-1) for Phosphor-containing photosensitive resin composition layer (A).

TABLE 3

| Material | Formulation amount |
| --- | --- |
| Film property-imparting polymer (a-1) obtained in Preparation example 1 | 131.58 parts by weight (60 parts by weight calculated on solid component) |
| Polyethylene glycol dimethacrylate (the average number of ethylene oxides: 4) | 40 parts by weight |
| Benzophenone | 5 parts by weight |
| N,N'-Tetraethyl-4,4'-diaminobenzophenone | 0.1 part by weight |
| $(Y,Gd)BO_3$:Eu | 140 parts by weight |
| Binding agent (a low melting point glass) | 3 parts by weight |
| Methyl ethyl ketone | 30 parts by weight |

Preparation Example 6
<Preparation of Solution (A-2) for Phosphor-containing photosensitive resin composition layer (A)>

Materials shown in Table 4 were mixed for 15 minutes by using a stirring machine to prepare Solution (A-2) for Phosphor-containing photosensitive resin composition layer (A).

TABLE 4

| Material | Formulation amount |
| --- | --- |
| Film property-imparting polymer (a-1) obtained in Preparation example 1 | 131.58 parts by weight (60 parts by weight calculated on solid component) |
| Polyethylene glycol dimethacrylate (the average number of ethylene oxides: 4) | 40 parts by weight |
| 2-Benzyl-2-dimethylamino-1-(4-morpholinophenyl)-butanone-1 | 1 part by weight |
| $(Y,Gd)BO_3$:Eu | 140 parts by weight |
| Binding agent (a low melting point glass) | 3 parts by weight |
| Methyl ethyl ketone | 30 parts by weight |

Preparation Example 7
<Preparation of Solution (A-3) for Phosphor-containing photosensitive resin composition layer (A)>

Materials shown in Table 5 were mixed for 15 minutes by using a stirring machine to prepare Solution (A-3) for Phosphor-containing photosensitive resin composition layer (A).

TABLE 5

| Material | Formulation amount |
| --- | --- |
| Film property-imparting polymer (a-1) obtained in Preparation example 1 | 131.58 parts by weight (60 parts by weight calculated on solid component) |
| Polyethylene glycol dimethacrylate (the average number of ethylene oxides: 4) | 40 parts by weight |
| Benzophenone | 5 parts by weight |
| N,N'-Tetraethyl-4,4'-diaminobenzophenone | 0.1 part by weight |
| $BaMgAl_{14}O_{23}$:$Eu^{2+}$ | 140 parts by weight |
| Binding agent (a low melting point glass) | 3 parts by weight |
| Methyl ethyl ketone | 30 parts by weight |

Preparation Example 8
<Preparation of Solution (A-4) for Phosphor-containing photosensitive resin composition layer (A)>

Materials shown in Table 6 were mixed for 15 minutes by using a stirring machine to prepare Solution (A-4) for Phosphor-containing photosensitive resin composition layer (A).

TABLE 6

| Material | Formulation amount |
| --- | --- |
| Film property-imparting polymer (a-1) obtained in Preparation example 1 | 131.58 parts by weight (60 parts by weight calculated on solid component) |
| Polyethylene glycol dimethacrylate (the average number of ethylene oxides: 4) | 40 parts by weight |
| Benzophenone | 5 parts by weight |
| N,N'-Tetraethyl-4,4'-diaminobenzophenone | 0.1 part by weight |
| $Zn_2SiO_4$:Mn | 140 parts by weight |
| Binding agent (a low melting point glass) | 3 parts by weight |
| Methyl ethyl ketone | 30 parts by weight |

Preparation Example 9
<Preparation of Solution (A-5) for Phosphor-containing photosensitive resin composition layer (A)>

Materials shown in Table 7 were mixed for 15 minutes by using a stirring machine to prepare Solution (A-5) for Phosphor-containing photosensitive resin composition layer (A).

TABLE 7

| Material | Formulation amount |
| --- | --- |
| Film property-imparting polymer (a-2) obtained in Preparation example 2 | 131.58 parts by weight (60 parts by weight calculated on solid component) |
| Polyethylene glycol dimethacrylate (the average number of ethylene oxides: 4) | 40 parts by weight |
| Benzophenone | 5 parts by weight |
| N,N'-Tetraethyl-4,4'-diaminobenzophenone | 0.1 part by weight |
| $(Y,Gd)BO_3$:Eu | 140 parts by weight |
| Binding agent (a low melting point glass) | 3 parts by weight |
| Methyl ethyl ketone | 30 parts by weight |

Preparation Example 10
<Preparation of Solution (A-6) for Phosphor-containing photosensitive resin composition layer (A)>

Materials shown in Table 8 were mixed for 15 minutes by using a stirring machine to prepare Solution (A-6) for Phosphor-containing photosensitive resin composition layer (A).

TABLE 8

| Material | Formulation amount |
| --- | --- |
| Film property-imparting polymer (a-2) obtained in Preparation example 2 | 131.58 parts by weight (60 parts by weight calculated on solid component) |
| Polypropylene glycol dimethacrylate (the average number of propylene oxides: 12) | 40 parts by weight |
| 2-Benzyl-2-dimethylamino-1-(4-morpholinophenyl)-butanone-1 | 1 part by weight |
| (Y,Gd)BO$_3$:Eu | 210 parts by weight |
| Binding agent (a low melting point glass) | 3 parts by weight |
| Methyl ethyl ketone | 30 parts by weight |

Preparation Example 11
<Preparation of Solution (A-7) for Phosphor-containing photosensitive resin composition layer (A)>

Materials shown in Table 9 were mixed for 15 minutes by using a stirring machine to prepare Solution (A-7) for Phosphor-containing photosensitive resin composition layer (A).

TABLE 9

| Material | Formulation amount |
| --- | --- |
| Film property-imparting polymer (a-2) obtained in Preparation example 2 | 131.58 parts by weight (60 parts by weight calculated on solid component) |
| Polypropylene glycol dimethacrylate (the average number of propylene oxides: 12) | 40 parts by weight |
| 2-Benzyl-2-dimethylamino-1-(4-morpholinophenyl)-butanone-1 | 1 part by weight |
| BaMgAl$_{14}$O$_{23}$:Eu$^{2+}$ | 160 parts by weight |
| Binding agent (a low melting point glass) | 3 parts by weight |
| Methyl ethyl ketone | 30 parts by weight |

Preparation Example 12
<Preparation of Solution (A-8) for Phosphor-containing photosensitive resin composition layer (A)>

Materials shown in Table 10 were mixed for 15 minutes by using a stirring machine to prepare Solution (A-8) for Phosphor-containing photosensitive resin composition layer (A).

TABLE 10

| Material | Formulation amount |
| --- | --- |
| Film property-imparting polymer (a-2) obtained in Preparation example 2 | 131.58 parts by weight (60 parts by weight calculated on solid component) |
| Polypropylene glycol dimethacrylate (the average number of propylene oxides: 12) | 40 parts by weight |
| 2-Benzyl-2-dimethylamino-1-(4-morpholinophenyl)-butanone-1 | 1 part by weight |
| Zn$_2$SiO$_4$:Mn | 180 parts by weight |
| Binding agent (a low melting point glass) | 3 parts by weight |
| Methyl ethyl ketone | 30 parts by weight |

Preparation Example 13
<Preparation of Solution (A-9) for Phosphor-containing photosensitive resin composition layer (A)>

Materials shown in Table 11 were mixed for 15 minutes by using a stirring machine to prepare Solution (A-9) for Phosphor-containing photosensitive resin composition layer (A).

TABLE 11

| Material | Formulation amount |
| --- | --- |
| Film property-imparting polymer (a-3) obtained in Preparation example 3 | 131.58 parts by weight (60 parts by weight calculated on solid component) |
| Polyethylene glycol dimethacrylate (the average number of ethylene oxides: 4) | 40 parts by weight |
| Benzophenone | 5 parts by weight |
| N,N'-Tetraethyl-4,4'-diaminobenzophenone | 0.1 part by weight |
| (Y,Gd)BO$_3$:Eu | 140 parts by weight |
| Binding agent (a low melting point glass) | 3 parts by weight |
| Methyl ethyl ketone | 30 parts by weight |

Preparation Example 14
<Preparation of Solution (A-10) for Phosphor-containing photosensitive resin composition layer (A)>

Materials shown in Table 12 were mixed for 15 minutes by using a stirring machine to prepare Solution (A-10) for Phosphor-containing photosensitive resin composition layer (A).

TABLE 12

| Material | Formulation amount |
| --- | --- |
| Film property-imparting polymer (b-1) obtained in Preparation example 4 | 195.49 parts by weight (65 parts by weight calculated on solid component) |
| Tetraethylene glycol diacetate | 35 parts by weight |
| 2-Benzyl-2-dimethylamino-1-(4-morpholinophenyl)-butanone-1 | 1 part by weight |
| (Y,Gd)BO$_3$:Eu | 140 parts by weight |
| Binding agent (a low melting point glass) | 3 parts by weight |
| Methyl ethyl ketone | 30 parts by weight |

Preparation Example 15
<Preparation of Solution (A-11) for Phosphor-containing photosensitive resin composition layer (A)>

Materials shown in Table 13 were mixed for 15 minutes by using a stirring machine to prepare Solution (A-11) for Phosphor-containing photosensitive resin composition layer (A).

TABLE 13

| Material | Formulation amount |
| --- | --- |
| Film property-imparting polymer (b-1) obtained in Preparation example 4 | 195.49 parts by weight (65 parts by weight calculated on solid component) |
| Methoxyhexaethylene glycol methacrylate | 35 parts by weight |
| 2-Benzyl-2-dimethylamino-1-(4-morpholinophenyl)-butanone-1 | 1 part by weight |
| (Y,Gd)BO$_3$:Eu | 200 parts by weight |
| Binding agent (a low melting point glass) | 3 parts by weight |
| Methyl ethyl ketone | 30 parts by weight |

Preparation Example 16

<Preparation of Solution (A-12) for Phosphor-containing photosensitive resin composition layer (A)>

Materials shown in Table 14 were mixed for 15 minutes by using a stirring machine to prepare Solution (A-12) for Phosphor-containing photosensitive resin composition layer (A).

TABLE 14

| Material | Formulation amount |
| --- | --- |
| Film property-imparting polymer (a-1) obtained in Preparation example 1 | 19.74 parts by weight (9 parts by weight calculated on solid component) |
| Polyethylene glycol dimethacrylate (the average number of ethylene oxides: 4) | 91 parts by weight |
| Benzophenone | 5 parts by weight |
| N,N'-Tetraethyl-4,4'-diaminobenzophenone | 0.1 part by weight |
| (Y,Gd)BO$_3$:Eu | 140 parts by weight |
| Binding agent (a low melting point glass) | 3 parts by weight |
| Methyl ethyl ketone | 30 parts by weight |

Preparation Example 17

<Preparation of Solution (B-1) for Thermoplastic resin layer (B)>

Materials shown in Table 15 were formulated to prepare Solution (B-1) for Thermoplastic resin layer (B).

TABLE 15

| Material | Formulation amount |
| --- | --- |
| Polyvinyl alcohol PVA205 (trade name, produced by Kraray Co., hydrolysis rate: 80%) | 17.3 parts by weight |
| Distilled water | 28 parts by weight |

Preparation Example 18

<Preparation of Solution (B-2) for Thermoplastic resin layer (B)>

Materials shown in Table 16 were formulated to prepare Solution (B-2) for Thermoplastic resin layer (B).

TABLE 16

| Material | Formulation amount |
| --- | --- |
| Film property-imparting polymer (a-1) obtained in Preparation example 1 | 142.54 parts by weight (65 parts by weight calculated on solid component) |
| Polyethylene glycol (weight average molecular weight: about 600) | 35 parts by weight |
| Methyl ethyl ketone | 30 parts by weight |

Preparation Example 19

<Preparation of Solution (B-3) for Thermoplastic resin layer (B)>

Materials shown in Table 17 were formulated to prepare Solution (B-3) for Thermoplastic resin layer (B).

TABLE 17

| Material | Formulation amount |
| --- | --- |
| Film property-imparting polymer (a-1) obtained in Preparation example 1 | 131.58 parts by weight (60 parts by weight calculated on solid component) |
| Polyethylene glycol dimethacrylate (the average number of ethylene oxides: 12) | 40 parts by weight |
| Benzophenone | 5 parts by weight |
| N,N'-Tetraethyl-4,4'-diaminobenzophenone | 0.1 part by weight |
| Methyl ethyl ketone | 30 parts by weight |

Preparation Example 20

<Preparation of Solution (C-1) for Embedding layer (C)>

Materials shown in Table 18 were formulated to prepare Solution (C-1) for Embedding layer (C).

TABLE 18

| Material | Formulation amount |
| --- | --- |
| Poly(ethylene/ethyl acrylate) (a copolymer of ethylene/ethyl acrylate = 65/35 (parts by weight) | 20 parts by weight |
| Toluene | 80 parts by weight |

Preparation Example 21

<Preparation of Solution (A-13) for Phosphor-containing photosensitive resin composition layer (A)>

Materials shown in Table 19 were mixed for 15 minutes by using a stirring machine to prepare Solution (A-13) for Phosphor-containing photosensitive resin composition layer (A).

TABLE 19

| Material | Formulation amount |
| --- | --- |
| Methyl polymethacrylate | 60 parts by weight |
| Polypropylene glycol dimethacrylate (the average number of propylene oxides: 12) | 40 parts by weight |
| 2-Benzyl-2-dimethylamino-1-(4-morpholinophenyl)-butanone-1 | 1 part by weight |
| (Y,Gd)BO$_3$:Eu | 160 parts by weight |
| Binding agent (a low melting point glass) | 3 parts by weight |
| Methyl ethyl ketone | 30 parts by weight |

(Preparations of photosensitive elements)

Example 1

Solution (A-1) obtained in Preparation example 5 was coated uniformly on a polyethylene terephthalate film having a thickness of 20 μm and dried for 10 minutes by a hot air convection type dryer at 80 to 110° C., and the solvent was removed to form a phosphor-containing photosensitive resin composition layer (A). The thickness after drying of the phosphor-containing photosensitive resin composition layer (A) obtained was 60 μm.

Then, on the phosphor-containing photosensitive resin composition layer (A), a polyethylene film having a thickness of 25 μm was pasted as a cover film to prepare Photosensitive element (i) including the phosphor-containing photosensitive resin composition layer (A).

The edge fusion property of Photosensitive element (i) obtained was evaluated by the following method, and the results are shown in Table 20.

(Edge fusion property)

90 m of Photosensitive element (i) wound in a roll state was stored at a temperature of 23° C. and a relative humidity of 60%, and the state of exudation of the photosensitive layer from the side face of a roll was evaluated visually with naked eyes for 6 months. The standard of evaluation is shown below.

O: edge fusion property is good (there is no exudation of the photosensitive layer even after 6 months)

X: edge fusion property is bad (exudation of the photosensitive layer occurs within 6 months)

Example 2

In the same manner as in Example 1 except for changing Solution (A-1) for Phosphor-containing photosensitive resin composition layer (A) obtained in Preparation example 5 to Solution (A-2) for Phosphor-containing photosensitive resin composition layer (A) obtained in Preparation example 6, Photosensitive element (ii) was prepared. The thickness of the phosphor-containing photosensitive resin composition layer (A) of Photosensitive element (ii) was 60 μm.

The edge fusion property of Photosensitive element (ii) obtained was evaluated in the same manner as in Example 1, and the results are shown in Table 20.

Example 3

In the same manner as in Example 1 except for changing Solution (A-1) for Phosphor-containing photosensitive resin composition layer (A) obtained in Preparation example 5 to Solution (A-3) for Phosphor-containing photosensitive resin composition layer (A) obtained in Preparation example 7, Photosensitive element (iii) was prepared. The thickness of the phosphor-containing photosensitive resin composition layer (A) of Photosensitive element (iii) was 60 μm.

The edge fusion property of Photosensitive element (iii) obtained was evaluated in the same manner as in Example 1, and the results are shown in Table 20.

Example 4

In the same manner as in Example 1 except for changing Solution (A-1) for Phosphor-containing photosensitive resin composition layer (A) obtained in Preparation example 5 to Solution (A-4) for Phosphor-containing photosensitive resin composition layer (A) obtained in Preparation example 8, Photosensitive element (iv) was prepared. The thickness of the phosphor-containing photosensitive resin composition layer (A) of Photosensitive element (iv) was 60 μm.

The edge fusion property of Photosensitive element (iv) obtained was evaluated in the same manner as in Example 1, and the results are shown in Table 20.

Example 5

In the same manner as in Example 1 except for changing Solution (A-1) for Phosphor-containing photosensitive resin composition layer (A) obtained in Preparation example 5 to Solution (A-5) for Phosphor-containing photosensitive resin composition layer (A) obtained in Preparation example 9, Photosensitive element (v) was prepared. The thickness of the phosphor-containing photosensitive resin composition layer (A) of Photosensitive element (v) was 60 μm.

The edge fusion property of Photosensitive element (v) obtained was evaluated in the same manner as in Example 1, and the results are shown in Table 20.

Example 6

In the same manner as in Example 1 except for changing Solution (A-1) for Phosphor-containing photosensitive resin composition layer (A) obtained in Preparation example 5 to Solution (A-6) for Phosphor-containing photosensitive resin composition layer (A) obtained in Preparation example 10, Photosensitive element (vi) was prepared. The thickness of the phosphor-containing photosensitive resin composition layer (A) of Photosensitive element (vi) was 60 μm.

The edge fusion property of Photosensitive element (vi) obtained was evaluated in the same manner as in Example 1, and the results are shown in Table 20.

Example 7

In the same manner as in Example 1 except for changing Solution (A-1) for Phosphor-containing photosensitive resin composition layer (A) obtained in Preparation example 5 to Solution (A-7) for Phosphor-containing photosensitive resin composition layer (A) obtained in Preparation example 11, Photosensitive element (vii) was prepared. The thickness of the phosphor-containing photosensitive resin composition layer (A) of Photosensitive element (vii) was 60 μm.

The edge fusion property of Photosensitive element (vii) obtained was evaluated in the same manner as in Example 1, and the results are shown in Table 20.

Example 8

In the same manner as in Example 1 except for changing Solution (A-1) for Phosphor-containing photosensitive resin composition layer (A) obtained in Preparation example 5 to Solution (A-8) for Phosphor-containing photosensitive resin composition layer (A) obtained in Preparation example 12, Photosensitive element (viii) was prepared. The thickness of the phosphor-containing photosensitive resin composition layer (A) of Photosensitive element (viii) was 60 μm.

The edge fusion property of Photosensitive element (viii) obtained was evaluated in the same manner as in Example 1, and the results are shown in Table 20.

Example 9

In the same manner as in Example 1 except for changing Solution (A-1) for Phosphor-containing photosensitive resin composition layer (A) obtained in Preparation example 5 to Solution (A-9) for Phosphor-containing photosensitive resin composition layer (A) obtained in Preparation example 13, Photosensitive element (ix) was prepared. The thickness of the phosphor-containing photosensitive resin composition layer (A) of Photosensitive element (ix) was 60 μm.

The edge fusion property of Photosensitive element (ix) obtained was evaluated in the same manner as in Example 1, and the results are shown in Table 20.

Example 10

In the same manner as in Example 1 except for changing Solution (A-1) for Phosphor-containing photosensitive resin composition layer (A) obtained in Preparation example 5 to Solution (A-10) for Phosphor-containing photosensitive resin composition layer (A) obtained in Preparation example 14, Photosensitive element (x) was prepared. The thickness of the phosphor-containing photosensitive resin composition layer (A) of Photosensitive element (x) was 60 μm.

The edge fusion property of Photosensitive element (x) obtained was evaluated in the same manner as in Example 1, and the results are shown in Table 20.

Example 11

In the same manner as in Example 1 except for changing Solution (A-1) for Phosphor-containing photosensitive resin composition layer (A) obtained in Preparation example 5 to Solution (A-11) for Phosphor-containing photosensitive resin composition layer (A) obtained in Preparation example 15, Photosensitive element (xi) was prepared. The thickness of the phosphor-containing photosensitive resin composition layer (A) of Photosensitive element (xi) was 60 $\mu$m.

The edge fusion property of Photosensitive element (xi) obtained was evaluated in the same manner as in Example 1, and the results are shown in Table 20.

Example 12

In the same manner as in Example 1 except for changing Solution (A-1) for Phosphor-containing photosensitive resin composition layer (A) obtained in Preparation example 5 to Solution (B-1) for Thermoplastic resin layer (B) obtained in Preparation example 17, Film (xii) including the thermoplastic resin layer (B) was prepared. The thickness of the thermoplastic resin layer (B) of Film (xii) including the thermoplastic resin layer (B) was 70 $\mu$m.

The edge fusion property of Film (xii) including the thermoplastic resin layer (B) obtained was evaluated in the same manner as in Example 1, and the results are shown in Table 20.

Example 13

In the same manner as in Example 1 except for changing Solution (A-1) for Phosphor-containing photosensitive resin composition layer (A) obtained in Preparation example 5 to Solution (B-2) for Thermoplastic resin layer (B) obtained in Preparation example 18, Film (xiii) including the thermoplastic resin layer (B) was prepared. The thickness of the thermoplastic resin layer (B) of Film (xiii) including the thermoplastic resin layer (B) was 70 $\mu$m.

The edge fusion property of Film (xiii) including the thermoplastic resin layer (B) obtained was evaluated in the same manner as in Example 1, and the results are shown in Table 20.

Example 14

In the same manner as in Example 1 except for changing Solution (A-1) for Phosphor-containing photosensitive resin composition layer (A) obtained in Preparation example 5 to Solution (B-3) for Thermoplastic resin layer (B) obtained in Preparation example 19, Film (xiv) including the thermoplastic resin layer (B) was prepared. The thickness of the thermoplastic resin layer (B) of Film (xiv) including the thermoplastic resin layer (B) was 70 $\mu$m.

The edge fusion property of Film (xiv) including the thermoplastic resin layer (B) obtained was evaluated in the same manner as in Example 1, and the results are shown in Table 20.

Example 15

In the same manner as in Example 1 except for changing Solution (A-1) for Phosphor-containing photosensitive resin composition layer (A) obtained in Preparation example 5 to Solution (C-1) for Embedding layer (C) obtained in Preparation example 20, Film (xv) including the embedding layer (C) was prepared. The thickness of the embedding layer (C) of Film (xv) including the embedding layer (C) was 34 $\mu$m.

The edge fusion property of Film (xv) including the embedding layer (C) obtained was evaluated in the same manner as in Example 1, and the results are shown in Table 20.

Example 16

Solution (B-1) for Thermoplastic resin layer (B) obtained in Preparation example 17 was coated uniformly on a polyethylene terephthalate film having a thickness of 20 $\mu$m and dried for 10 minutes by a hot air convection type dryer at 80 to 110° C., and distilled water was removed to form a thermoplastic resin layer (B). The thickness after drying of the thermoplastic resin layer (B) obtained was 70 $\mu$m.

Then, Solution (A-1) for Phosphor-containing photosensitive resin composition layer (A) obtained in Preparation example was coated uniformly on the thermoplastic resin layer (B) and dried for 10 minutes by a hot air convection type dryer at 80 to 110° C., and the solvent was removed to form a phosphor-containing photosensitive resin composition layer (A). The thickness of the phosphor-containing photosensitive resin composition layer (A) obtained was 60 $\mu$m.

Then, on the phosphor-containing photosensitive resin composition layer (A), a polyethylene film having a thickness of 25 $\mu$m was pasted as a cover film to prepare Photosensitive element (xvi).

The edge fusion property of Photosensitive element (xvi) obtained was evaluated in the same manner as in Example 1, and the results are shown in Table 20.

Example 17

In the same manner as in Example 16 except for changing Solution (B-1) for Thermoplastic resin layer (B) obtained in Preparation example 17 to Solution (B-2) for Thermoplastic resin layer (B) obtained in Preparation example 18, Photosensitive element (xvii) was prepared. The thickness after drying of the thermoplastic resin layer (B) of Photosensitive element (xvii) was 70 $\mu$m, and the thickness of the phosphor-containing photosensitive resin composition layer (A) was 60 $\mu$m.

The edge fusion property of Photosensitive element (xvii) obtained was evaluated in the same manner as in Example 1, and the results are shown in Table 20.

Example 18

In the same manner as in Example 16 except for changing Solution (B-1) for Thermoplastic resin layer (B) obtained in Preparation example 17 to Solution (B-3) for Thermoplastic resin layer (B) obtained in Preparation example 19, Photosensitive element (xviii) was prepared. The thickness after drying of the thermoplastic resin layer (B) of Photosensitive element (xviii) was 70 $\mu$m, and the thickness of the phosphor-containing photosensitive resin composition layer (A) was 60 $\mu$m.

The edge fusion property of Photosensitive element (xviii) obtained was evaluated in the same manner as in Example 1, and the results are shown in Table 20.

Example 19

In the same manner as in Example 16 except for changing Solution (A-1) for Phosphor-containing photosensitive resin composition layer (A) obtained in Preparation example 5 to Solution (A-7) for Phosphor-containing photosensitive resin composition layer (A) obtained in Preparation example 11 and changing Solution (B-1) for Thermoplastic resin layer (B) obtained in Preparation example 17 to Solution (B-2) for Thermoplastic resin layer (B) obtained in Preparation example 18, Photosensitive element (xix) was prepared. The thickness after drying of the thermoplastic resin layer (B) of Photosensitive element (xix) was 70 μm, and the thickness of the phosphor-containing photosensitive resin composition layer (A) was 60 μm.

The edge fusion property of Photosensitive element (xix) obtained was evaluated in the same manner as in Example 1, and the results are shown in Table 20.

Example 20

In the same manner as in Example 16 except for changing Solution (A-1) for Phosphor-containing photosensitive resin composition layer (A) obtained in Preparation example 5 to Solution (A-8) for Phosphor-containing photosensitive resin composition layer (A) obtained in Preparation example 12 and changing Solution (B-1) for Thermoplastic resin layer (B) obtained in Preparation example 17 to Solution (B-2) for Thermoplastic resin layer (B) obtained in Preparation example 18, Photosensitive element (xx) was prepared. The thickness after drying of the thermoplastic resin layer (B) of Photosensitive element (xx) was 70 μm, and the thickness of the phosphor-containing photosensitive resin composition layer (A) was 60 μm.

The edge fusion property of Photosensitive element (xx) obtained was evaluated in the same manner as in Example 1, and the results are shown in Table 20.

Example 21

In the same manner as in Example 16 except for changing Solution (A-1) for Phosphor-containing photosensitive resin composition layer (A) obtained in Preparation example 5 to Solution (A-9) for Phosphor-containing photosensitive resin composition layer (A) obtained in Preparation example 13 and changing Solution (B-1) for Thermoplastic resin layer (B) obtained in Preparation example 17 to Solution (B-2) for Thermoplastic resin layer (B) obtained in Preparation example 18, Photosensitive element (xxi) was prepared. The thickness after drying of the thermoplastic resin layer (B) of Photosensitive element (xxi) was 70 μm, and the thickness of the phosphor-containing photosensitive resin composition layer (A) was 60 μm.

The edge fusion property of Photosensitive element (xxi) obtained was evaluated in the same manner as in Example 1, and the results are shown in Table 20.

Example 22

In the same manner as in Example 16, Photosensitive element (xxii) having a thickness after drying of the thermoplastic resin layer (B) being 43 μm was prepared. The thickness of the phosphor-containing photosensitive resin composition layer (A) of Photosensitive element (xxii) was 60 μm which was the same as in Example 1.

The edge fusion property of Photosensitive element (xxii) obtained was evaluated in the same manner as in Example 1, and the results are shown in Table 20.

Example 23

In the same manner as in Example 16 except for changing Solution (B-1) for Thermoplastic resin layer (B) obtained in Preparation example 17 to Solution (C-1) for Embedding layer (C) obtained in Preparation example 20, Photosensitive element (xxiii) was prepared. The thickness after drying of the embedding layer (C) of Photosensitive element (xxiii) was 70 μm, and the thickness of the phosphor-containing photosensitive resin composition layer (A) was 60 μm.

The edge fusion property of Photosensitive element (xxiii) obtained was evaluated in the same manner as in Example 1, and the results are shown in Table 20.

Example 24

In the same manner as in Example 1 except for changing Solution (A-1) for Phosphor-containing photosensitive resin composition layer (A) obtained in Preparation example 5 to Solution (A-13) for Phosphor-containing photosensitive resin composition layer (A) obtained in Preparation example 21, Photosensitive element (xxvii) was prepared. The thickness of the phosphor-containing photosensitive resin composition layer (A) of Photosensitive element (xxvii) was 60 μm.

The edge fusion property of Photosensitive element (xxvii) obtained was evaluated in the same manner as in Example 1, and the results are shown in Table 20.

Example 25

In the same manner as in Example 16 except for changing Solution (A-1) for Phosphor-containing photosensitive resin composition layer (A) obtained in Preparation example 5 to Solution (A-3) for Phosphor-containing photosensitive resin composition layer (A) obtained in Preparation example 7 and changing Solution (B-1) for Thermoplastic resin layer (B) obtained in Preparation example 17 to Solution (C-1) for Embedding layer (C) obtained in Preparation example 20, Photosensitive element (xxviii) was prepared. The thickness after drying of the embedding layer (C) of Photosensitive element (xxviii) was 70 μm, and the thickness of the phosphor-containing photosensitive resin composition layer (A) was 60 μm.

The edge fusion property of Photosensitive element (xxviii) obtained was evaluated in the same manner as in Example 1, and the results are shown in Table 20.

Example 26

In the same manner as in Example 16 except for changing Solution (A-1) for Phosphor-containing photosensitive resin composition layer (A) obtained in Preparation example 5 to Solution (A-4) for Phosphor-containing photosensitive resin composition layer (A) obtained in Preparation example 8 and changing Solution (B-1) for Thermoplastic resin layer (B) obtained in Preparation example 17 to Solution (C-1) for Embedding layer (C) obtained in Preparation example 20, Photosensitive element (xxix) was prepared. The thickness after drying of the embedding layer (C) of Photosensitive element (xxix) was 70 μm, and the thickness of the phosphor-containing photosensitive resin composition layer (A) was 60 μm.

The edge fusion property of Photosensitive element (xxix) obtained was evaluated in the same manner as in Example 1, and the results are shown in Table 20.

Comparative Example 1

In the same manner as in Example 1 except for changing Solution (A-1) for Phosphor-containing photosensitive resin composition layer (A) obtained in Preparation example 5 to Solution (A-12) for Phosphor-containing photosensitive resin composition layer (A) obtained in Preparation example 16, Photosensitive element (xxiv) was prepared. The thickness of the phosphor-containing photosensitive resin composition layer (A) of Photosensitive element (xxiv) was 60 μm.

The edge fusion property of Photosensitive element (xxiv) obtained was evaluated in the same manner as in Example 1, and the results are shown in Table 20.

TABLE 20

| | Photosensitive element or film | Solution for Phosphor-containing photosensitive resin composition layer (A) | Solution for Thermoplastic resin layer (B) | Solution for Embedding layer (C) | Edge fusion property |
|---|---|---|---|---|---|
| Example 1 | (i) | (A-1) | — | — | o |
| Example 2 | (ii) | (A-2) | — | — | o |
| Example 3 | (iii) | (A-3) | — | — | o |
| Example 4 | (iv) | (A-4) | — | — | o |
| Example 5 | (v) | (A-5) | — | — | o |
| Example 6 | (vi) | (A-6) | — | — | o |
| Example 7 | (vii) | (A-7) | — | — | o |
| Example 8 | (viii) | (A-8) | — | — | o |
| Example 9 | (ix) | (A-9) | — | — | o |
| Example 10 | (x) | (A-10) | — | — | o |
| Example 11 | (xi) | (A-11) | — | — | o |
| Example 12 | (xii) | — | (B-1) | — | o |
| Example 13 | (xiii) | — | (B-2) | — | o |
| Example 14 | (xiv) | — | (B-3) | — | o |
| Example 15 | (xv) | — | — | (C-1) | o |
| Example 16 | (xvi) | (A-1) | (B-1) | — | o |
| Example 17 | (xvii) | (A-1) | (B-2) | — | o |
| Example 18 | (xviii) | (A-1) | (B-3) | — | o |
| Example 19 | (xix) | (A-7) | (B-2) | — | o |
| Example 20 | (xx) | (A-8) | (B-2) | — | o |
| Example 21 | (xxi) | (A-9) | (B-2) | — | o |
| Example 22 | (xxii) | (A-1) | (B-1) | — | o |
| Example 23 | (xxiii) | (A-1) | — | (C-1) | o |
| Example 24 | (xxvii) | (A-13) | — | — | o |
| Example 25 | (xxviii) | (A-3) | — | (C-1) | o |
| Example 26 | (xxix) | (A-4) | — | (C-1) | o |
| Comparative example 1 | (xxiv) | (A-12) | — | — | x |

(Preparations of phosphor patterns)

Example 27

<(Ia) Step of heating and pressurizing the thermoplastic resin layer (B) in a state that the thermoplastic resin layer (B) is superposed on the phosphor-containing photosensitive resin composition layer (A) on an uneven surface of a substrate having unevenness, to laminate the phosphor-containing photosensitive resin composition layer (A) and the thermoplastic resin layer (B) on the uneven surface>

At a side on which a barrier rib (a striped barrier rib, opening width of barrier rib: 150 μm, width of barrier rib: 70 μm, height of barrier rib: 150 μm) was formed, of a substrate for PDP, Photosensitive element (i) including the phosphor-containing photosensitive resin composition layer (A) obtained in Example 1 was laminated by using a vacuum laminator (trade name: VLM-1 Model, produced by Hitachi Chemical Co., Ltd.) at a heat shoe temperature of 30° C. and a lamination rate of 1.5 m/min under an atmospheric pressure of 4,000 Pa or less and a contact bonding pressure (cylinder pressure) of $5 \times 10^4$ Pa (since a substrate having a thickness of 3 mm, a length of 10 cm and a width of 10 cm (a square) was used, line pressure at this time was $2.4 \times 10^3$ N/m) while the polyethylene film of Photosensitive element (i) was peeled off.

Then, the polyethylene terephthalate film of Photosensitive element (i) including the phosphor-containing photosensitive resin composition layer (A) was peeled off. On the phosphor-containing photosensitive resin composition layer (A), Film (xii) including the thermoplastic resin layer (B) obtained in Example 12 was laminated by using a laminator (trade name: HLM-3000 Model, produced by Hitachi Chemical Co., Ltd.) at a lamination temperature of 110° C. and a lamination rate of 0.5 m/min under a contact bonding pressure (cylinder pressure) of $4 \times 10^5$ Pa (since a substrate having a thickness of 3 mm, a length of 10 cm and a width of 10 cm (a square) was used, line pressure at this time was $9.8 \times 10^3$ N/m) while the polyethylene film of Film (xii) was peeled off.

<(IIa) Step of irradiating the phosphor-containing photosensitive resin composition layer (A) and/or the thermoplastic resin layer (B) imagewisely with active light>

Then, a photomask for testing was adhered to the polyethylene terephthalate film of Film (xii) including the thermoplastic resin layer (B), and 100 mJ/cm$^2$ of active light was irradiated imagewisely by using a HMW-590 Model exposer (trade name) produced by Orc Seisakusho Co., Japan.

<(IIIa) Step of removing unnecessary portions from the phosphor-containing photosensitive resin composition layer (A) and/or the thermoplastic resin layer (B) by development>

Then, after irradiation of active light, the substrate was left to stand at ordinary temperature for 1 hour and then subjected to spray development at 30° C. for 70 seconds by using a 1% by weight sodium carbonate aqueous solution.

After development, the substrate was dried at 80° C. for 10 minutes, and by using a Toshiba UV ray irradiation apparatus produced by Toshiba Denzai Co., Japan, 3 J/cm$^2$ of UV ray was irradiated.

<(IVa) Step of removing unnecessary components from the phosphor-containing photosensitive resin composition layer (A) and/or the thermoplastic resin layer (B) by calcination>

Then, heating treatment (calcination) was carried out at 550° C. for 30 minutes to remove unnecessary resin components, whereby a phosphor pattern was formed in the space of the substrate for PDP.

(Evaluation of phosphor pattern)

The section of the phosphor pattern obtained was observed visually by a stereoscopic microscope and SEM to evaluate the formation state of the phosphor pattern. The results are shown in Table 21. The standard of evaluation is shown below.

O: a phosphor layer is formed uniformly in the space (on the wall surface of a barrier rib and the bottom of a cell) of a substrate for PDP X: a phosphor layer is not formed uniformly in the space (on the wall surface of a barrier rib and the bottom of a cell) of a substrate for PDP Also, the phosphor pattern thickness ratio (x)/(y) of the thickness (x) of the phosphor pattern formed on the wall surface of the barrier rib at a position of 135 μm from the bottom (the bottom of the concave portion) of the substrate for PDP toward the top of the barrier rib (the top of the convex portion) to the thickness (y) of the phosphor pattern formed on the wall surface of the barrier rib at a position of 60 μm from the bottom (the bottom of the concave portion) of the substrate for PDP toward the top of the barrier rib (the top of the convex portion) was determined, and the results are shown in Table 21.

Also, in the phosphor-containing photosensitive resin composition layer (A) and the thermoplastic resin layer (B) in a region which was the same as the region where unevenness was formed on the substrate for PDP, the ratio $(V^1)/(V^2)$ of the total volume $(V^1)$ of the phosphor-containing photosensitive resin composition layer (A) and the thermoplastic resin layer (B) to the volume $(V^2)$ of the space of the concave portion of the substrate for PDP was determined, and the results are shown in Table 21.

Example 28

In the same manner as in Example 27 except for changing Film (xii) including the thermoplastic resin layer (B) to Film (xiii) including the thermoplastic resin layer (B) obtained in Example 13, a phosphor pattern was formed, the formation state of the phosphor pattern obtained was evaluated, and (x)/(y) and $(V^1)/(V^2)$ thereof were determined. The results are shown in Table 21.

Example 29

In the same manner as in Example 27 except for changing Film (xii) including the thermoplastic resin layer (B) to Film (xiv) including the thermoplastic resin layer (B) obtained in Example 14, a phosphor pattern was formed, the formation state of the phosphor pattern obtained was evaluated, and (x)/(y) and $(V^1)/(V^2)$ thereof were determined. The results are shown in Table 21.

Example 30

In the same manner as in Example 27 except for changing Photosensitive element (i) including the phosphor-containing photosensitive resin composition layer (A) to Photosensitive element (ii) including the phosphor-containing photosensitive resin composition layer (A) obtained in Example 2, a phosphor pattern was formed, the formation state of the phosphor pattern obtained was evaluated, and (x)/(y) and $(V^1)/(V^2)$ thereof were determined. The results are shown in Table 21.

Example 31

In the same manner as in Example 27 except for changing Photosensitive element (i) including the phosphor-containing photosensitive resin composition layer (A) to Photosensitive element (iii) including the phosphor-containing photosensitive resin composition layer (A) obtained in Example 3 and changing Film (xii) including the thermoplastic resin layer (B) to Film (xiv) including the thermoplastic resin layer (B) obtained in Example 14, a phosphor pattern was formed, the formation state of the phosphor pattern obtained was evaluated, and (x)/(y) and $(V^1)/(V^2)$ thereof were determined. The results are shown in Table 21.

Example 32

In the same manner as in Example 27 except for changing Photosensitive element (i) including the phosphor-containing photosensitive resin composition layer (A) to Photosensitive element (iv) including the phosphor-containing photosensitive resin composition layer (A) obtained in Example 4 and changing Film (xii) including the thermoplastic resin layer (B) to Film (xiv) including the thermoplastic resin layer (B) obtained in Example 14, a phosphor pattern was formed, the formation state of the phosphor pattern obtained was evaluated, and (x)/(y) and $(V^1)/(V^2)$ thereof were determined. The results are shown in Table 21.

Example 33

In the same manner as in Example 27 except for changing Photosensitive element (i) including the phosphor-containing photosensitive resin composition layer (A) to Photosensitive element (v) including the phosphor-containing photosensitive resin composition layer (A) obtained in Example 5, a phosphor pattern was formed, the formation state of the phosphor pattern obtained was evaluated, and (x)/(y) and $(V^1)/(V^2)$ thereof were determined. The results are shown in Table 21.

Example 34

In the same manner as in Example 27 except for changing Photosensitive element (i) including the phosphor-containing photosensitive resin composition layer (A) to Photosensitive element (v) including the phosphor-containing photosensitive resin composition layer (A) obtained in Example 5 and changing Film (xii) including the thermoplastic resin layer (B) to Film (xiii) including the thermoplastic resin layer (B) obtained in Example 13, a phosphor pattern was formed, the formation state of the phosphor pattern obtained was evaluated, and (x)/(y) and $(V^1)/(V^2)$ thereof were determined. The results are shown in Table 21.

Example 35

In the same manner as in Example 27 except for changing Photosensitive element (i) including the phosphor-containing photosensitive resin composition layer (A) to Photosensitive element (v) including the phosphor-containing photosensitive resin composition layer (A) obtained in Example 5 and changing Film (xii) including the thermoplastic resin layer (B) to Film (xiv) including the thermoplastic resin layer (B) obtained in Example 14, a phosphor pattern was formed, the formation state of the phosphor pattern obtained was evaluated, and (x)/(y) and $(V^1)/(V^2)$ thereof were determined. The results are shown in Table 21.

Example 36

In the same manner as in Example 27 except for changing Photosensitive element (i) including the phosphor-containing photosensitive resin composition layer (A) to Photosensitive element (vi) including the phosphor-containing photosensitive resin composition layer (A) obtained in Example 6, a phosphor pattern was formed, the formation state of the phosphor pattern obtained was evaluated, and (x)/(y) and $(V^1)/(V^2)$ thereof were determined. The results are shown in Table 21.

Example 37

In the same manner as in Example 27 except for changing Photosensitive element (i) including the phosphor-

Example 38

In the same manner as in Example 27 except for changing Photosensitive element (i) including the phosphor-containing photosensitive resin composition layer (A) to Photosensitive element (vii) including the phosphor-containing photosensitive resin composition layer (A) obtained in Example 7, a phosphor pattern was formed, the formation state of the phosphor pattern obtained was evaluated, and (x)/(y) and $(V^1)/(V^2)$ thereof were determined. The results are shown in Table 21.

Example 39

In the same manner as in Example 27 except for changing Photosensitive element (i) including the phosphor-containing photosensitive resin composition layer (A) to Photosensitive element (vii) including the phosphor-containing photosensitive resin composition layer (A) obtained in Example 7 and changing Film (xii) including the thermoplastic resin layer (B) to Film (xiii) including the thermoplastic resin layer (B) obtained in Example 13, a phosphor pattern was formed, the formation state of the phosphor pattern obtained was evaluated, and (x)/(y) and $(V^1)/(V^2)$ thereof were determined. The results are shown in Table 21.

Example 40

In the same manner as in Example 27 except for changing Photosensitive element (i) including the phosphor-containing photosensitive resin composition layer (A) to Photosensitive element (viii) including the phosphor-containing photosensitive resin composition layer (A) obtained in Example 8, a phosphor pattern was formed, the formation state of the phosphor pattern obtained was evaluated, and (x)/(y) and $(V^1)/(V^2)$ thereof were determined. The results are shown in Table 21.

Example 41

In the same manner as in Example 27 except for changing Photosensitive element (i) including the phosphor-containing photosensitive resin composition layer (A) to Photosensitive element (viii) including the phosphor-containing photosensitive resin composition layer (A) obtained in Example 8 and changing Film (xii) including the thermoplastic resin layer (B) to Film (xiii) including the thermoplastic resin layer (B) obtained in Example 13, a phosphor pattern was formed, the formation state of the phosphor pattern obtained was evaluated, and (x)/(y) and $(V^1)/(V^2)$ thereof were determined. The results are shown in Table 21.

Example 42

In the same manner as in Example 27 except for changing Photosensitive element (i) including the phosphor-containing photosensitive resin composition layer (A) to Photosensitive element (ix) including the phosphor-containing photosensitive resin composition layer (A) obtained in Example 9, changing Film (xii) including the thermoplastic resin layer (B) to Film (xiii) including the thermoplastic resin layer (B) obtained in Example 13 and changing<(IIIa) Step of removing unnecessary portions from the phosphor-containing photosensitive resin composition layer (A) and/or the thermoplastic resin layer (B) by development> as shown below, a phosphor pattern was formed, the formation state of the phosphor pattern obtained was evaluated, and (x)/(y) and $(V^1)/(V^2)$ thereof were determined. The results are shown in Table 21.

<(IIIa) Step of removing unnecessary portions from the phosphor-containing photosensitive resin composition layer (A) and/or the thermoplastic resin layer (B) by development>

After the substrate was developed by using a 1% by weight sodium carbonate aqueous solution, it was further developed by using an aqueous solution containing 5% by weight of borax and 20% by weight of butylcarbitol.

Example 43

In the same manner as in Example 27 except for changing Photosensitive element (i) including the phosphor-containing photosensitive resin composition layer (A) to Photosensitive element (x) including the phosphor-containing photosensitive resin composition layer (A) obtained in Example 10 and changing Film (xii) including the thermoplastic resin layer (B) to Film (xiii) including the thermoplastic resin layer (B) obtained in Example 13, a phosphor pattern was formed, the formation state of the phosphor pattern obtained was evaluated, and (x)/(y) and $(V^1)/(V^2)$ thereof were determined. The results are shown in Table 21.

Example 44

In the same manner as in Example 27 except for changing Photosensitive element (i) including the phosphor-containing photosensitive resin composition layer (A) to Photosensitive element (xi) including the phosphor-containing photosensitive resin composition layer (A) obtained in Example 11 and changing Film (xii) including the thermoplastic resin layer (B) to Film (xiii) including the thermoplastic resin layer (B) obtained in Example 13, a phosphor pattern was formed, the formation state of the phosphor pattern obtained was evaluated, and (x)/(y) and $(V^1)/(V^2)$ thereof were determined. The results are shown in Table 21.

Example 45

<(Ic) Step of heating and pressurizing the embedding layer (C) in a state that the embedding layer (C) is superposed on the phosphor-containing photosensitive resin composition layer (A) on an uneven surface of a substrate having unevenness, to laminate the phosphor-containing photosensitive resin composition layer (A) and the embedding layer (C) on the uneven surface>

At a side on which a barrier rib (a striped barrier rib, opening width of barrier rib: 140 μm, width of barrier rib: 70 μm, height of barrier rib: 140 μm) was formed, of a substrate for PDP, Photosensitive element (ii) obtained in Example 2 was laminated by using a vacuum laminator (trade name: VLM-1 Model, produced by Hitachi Chemical Co., Ltd.) at a heat shoe temperature of 30° C. and a lamination rate of 1.5 m/min under an atmospheric pressure of 4,000 Pa or less and a contact bonding pressure (cylinder pressure) of $5\times10^4$ Pa (since a substrate having a thickness of 3 mm, a length of 10 cm and a width of 10 cm (a square) was used, line pressure at this time was $2.4 \times 10^3$ N/m) while the polyethylene film of Photosensitive element (ii) was peeled off.

Then, the polyethylene terephthalate film on the surface which was not contacted with the barrier rib, of Photosensitive element (ii) was peeled off. To the phosphor-containing photosensitive resin composition layer (A), a polyethylene film (xxv) (Vicat softening point: 82 to 100° C.) having a film thickness of 100 $\mu$m which was used as an embedding layer (C) was contact bonded by using a laminator (trade name: HLM-3000 Model, produced by Hitachi Chemical Co., Ltd.) at a lamination temperature of 70° C. and a lamination rate of 0.5 m/min under a contact bonding pressure (cylinder pressure) of $4 \times 10^5$ Pa (since a substrate having a thickness of 3 mm, a length of 10 cm and a width of 10 cm (a square) was used, line pressure at this time was $9.8 \times 10^3$ N/m) to embed the phosphor-containing photosensitive resin composition layer (A) and the embedding layer (C) in a space surrounded with the wall surface of the barrier rib and the bottom of the substrate.

<(IIc) Step of peeling the embedding layer (C)>

Then, an adhesive tape was adhered to the polyethylene film (xxv) having a film thickness of 100 $\mu$m which was the embedding layer (C), and the embedding layer (C) was peeled off physically.

<(IIIc) Step of irradiating the phosphor-containing photosensitive resin composition layer (A) imagewisely with active light>

Then, a photomask for testing was adhered to the surface which was not contacted with the barrier rib, of Photosensitive element (ii), and 100 mJ/cm² of active light was irradiated imagewisely by using a HMW-590 Model exposer (trade name) produced by Orc Seisakusho Co., Japan.

<(IVc) Step of removing an unnecessary portion from the phosphor-containing photosensitive resin composition layer (A) by development>

Then, after irradiation of active light, the substrate was left to stand at ordinary temperature for 1 hour and then subjected to spray development at 30° C. for 70 seconds by using a 1% by weight sodium carbonate aqueous solution.

After development, the substrate was dried at 80° C. for 10 minutes, and by using a Toshiba UV ray irradiation apparatus produced by Toshiba Denzai Co., Japan, 3 J/cm² of UV ray was irradiated.

<(Vc) Step of removing unnecessary components from the phosphor-containing photosensitive resin composition layer (A) by calcination>

Then, heating treatment (calcination) was carried out at 550° C. for 30 minutes to remove unnecessary resin components, whereby a phosphor pattern was formed in the space of the substrate for PDP.

In the same manner as in Example 27, the formation state of the phosphor pattern obtained was evaluated, and (x)/(y) and $(V^1)/(V^2)$ thereof were determined. The results are shown in Table 21.

Example 46

In the same manner as in Example 45 except for changing the embedding layer (C) of the polyethylene film (xxv) (Vicat softening point: 82 to 100° C.) having a film thickness of 100 $\mu$m in the step (Ic) to the embedding layer (C) of a polypropylene film (xxvi) (Vicat softening point: 125 to 155° C.) having a film thickness of 100 $\mu$m, a phosphor pattern was formed. In the same manner as in Example 27, the formation state of the phosphor pattern obtained was evaluated, and (x)/(y) and $(V'^1)/(V'^2)$ thereof were determined. The results are shown in Table 21.

Example 47

In the same manner as in Example 45 except for changing the step (Ic) and the step (IIc) as shown below, a phosphor pattern was formed. In the same manner as in Example 27, the formation state of the phosphor pattern obtained was evaluated, and (x)/(y) and $(V'^1)/(V'^2)$ thereof were determined. The results are shown in Table 21.

<(Ic) Step of heating and pressurizing the embedding layer (C) in a state that the embedding layer (C) is superposed on the phosphor-containing photosensitive resin composition layer (A) on an uneven surface of a substrate having unevenness, to laminate the phosphor-containing photosensitive resin composition layer (A) and the embedding layer (C) on the uneven surface>

At a side on which a barrier rib (a striped barrier rib, opening width of barrier rib: 140 $\mu$m, width of barrier rib: 70 $\mu$m, height of barrier rib: 140 $\mu$m) was formed, of a substrate for PDP, Photosensitive element (ii) obtained in Example 2 was laminated by using a laminator (trade name: HLM-3000 Model, produced by Hitachi Chemical Co., Ltd.) at a lamination temperature of 60° C. and a lamination rate of 0.5 m/min under a contact bonding pressure (cylinder pressure) of $5 \times 10^4$ Pa (since a substrate having a thickness of 3 mm, a length of 10 cm and a width of 10 cm (a square) was used, line pressure at this time was $2.4 \times 10^3$ N/m) while the polyethylene film of Photosensitive element (ii) was peeled off.

Then, the polyethylene terephthalate film on the surface which was not contacted with the barrier rib, of Photosensitive element (ii) was peeled off. To the phosphor-containing photosensitive resin composition layer (A), Film (xv) including the embedding layer (C) having a film thickness of 34 $\mu$m obtained in Example 15 which was used as an embedding layer (C) was contact bonded with a polyethylene terephthalate film having a thickness of 20 $\mu$m being sandwiched therebetween, by using a laminator (trade name: HLM-3000 Model, produced by Hitachi Chemical Co., Ltd.) at a lamination temperature of 120° C. and a lamination rate of 0.5 m/min under a contact bonding pressure (cylinder pressure) of $4 \times 10^5$ Pa (since a substrate having a thickness of 3 mm, a length of 10 cm and a width of 10 cm (a square) was used, line pressure at this time was $9.8 \times 10^3$ N/m) to embed the phosphor-containing photosensitive resin composition layer (A) and the embedding layer (C) in a space surrounded with the wall surface of the barrier rib and the bottom of the substrate.

<(IIc) Step of peeling the embedding layer (C)>

Then, an adhesive tape was adhered to Film (xv) including the embedding layer (C) having a film thickness of 34 $\mu$m which was used as the embedding layer (C), and the embedding layer (C) was peeled off physically.

Example 48

<(Ib) Step of heating and pressurizing a photosensitive element having a support film, the thermoplastic resin layer (B) provided on the support film and the phosphor-containing photosensitive resin composition layer (A) provided thereon so that the phosphor-containing photosensitive resin composition layer (A) is contacted with an uneven surface of a substrate having unevenness, to laminate the phosphor-containing photosensitive resin composition layer (A) and the thermoplastic resin layer (B) on the uneven surface>

At a side on which a barrier rib (a striped barrier rib, opening width of barrier rib: 150 $\mu$m, width of barrier rib: 70 $\mu$m, height of barrier rib: 150 $\mu$m) was formed, of a substrate for PDP, Photosensitive element (xvi) obtained in Example 16 was laminated by using a vacuum laminator (trade name: VLM-1 Model, produced by Hitachi Chemical Co., Ltd.) at a heat shoe temperature of 110° C. and a lamination rate of 0.5 m/min under an atmospheric pressure of 4,000 Pa or less and a contact bonding pressure (cylinder pressure) of $4\times10^5$ Pa (since a substrate having a thickness of 3 mm, a length of 10 cm and a width of 10 cm (a square) was used, line pressure at this time was $9.8\times10^3$ N/m) while the polyethylene film of Photosensitive element (xvi) was peeled off.

<(IIb) Step of irradiating the phosphor-containing photosensitive resin composition layer (A) and/or the thermoplastic resin layer (B) imagewisely with active light>

Then, a photomask for testing was adhered to the polyethylene terephthalate film of Photosensitive element (xvi), and 100 mJ/cm$^2$ of active light was irradiated imagewisely by using a HMW-590 Model exposer (trade name) produced by Orc Seisakusho Co., Japan.

<(IIIb) Step of removing unnecessary portions from the phosphor-containing photosensitive resin composition layer (A) and/or the thermoplastic resin layer (B) by development>

Then, after irradiation of active light, the substrate was left to stand at ordinary temperature for 1 hour and then subjected to spray development at 30° C. for 70 seconds by using a 1% by weight sodium carbonate aqueous solution. After development, the substrate was dried at 80° C. for 10 minutes, and by using a Toshiba UV ray irradiation apparatus produced by Toshiba Denzai Co., Japan, 3 J/cm$^2$ of UV ray was irradiated.

<(IVb) Step of removing unnecessary components from the phosphor-containing photosensitive resin composition layer (A) and/or the thermoplastic resin layer (B) by calcination>

Then, heating treatment (calcination) was carried out at 550° C. for 30 minutes to remove unnecessary resin components, whereby a phosphor pattern was formed in the space of the substrate for PDP.

In the same manner as in Example 27, the formation state of the phosphor pattern obtained was evaluated, and (x)/(y) and $(V^1)/(V^2)$ thereof were determined. The results are shown in Table 21.

Example 49

In the same manner as in Example 48 except for changing Photosensitive element (xvi) obtained in Example 16 to Photosensitive element (xvii) obtained in Example 17, a phosphor pattern was formed. In the same manner as in Example 27, the formation state of the phosphor pattern obtained was evaluated, and (x)/(y) and $(V^1)/(V^2)$ thereof were determined. The results are shown in Table 21.

Example 50

In the same manner as in Example 48 except for changing Photosensitive element (xvi) obtained in Example 16 to Photosensitive element (xviii) obtained in Example 18, a phosphor pattern was formed. In the same manner as in Example 27, the formation state of the phosphor pattern obtained was evaluated, and (x)/(y) and $(V^1)/(V^2)$ thereof were determined. The results are shown in Table 21.

Example 51

In the same manner as in Example 48 except for changing Photosensitive element (xvi) obtained in Example 16 to Photosensitive element (xix) obtained in Example 19, a phosphor pattern was formed. In the same manner as in Example 27, the formation state of the phosphor pattern obtained was evaluated, and (x)/(y) and $(V^1)/(V^2)$ thereof were determined. The results are shown in Table 21.

Example 52

In the same manner as in Example 48 except for changing Photosensitive element (xvi) obtained in Example 16 to Photosensitive element (xx) obtained in Example 20, a phosphor pattern was formed. In the same manner as in Example 27, the formation state of the phosphor pattern obtained was evaluated, and (x)/(y) and $(V^1)/(V^2)$ thereof were determined. The results are shown in Table 21.

Example 53

In the same manner as in Example 48 except for changing Photosensitive element (xvi) obtained in Example 16 to Photosensitive element (xxi) obtained in Example 21 and changing <(IIIb) Step of removing unnecessary portions from the phosphor-containing photosensitive resin composition layer (A) and/or the thermoplastic resin layer (B) by development> as shown below, a phosphor pattern was formed. In the same manner as in Example 27, the formation state of the phosphor pattern obtained was evaluated, and (x)/(y) and $(V^1)/(V^2)$ thereof were determined. The results are shown in Table 21.

<(IIIb) Step of removing unnecessary portions from the phosphor-containing photosensitive resin composition layer (A) and/or the thermoplastic resin layer (B) by development>

After the substrate was developed by using a 1% by weight sodium carbonate aqueous solution, it was further developed by using an aqueous solution containing 5% by weight of borax and 20% by weight of butylcarbitol.

Example 54

In the same manner as in Example 48 except for changing <(Ib) Step of heating and pressurizing a photosensitive element having a support film, the thermoplastic resin layer (B) provided on the support film and the phosphor-containing photosensitive resin composition layer (A) provided thereon so that the phosphor-containing photosensitive resin composition layer (A) is contacted with an uneven surface of a substrate having unevenness, to laminate the phosphor-containing photosensitive resin composition layer (A) and the thermoplastic resin layer (B) on the uneven surface> as shown below, a phosphor pattern was formed. In the same manner as in Example 27, the formation state of the phosphor pattern obtained was evaluated, and (x)/(y) and $(V^1)/(V^2)$ thereof were determined. The results are shown in Table 21.

<(Ib) Step of heating and pressurizing a photosensitive element having a support film, the thermoplastic resin layer (B) provided on the support film and the phosphor-containing photosensitive resin composition layer (A) provided thereon so that the phosphor-containing photosensitive resin composition layer (A) is contacted with an uneven surface of a substrate having unevenness, to laminate the phosphor-containing photosensitive resin composition layer (A) and the thermoplastic resin layer (B) on the uneven surface>

A substrate of PDP (having a striped barrier rib, opening width of barrier rib: 150 μm, width of barrier rib: 70 μm, height of barrier rib: 150 μm) was heated by a hot plate at 80° C. for 5 minutes. Thereafter, at a side on which the barrier rib was formed, of the substrate for PDP, Photosensitive element (xxii) obtained in Example 22 was laminated by using a laminator (trade name: HLM-1500 Model, produced by Hitachi Chemical Co., Ltd.) at a lamination temperature of 110° C. and a lamination rate of 0.2 m/min under a contact bonding pressure of $4\times10^5$ Pa (since a substrate having a thickness of 3 mm, a length of 10 cm and a width of 10 cm (a square) was used, line pressure at this time was $9.8 \times 10^3$ N/m) while the polyethylene film of Photosensitive element (xxii) was peeled off.

Example 55

<(Id) Step of heating and pressurizing a photosensitive element having a support film, the embedding layer (C) provided on the support film and the phosphor-containing photosensitive resin composition layer (A) provided thereon so that the phosphor-containing photosensitive resin composition layer (A) is contacted with an uneven surface of a substrate having unevenness, to laminate the phosphor-containing photosensitive resin composition layer (A) and the embedding layer (C) on the uneven surface>

At a side on which a barrier rib (a striped barrier rib, opening width of barrier rib: 150 μm, width of barrier rib: 70 μm, height of barrier rib: 150 μm) was formed, of a substrate for PDP, Photosensitive element (xxiii) obtained in Example 23 was laminated by using a vacuum laminator (trade name: VLM-1 Model, produced by Hitachi Chemical Co., Ltd.) at a heat shoe temperature of 110° C. and a lamination rate of 0.5 m/min under an atmospheric pressure of 4,000 Pa or less and a contact bonding pressure (cylinder pressure) of $4 \times 10^5$ Pa (since a substrate having a thickness of 3 mm, a length of 10 cm and a width of 10 cm (a square) was used, line pressure at this time was $9.8 \times 10^3$ N/m) while the polyethylene film of Photosensitive element (xxiii) was peeled off.

<(IId) Step of peeling the embedding layer (C)>

Then, an adhesive tape was adhered to Photosensitive element (xxiii) including the embedding layer (C), and the embedding layer (C) was peeled off physically.

<(IIId) Step of irradiating the phosphor-containing photosensitive resin composition layer (A) imagewisely with active light>

Then, a photomask for testing was adhered to the surface which was not contacted with the barrier rib, of the phosphor-containing photosensitive resin composition layer (A) of Photosensitive element (xxiii), and 100 mJ/cm$^2$ of active light was irradiated imagewisely by using a HMW-590 Model exposer (trade name) produced by Orc Seisakusho Co., Japan.

<(IVd) Step of removing an unnecessary portion from the phosphor-containing photosensitive resin composition layer (A) by development>

Then, after irradiation of active light, the substrate was left to stand at ordinary temperature for 1 hour and then subjected to spray development at 30° C. for 70 seconds by using a 1% by weight sodium carbonate aqueous solution. After development, the substrate was dried at 80° C. for 10 minutes, and by using a Toshiba UV ray irradiation apparatus produced by Toshiba Denzai Co., Japan, 3 J/cm$^2$ of UV ray was irradiated.

<(Vd) Step of removing unnecessary components from the phosphor-containing photosensitive resin composition layer (A) by calcination>

Then, heating treatment (calcination) was carried out at 550° C. for 30 minutes to remove unnecessary resin components, whereby a phosphor pattern was formed in the space of the substrate for PDP.

In the same manner as in Example 27, the formation state of the phosphor pattern obtained was evaluated, and (x)/(y) and ($V^{v1}$)/($V^{v2}$) thereof were determined. The results are shown in Table 21.

Example 56

<(Ie) Step of pressurizing the phosphor-containing photosensitive resin composition layer (A) in a state that the phosphor-containing photosensitive resin composition layer (A) is superposed on a substrate having unevenness, to adhere the phosphor-containing photosensitive resin composition layer (A) to the inner surface of a concave portion on the substrate having unevenness>

At a side on which a barrier rib (a striped barrier rib, opening width of barrier rib: 150 μm, width of barrier rib: 70 μm, height of barrier rib: 150 μm) was formed, of a substrate for PDP, Photosensitive element (i) obtained in Example 1 was laminated by using a vacuum laminator (trade name: VLM-1 Model, produced by Hitachi Chemical Co., Ltd.) at a heat shoe temperature of 110° C. and a lamination rate of 0.5 m/min under atmospheric pressure and a contact bonding pressure (cylinder pressure) of $1 \times 10^4$ Pa (since a substrate having a thickness of 3 mm, a length of 10 cm and a width of 10 cm (a square) was used, line pressure at this time was $4.8 \times 10^2$ N/m) while the polyethylene film of Photosensitive element (i) was peeled off.

Then, the polyethylene terephthalate film on the surface which was not contacted with the barrier rib, of Photosensitive element (i) was peeled off. Pressure was applied to the surface which was not contacted with the barrier rib, by blowing hot air at a blowing rate of 20 m/s and a temperature of 80° C. entirely and uniformly for 10 minutes to adhere the phosphor-containing photosensitive resin composition layer (A) to the inner surface of the concave portion.

<(IIe) Step of irradiating the phosphor-containing photosensitive resin composition layer (A) imagewisely with active light>

Then, a photomask for testing was adhered to the surface which was not contacted with the barrier rib, of Photosensitive element (i), and 100 mJ/cm$^2$ of active light was irradiated imagewisely by using a HMW-590 Model exposer (trade name) produced by Orc Seisakusho Co., Japan.

<(IIe) Step of removing an unnecessary portion from the phosphor-containing photosensitive resin composition layer (A) by development>

Then, after irradiation of active light, the substrate was left to stand at ordinary temperature for 1 hour and then subjected to spray development at 30° C. for 70 seconds by using a 1% by weight sodium carbonate aqueous solution. After development, the substrate was dried at 80° C. for 10 minutes, and by using a Toshiba UV ray irradiation apparatus produced by Toshiba Denzai Co., Japan, 3 J/cm$^2$ of UV ray was irradiated.

<(IVe) Step of removing unnecessary components from the phosphor-containing photosensitive resin composition layer (A) by calcination>

Then, heating treatment (calcination) was carried out at 550° C. for 30 minutes to remove unnecessary resin components, whereby a phosphor pattern was formed in the space of the substrate for PDP.

In the same manner as in Example 27, the formation state of the phosphor pattern obtained was evaluated, and (x)/(y) thereof was determined. The results are shown in Table 21.

Example 57

In the same manner as in Example 56 except for changing the step (Ie) shown below, a phosphor pattern was formed. In the same manner as in Example 27, the formation state of the phosphor pattern obtained was evaluated, and (x)/(y) thereof was determined. The results are shown in Table 21.

<(Ie) Step of pressurizing the phosphor-containing photosensitive resin composition layer (A) in a state that the phosphor-containing photosensitive resin composition layer (A) is superposed on a substrate having unevenness, to adhere the phosphor-containing photosensitive resin composition layer (A) to the inner surface of a concave portion on the substrate having unevenness>

After the polyethylene film of Photosensitive element (vi) obtained in Example 6 which was cut to have a size of 150×190 mm was peeled off, Photosensitive element (vi) was superposed at a side on which a lattice-shaped barrier rib (opening width of barrier rib: 250×350 μm, width of barrier rib: 50 μm, height of barrier rib: 150 μm) was formed, of a substrate for PDP on which the barrier rib was formed in a region of 121.9×162.6 mm in the center of a glass plate having a size of 200×200×3 mm so that the phosphor-containing photosensitive resin composition layer (A) is contacted with the barrier rib and the periphery of the region where the barrier rib was formed was covered with a width of 1 cm or more of Photosensitive element (vi).

Then, the polyethylene terephthalate film existing on the phosphor-containing photosensitive resin composition layer (A) superposed on the substrate for PDP was peeled off, the substrate was placed in a vacuum dryer equipped with a heating apparatus, and pressure was reduced to 80 Pa at ordinary temperature.

Then, under a reduced pressure state, temperature was raised to 100° C. at a temperature-raising rate of 5° C./min, the substrate was maintained at 100° C. for 1 minute, and then pressure was returned to atmospheric pressure to adhere the phosphor-containing photosensitive resin composition layer (A) to the inner surface of the concave portion.

Example 58

In the same manner as in Example 56 except for using a roll having a surface made of a sponge and moving the roll in a direction parallel to the rib to apply a pressure of 2×10$^5$ Pa in terms of gauge pressure (ordinary pressure 1 atm is 0) in the step (Ie), the phosphor-containing photosensitive resin composition layer (A) was adhere to the inner surface of the concave portion, whereby a phosphor pattern was formed in the space of the substrate for PDP. In the same manner as in Example 27, the formation state of the phosphor pattern obtained was evaluated, and (x)/(y) thereof was determined. The results are shown in Table 21.

Example 59

In the same manner as in Example 28 except for changing Photosensitive element (i) including the phosphor-containing photosensitive resin composition layer (A) to Photosensitive element (xxvii) including the phosphor-containing photosensitive resin composition layer (A) obtained in Example 24 and changing <(IIIa) Step of removing unnecessary portions from the phosphor-containing photosensitive resin composition layer (A) and/or the thermoplastic resin layer (B) by development> as shown below, a phosphor pattern was formed. In the same manner as in Example 27, the formation state of the phosphor pattern obtained was evaluated, and (x)/(y) and (V$^1$)/(V$^2$) thereof were determined. The results are shown in Table 21.

<(IIIa) Step of removing unnecessary portions from the phosphor-containing photosensitive resin composition layer (A) and/or the thermoplastic resin layer (B) by development>

Then, after irradiation of active light, the substrate was left to stand at ordinary temperature for 1 hour and then subjected to spray development at 30° C. for 70 seconds by using an emulsion solution comprising 3-methyl-3-methoxy-butyl acetate and water (3-methyl-3-methoxybutyl acetate/water (weight ratio)=25/75).

After development, the substrate was dried at 80° C. for 10 minutes, and by using a Toshiba UV ray irradiation apparatus produced by Toshiba Denzai Co., Japan, 3 J/cm$^2$ of UV ray was irradiated.

Then, in a dryer, heat treatment was carried out at 150° C. for 1 hour.

Example 60

In the same manner as in Example 47 except for changing Photosensitive element (ii) including the phosphor-containing photosensitive resin composition layer (A) to Photosensitive element (xxvii) including the phosphor-containing photosensitive resin composition layer (A) obtained in Example 24 and changing<(IVc) Step of removing an unnecessary portion from the phosphor-containing photosensitive resin composition layer (A) by development> as shown below, a phosphor pattern was formed. In the same manner as in Example 27, the formation state of the phosphor pattern obtained was evaluated, and (x)/(y) and (V'$^1$)/(V'$^2$) thereof were determined. The results are shown in Table 21.

<(IVc) Step of removing an unnecessary portion from the phosphor-containing photosensitive resin composition layer (A) by development>

Then, after irradiation of active light, the substrate was left to stand at ordinary temperature for 1 hour and then subjected to spray development at 30° C. for 70 seconds by using an emulsion solution comprising 3-methyl-3-methoxybutyl acetate and water (3-methyl-3-methoxybutyl acetate/water (weight ratio)=25/75).

After development, the substrate was dried at 80° C. for 10 minutes, and by using a Toshiba UV ray irradiation apparatus produced by Toshiba Denzai Co., Japan, 3 J/cm$^2$ of UV ray was irradiated.

Then, in a dryer, heat treatment was carried out at 150° C. for 1 hour.

Example 61

In the same manner as in Example 27 except for changing <(IIIa) Step of removing unnecessary portions from the phosphor-containing photosensitive resin composition layer (A) and/or the thermoplastic resin layer (B) by development> as shown below, a phosphor pattern was formed, the formation state of the phosphor pattern obtained was evaluated, and (x)/(y) and (V$^1$)/(V$^2$) thereof were determined. The results are shown in Table 21.

<(IIIa) Step of removing unnecessary portions from the phosphor-containing photosensitive resin composition layer (A) and/or the thermoplastic resin layer (B) by development>

Then, after irradiation of active light, the substrate was left to stand at ordinary temperature for 1 hour and then subjected to spray development at 30° C. for 70 seconds by using a 1% by weight sodium carbonate aqueous solution.

After development, the substrate was dried at 80° C. for 10 minutes, and by using a Toshiba UV ray irradiation apparatus produced by Toshiba Denzai Co., Japan, 3 J/cm$^2$ of UV ray was irradiated.

Then, in a dryer, heat treatment was carried out at 150° C. for 1 hour.

Example 62

In the same manner as in Example 27 except for changing <(IIa) Step of irradiating the phosphor-containing photosensitive resin composition layer (A) and/or the thermoplastic resin layer (B) imagewisely with active light> as shown below, a phosphor pattern was formed, the formation state of the phosphor pattern obtained was evaluated, and (x)/(y) and (V$^1$)/(V$^2$) thereof were determined. The results re shown in Table 21.

(IIa) Step of irradiating the phosphor-containing photosensitive resin composition layer (A) and/or the thermolastic resin layer (B) imagewisely with active light>

Next, a photomask having an active light permeation width (130 μm) which was narrower by 20 μm than the opening width 150 μm of the barrier rib was adhered to the polyethylene terephthalate film of Film (xii) including the thermoplastic resin layer (B) so that the center of the active light permeation width of the photomask was positioned at the center of the opening width of the barrier rib. By using a HMW-201GX Model exposer (trade name) produced by Orc Seisakusho Co., Japan, 100 mJ/cm$^2$ of active light was irradiated imagewisely.

Example 63

In the same manner as in Example 47 except for changing Photosensitive element (ii) including the phosphor-containing photosensitive resin composition layer (A) to Photosensitive element (iii) including the phosphor-containing photosensitive resin composition layer (A) obtained in Example 3, a phosphor pattern was formed. In the same manner as in Example 27, the formation state of the phosphor pattern obtained was evaluated, and (x)/(y) and $(V^{\prime 1})/(V^{\prime 2})$ thereof were determined. The results are shown in Table 21.

Example 64

In the same manner as in Example 47 except for changing Photosensitive element (ii) including the phosphor-containing photosensitive resin composition layer (A) to Photosensitive element (iv) including the phosphor-containing photosensitive resin composition layer (A) obtained in Example 4, a phosphor pattern was formed. In the same manner as in Example 27, the formation state of the phosphor pattern obtained was evaluated, and (x)/(y) and $(V^{\prime 1})/(V^{\prime 2})$ thereof were determined. The results are shown in Table 21.

Example 65

In the same manner as in Example 57 except for changing Photosensitive element (vi) including the phosphor-containing photosensitive resin composition layer (A) to Photosensitive element (vii) including the phosphor-containing photosensitive resin composition layer (A) obtained in Example 7, a phosphor pattern was formed. In the same manner as in Example 27, the formation state of the phosphor pattern obtained was evaluated, and (x)/(y) thereof was determined. The results are shown in Table 21.

Example 66

In the same manner as in Example 57 except for changing Photosensitive element (vi) including the phosphor-containing photosensitive resin composition layer (A) to Photosensitive element (viii) including the phosphor-containing photosensitive resin composition layer (A) obtained in Example 8, a phosphor pattern was formed. In the same manner as in Example 27, the formation state of the phosphor pattern obtained was evaluated, and (x)/(y) thereof was determined. The results are shown in Table 21.

Example 67

In the same manner as in Example 55 except for changing Photosensitive element (xxiii) obtained in Example 23 to Photosensitive element (xxviii) obtained in Example 25, a phosphor pattern was formed. In the same manner as in Example 27, the formation state of the phosphor pattern obtained was evaluated, and (x)/(y) thereof was determined. The results are shown in Table 21.

Example 68

In the same manner as in Example 55 except for changing Photosensitive element (xxiii) obtained in Example 23 to Photosensitive element (xxix) obtained in Example 26, a phosphor pattern was formed. In the same manner as in Example 27, the formation state of the phosphor pattern obtained was evaluated, and (x)/(y) thereof was determined. The results are shown in Table 21.

Comparative Example 2

In the same manner as in Example 27 except for not using Film (xii) including the thermoplastic resin layer (B), a phosphor pattern was formed, the formation state of the phosphor pattern obtained was evaluated. The results are shown in Table 21.

Comparative Example 3

In the same manner as in Example 31 except for not using Film (xiv) including the thermoplastic resin layer (B), a phosphor pattern was formed. In the same manner as in Example 27, the formation state of the phosphor pattern obtained was evaluated. The results are shown in Table 21.

Comparative Example 4

In the same manner as in Example 32 except for not using Film (xiv) including the thermoplastic resin layer (B), a phosphor pattern was formed. In the same manner as in Example 27, the formation state of the phosphor pattern obtained was evaluated. The results are shown in Table 21.

Comparative Example 5

In the same manner as in Example 33 except for not using Film (xii) including the thermoplastic resin layer (B), a phosphor pattern was formed. In the same manner as in Example 27, the formation state of the phosphor pattern obtained was evaluated. The results are shown in Table 21.

Comparative Example 6

In the same manner as in Example 36 except for not using Film (xii) including the thermoplastic resin layer (B), a phosphor pattern was formed. In the same manner as in Example 27, the formation state of the phosphor pattern obtained was evaluated. The results are shown in Table 21.

Comparative Example 7

In the same manner as in Example 38 except for not using Film (xii) including the thermoplastic resin layer (B), a phosphor pattern was formed. In the same manner as in Example 27, the formation state of the phosphor pattern obtained was evaluated. The results are shown in Table 21.

Comparative Example 8

In the same manner as in Example 40 except for not using Film (xii) including the thermoplastic resin layer (B), a phosphor pattern was formed. In the same manner as in Example 27, the formation state of the phosphor pattern obtained was evaluated. The results are shown in Table 21.

Comparative Example 9

In the same manner as in Example 42 except for not using Film (xiii) including the thermoplastic resin layer (B), a phosphor pattern was formed. In the same manner as in Example 27, the formation state of the phosphor pattern obtained was evaluated. The results are shown in Table 21.

Comparative Example 10

In the same manner as in Example 44 except for not using Film (xiii) including the thermoplastic resin layer (B), a phosphor pattern was formed. In the same manner as in Example 27, the formation state of the phosphor pattern obtained was evaluated. The results are shown in Table 21.

TABLE 21

| Photosensitive element or film | | Formation state of phosphor pattern | (x)/(y) | $(V^1)/(V^2)$ or $(V'^1)/(V'^2)$ |
|---|---|---|---|---|
| Example 27 | (i) and (xii) | O | 0.9 | 1.27 |
| Example 28 | (i) and (xiii) | O | 1 | 1.27 |
| Example 29 | (i) and (xiv) | O | 1 | 1.27 |
| Example 30 | (ii) and (xii) | O | 0.9 | 1.27 |
| Example 31 | (iii) and (xiv) | O | 1 | 1.27 |
| Example 32 | (iv) and (xiv) | O | 1 | 1.27 |
| Example 33 | (v) and (xii) | O | 0.9 | 1.27 |
| Example 34 | (v) and (xiii) | O | 1 | 1.27 |
| Example 35 | (v) and (xiv) | O | 1 | 1.27 |
| Example 36 | (vi) and (xii) | O | 0.9 | 1.27 |
| Example 37 | (vi) and (xiii) | O | 1 | 1.27 |
| Example 38 | (vii) and (xii) | O | 0.9 | 1.27 |
| Example 39 | (vii) and (xiii) | O | 1 | 1.27 |
| Example 40 | (viii) and (xii) | O | 0.9 | 1.27 |
| Example 41 | (viii) and (xiii) | O | 1 | 1.27 |
| Example 42 | (ix) and (xiii) | O | 1 | 1.27 |
| Example 43 | (x) and (xiii) | O | 1 | 1.27 |
| Example 44 | (xi) and (xiii) | O | 1 | 1.27 |
| Example 45 | (ii) and (xxv) | O | 0.8 | 1.71 |
| Example 46 | (ii) and (xxvi) | O | 0.8 | 1.71 |
| Example 47 | (ii) and (xv) | O | 0.8 | 1.01 |
| Example 48 | (xvi) | O | 0.9 | 1.27 |
| Example 49 | (xvii) | O | 1 | 1.27 |
| Example 50 | (xviii) | O | 1 | 1.27 |
| Example 51 | (xix) | O | 1 | 1.27 |
| Example 52 | (xx) | O | 1 | 1.27 |
| Example 53 | (xxi) | O | 0.9 | 1.27 |
| Example 54 | (xxii) | O | 0.9 | 1.01 |
| Example 55 | (xxiii) | O | 0.8 | 1.27 |
| Example 56 | (i) | O | 1 | — |
| Example 57 | (vi) | O | 1 | — |
| Example 58 | (i) | O | 1 | — |
| Example 59 | (xxvii) and (xiii) | O | 1 | 1.27 |
| Example 60 | (xxvii) and (xv) | O | 1 | 1.01 |
| Example 61 | (i) and (xii) | O | 1 | 1.27 |
| Example 62 | (i) and (xii) | O | 1 | 1.27 |
| Example 63 | (iii) and (xv) | O | 1 | 1.01 |
| Example 64 | (iv) and (xv) | O | 1 | 1.01 |
| Example 65 | (vii) | O | 1 | — |
| Example 66 | (viii) | O | 1 | — |
| Example 67 | (xxviii) | O | 1 | 1.27 |
| Example 68 | (xxix) | O | 1 | 1.27 |
| Comparative example 2 | (i) | X | — | — |
| Comparative example 3 | (iii) | X | — | — |
| Comparative example 4 | (iv) | X | — | — |
| Comparative example 5 | (v) | X | — | — |
| Comparative example 6 | (vi) | X | — | — |
| Comparative example 7 | (vii) | X | — | — |
| Comparative example 8 | (viii) | X | — | — |
| Comparative example 9 | (ix) | X | — | — |
| Comparative example 10 | (xi) | X | — | — |

(Preparations of multicolor phosphor patterns)

Example 69

By using the substrate on which the photosensitive resin composition layer containing the phosphor emitting red light (first color) was formed obtained by carrying out the steps of (Ia) to (IIIa) in Example 36, the steps of (Ia) to (IIIa) in Example 38 were carried out to form a photosensitive resin composition layer containing a phosphor emitting blue light (second color), and then the steps of (Ia) to (IIIa) in Example 40 were carried out to form a photosensitive resin composition layer containing a phosphor emitting green light (third color), whereby a multicolor pattern was prepared.

Then, by using the multicolor pattern obtained, the step of (IVa) in Example 40 was carried out to prepare a multicolor phosphor pattern.

(Evaluation of phosphor pattern)

The section of the multicolor phosphor pattern emitting red, green and blue lights obtained was observed visually by a stereoscopic microscope and SEM to evaluate the formation state of the multicolor phosphor pattern. The results are shown in Table 22. The standard of evaluation is shown below.

O: a multicolor phosphor layer emitting red, green and blue lights is formed uniformly in the space (on the wall surface of a barrier rib and the bottom of a cell) of a substrate for PDP X: a multicolor phosphor layer emitting red, green and blue lights is not formed uniformly in the space (on the wall surface of a barrier rib and the bottom of a cell) of a substrate for PDP

Example 70

By using the substrate on which the photosensitive resin composition layer containing the phosphor emitting red light (first color) was formed obtained by carrying out the steps of (Ib) to (IIIb) in Example 49, the steps of (Ib) to (IIIb) in Example 51 were carried out to form a photosensitive resin composition layer containing a phosphor emitting blue light (second color), and then the steps of (Ib) to (IIIb) in Example 52 were carried out to form a photosensitive resin composition layer containing a phosphor emitting green light (third color), whereby a multicolor pattern was obtained to prepare a back plate.

Then, by using the multicolor pattern obtained, the step of (IVb) in Example 52 was carried out to prepare a multicolor phosphor pattern.

In the same manner as in Example 69, the formation state of the multicolor phosphor pattern obtained was evaluated. The results are shown in Table 22.

Example 71

By using the substrate on which the photosensitive resin composition layer containing the phosphor emitting red light (first color) was formed obtained by carrying out the steps of (Ic) to (IVc) in Example 47, the steps of (Ic) to (IVc) in Example 63 were carried out to form a photosensitive resin composition layer containing a phosphor emitting blue light (second color), and then the steps of (Ic) to (IVc) in Example 64 were carried out to form a photosensitive resin composition layer containing a phosphor emitting green light (third color), whereby a multicolor pattern was obtained to prepare a back plate.

Then, by using the multicolor pattern obtained, the step of (Vc) in Example 64 was carried out to prepare a multicolor phosphor pattern.

In the same manner as in Example 69, the formation state of the multicolor phosphor pattern obtained was evaluated. The results are shown in Table 22.

Example 72

By using the substrate on which the photosensitive resin composition layer containing the phosphor emitting red light (first color) was formed obtained by carrying out the steps of (Id) to (IVd) in Example 55, the steps of (Id) to (IVd) in Example 67 were carried out to form a photosensitive resin composition layer containing a phosphor emitting blue light (second color), and then the steps of (Id) to (IVd) in Example 68 were carried out to form a photosensitive resin composition layer containing a phosphor emitting green light (third color), whereby a multicolor pattern was obtained to prepare a back plate.

Then, by using the multicolor pattern obtained, the step of (Vd) in Example 68 was carried out to prepare a multicolor phosphor pattern.

In the same manner as in Example 69, the formation state of the multicolor phosphor pattern obtained was evaluated. The results are shown in Table 22.

Example 73

By using the substrate on which the photosensitive resin composition layer containing the phosphor emitting red light (first color) was formed obtained by carrying out the steps of (Ie) to (IIIe) in Example 57, the steps of (Ie) to (IIIe) in Example 65 were carried out to form a photosensitive resin composition layer containing a phosphor emitting blue light (second color), and then the steps of (Ie) to (IIIe) in Example 66 were carried out to form a photosensitive resin composition layer containing a phosphor emitting green light (third color), whereby a multicolor pattern was obtained to prepare a back plate.

Then, by using the multicolor pattern obtained, the step of (IVe) in Example 66 was carried out to prepare a multicolor phosphor pattern.

In the same manner as in Example 69, the formation state of the multicolor phosphor pattern obtained was evaluated. The results are shown in Table 22.

Example 74

By using the substrate on which the photosensitive resin composition layer containing the phosphor emitting red light (first color) was formed obtained by carrying out the steps of (Ia) to (IIIa) in Example 36 in the same manner except for changing the step (IIIa) as shown below, the steps of (Ia) to (IIIa) in Example 38 were carried out in the same manner except for changing the step (IIIa) as shown below to form a photosensitive resin composition layer containing a phosphor emitting blue light (second color), and then the steps of (Ia) to (IIIa) in Example 40 were carried out in the same manner except for changing the step (IIIa) as shown below to form a photosensitive resin composition layer containing a phosphor emitting green light (third color), whereby a multicolor pattern was obtained to prepare a back plate.

<(IIIa) Step of removing unnecessary portions from the phosphor-containing photosensitive resin composition layer (A) and/or the thermoplastic resin layer (B) by development>

Then, after irradiation of active light, the substrate was left to stand at ordinary temperature for 1 hour and then subjected to spray development at 30° C. for 100 seconds by using a 1% by weight sodium carbonate aqueous solution. After development, the substrate was dried at 80° C. for 10 minutes, and by using a Toshiba UV ray irradiation apparatus produced by Toshiba Denzai Co., Japan, 3 J/cm$^2$ of UV ray was irradiated.

Then, in a dryer, heat treatment was carried out at 150° C. for 1 hour.

Then, by using the multicolor pattern obtained, the step of (IVa) in Example 40 was carried out to prepare a multicolor phosphor pattern.

In the same manner as in Example 69, the formation state of the multicolor phosphor pattern obtained was evaluated. The results are shown in Table 22.

Example 75

By using the substrate on which the photosensitive resin composition layer containing the phosphor emitting red light (first color) was formed obtained by carrying out the steps of (Ia) to (IVa) in Example 36, the steps of (Ia) to (IVa) in Example 38 were carried out to form a photosensitive resin composition layer containing a phosphor emitting blue light (second color), and then the steps of (Ia) to (IVa) in Example 40 were carried out to form a photosensitive resin composition layer containing a phosphor emitting green light (third color), whereby a multicolor phosphor pattern was obtained to prepare a back plate.

In the same manner as in Example 69, the formation state of the multicolor phosphor pattern obtained was evaluated. The results are shown in Table 22.

Example 76

By using the substrate on which the photosensitive resin composition layer containing the phosphor emitting red light (first color) was formed obtained by carrying out the steps of (Ib) to (IVb) in Example 49, the steps of (Ib) to (IVb) in Example 51 were carried out to form a photosensitive resin composition layer containing a phosphor emitting blue light (second color), and then the steps of (Ib) to (IVb) in Example 52 were carried out to form a photosensitive resin composition layer containing a phosphor emitting green light (third color), whereby a multicolor phosphor pattern was obtained to prepare a back plate.

In the same manner as in Example 69, the formation state of the multicolor phosphor pattern obtained was evaluated. The results are shown in Table 22.

Example 77

By using the substrate on which the photosensitive resin composition layer containing the phosphor emitting red light (first color) was formed obtained by carrying out the steps of (Ic) to (Vc) in Example 47, the steps of (Ic) to (Vc) in Example 63 were carried out to form a photosensitive resin composition layer containing a phosphor emitting blue light (second color), and then the steps of (Ic) to (Vc) in Example 64 were carried out to form a photosensitive resin composition layer containing a phosphor emitting green light (third color), whereby a multicolor phosphor pattern was obtained to prepare a back plate.

In the same manner as in Example 69, the formation state of the multicolor phosphor pattern obtained was evaluated. The results are shown in Table 22.

Example 78

By using the substrate on which the photosensitive resin composition layer containing the phosphor emitting red light (first color) was formed obtained by carrying out the steps of (Id) to (Vd) in Example 55, the steps of (Id) to (Vd) in Example 67 were carried out to form a photosensitive resin composition layer containing a phosphor emitting blue light (second color), and then the steps of (Id) to (Vd) in Example 68 were carried out to form a photosensitive resin composition layer containing a phosphor emitting green light (third color), whereby a multicolor phosphor pattern was obtained to prepare a back plate.

In the same manner as in Example 69, the formation state of the multicolor phosphor pattern obtained was evaluated. The results are shown in Table 22.

Example 79

By using the substrate on which the photosensitive resin composition layer containing the phosphor emitting red light (first color) was formed obtained by carrying out the steps of (Ie) to (IVe) in Example 57, the steps of (Ie) to (IVe) in Example 65 were carried out to form a photosensitive resin composition layer containing a phosphor emitting blue light (second color), and then the steps of (Ie) to (IVe) in Example 66 were carried out to form a photosensitive resin composition layer containing a phosphor emitting green light (third color), whereby a multicolor phosphor pattern was obtained to prepare a back plate.

In the same manner as in Example 69, the formation state of the multicolor phosphor pattern obtained was evaluated. The results are shown in Table 22.

TABLE 22

|  | Property of forming phosphor pattern |
| --- | --- |
| Example 69 | O |
| Example 70 | O |
| Example 71 | O |
| Example 72 | O |
| Example 73 | O |
| Example 74 | O |
| Example 75 | O |
| Example 76 | O |
| Example 77 | O |
| Example 78 | O |
| Example 79 | O |

From the results of Table 20 and Table 21, it can be seen that the photosensitive elements of the present invention have good edge fusion property, and in the process for preparing a phosphor pattern of the present invention using the thermoplastic resin layer (B), the embedding layer (C) or various pressures, phosphor pattern-forming property (property of embedding on the wall surface of a barrier rib and the bottom of a space of a substrate for PDP) is also good.

In comparison, in the case of not using the thermoplastic resin layer (B), the embedding layer (C) nor various pressures, phosphor pattern-forming property (property of embedding on the wall surface of a barrier rib and the bottom of a space of a substrate for PDP) is poor.

From the results of Table 22, it can be seen that by using the photosensitive element of the present invention and further using the process for preparing a phosphor pattern of the present invention, multicolor phosphor pattern-forming property (property of embedding on the wall surface of a barrier rib and the bottom of a space of a substrate for PDP) is good.

The invention according to Claim 1 can suppress lowering of apparent luminance in visual recognition from a wide angle of a field of view in a phosphor pattern of PDP.

The invention according to Claim 2 has excellent property of embedding in a space of a substrate having unevenness such as a substrate for PDP (property of forming a phosphor-containing photosensitive resin composition layer on the wall surface of a barrier rib and the bottom of a space of a substrate for PDP) and can form a phosphor pattern with high precision and a uniform shape.

The invention according to Claim 3 has excellent operatability in addition to the effects of the invention according to Claim 2.

The invention according to Claim 4 has excellent property of suppressing decrease in phosphor-containing photosensitive resin composition layer thickness in addition to the effects of the invention according to Claim 2.

The invention according to Claim 5 has excellent property of suppressing edge fusion and property of embedding in a space of a substrate having unevenness such as a substrate for PDP and can form a phosphor pattern with high precision and a uniform shape with good operatability.

The invention according to Claim 6 has excellent operatability, environmental safety and property of embedding in a space of a substrate having unevenness such as a substrate for PDP and can form a phosphor pattern with high precision and a uniform shape.

The invention according to Claim 7 has more excellent operatability in addition to the effects of the invention according to Claim 6.

The invention according to Claim 8 has excellent property of suppressing decrease in phosphor-containing photosensitive resin composition layer thickness in addition to the effects of the invention according to Claim 6.

The invention according to Claim 9 has excellent property of embedding in a space of a substrate having unevenness such as a substrate for PDP and can form a phosphor pattern with high precision and a uniform shape.

The invention according to Claim 10 has more excellent operatability in addition to the effects of the invention according to Claim 9.

The invention according to Claim 11 has excellent property of suppressing decrease in phosphor-containing photosensitive resin composition layer thickness in addition to the effects of the invention according to Claim 9.

The invention according to Claim 12 has excellent property of suppressing edge fusion and property of embedding in a space of a substrate having unevenness such as a substrate for PDP and can form a phosphor pattern with high precision and a uniform shape with good operatability.

The invention according to Claim 13 has excellent property of embedding in a space of a substrate having unevenness such as a substrate for PDP and can form a phosphor pattern with high precision and a uniform shape.

The invention according to Claim 14 has more excellent operatability in addition to the effects of the invention according to Claim 13.

The invention according to Claim 15 has excellent property of suppressing decrease in phosphor-containing photosensitive resin composition layer thickness in addition to the effects of the invention according to Claim 13.

The invention according to Claim 16 has excellent property of embedding in a space of a substrate having unevenness such as a substrate for PDP and can form a phosphor pattern with high precision and a uniform shape.

The invention according to Claim 17 has more excellent operatability in addition to the effects of the invention according to Claim 16.

The invention according to Claim 18 has excellent property of suppressing decrease in phosphor-containing photosensitive resin composition layer thickness in addition to the effects of the invention according to Claim 16.

The inventions according to Claims 19 and 24 have more excellent operatability in addition to the effects of the inventions according to Claims 2 and 5.

The inventions according to Claims 20 and 25 have more excellent storage stability in addition to the effects of the inventions according to Claims 2 and 5.

The inventions according to Claims 21 and 26 have excellent property of suppressing mixing of colors in addition to the effects of the inventions according to Claims 2 and 5.

The invention according to Claim 27 has more excellent operatability in addition to the effects of the invention according to Claim 2.

The inventions according to Claims 22 and 28 can form a phosphor pattern with high precision and a uniform shape and have the effects of the inventions according to Claims 2 and 5.

The inventions according to Claims 23 and 29 can form a phosphor pattern with high precision and a uniform shape and have the effects of the inventions according to Claims 9 and 12.

What is claimed is:

1. A process for preparing a phosphor pattern, which comprises:
   (Ic) a step of heating and pressurizing an embedding layer (C) in a state that the embedding layer (C) is superposed on a phosphor-containing photosensitive resin composition layer (A) on an uneven surface of a substrate having unevenness with a height of 20 to 500 $\mu$m, to laminate the phosphor-containing photosensitive resin composition layer (A) and the embedding layer (C) in conformation with the uneven surface, the phosphor-containing photosensitive resin composition layer (A) having a thickness of 10–200 $\mu$m;
   (IIc) a step of peeling the embedding layer (C);
   (IIIc) a step of irradiating the phosphor-containing photosensitive resin composition layer (A) imagewisely with active light;
   (IVc) a step of removing an unnecessary portion from the phosphor-containing photosensitive resin composition layer (A) by development; and
   (Vc) a step of removing unnecessary components from the phosphor-containing photosensitive resin composition layer (A) by calcination.

2. The process according to claim 1, wherein the respective steps of (Ic) to (IVc) are repeated to form a multicolor pattern comprising photosensitive resin composition layers each containing a phosphor which emits red, green or blue light, and then the step of (Vc) is carried out to form a multicolor phosphor pattern.

3. The process according to claim 1, wherein the respective steps of (Ic) to (Vc) are repeated to form a multicolor phosphor pattern which emits red, green and blue lights.

4. The process according to claim 1, wherein in the phosphor-containing photosensitive resin composition layer (A) and the embedding layer (C) in a region which is the same as the region where unevenness is formed on the substrate having unevenness, the ratio $(V'^1)/(V'^2)$ of the total volume $(V'^1)$ of the phosphor-containing photosensitive resin composition layer (A) and the embedding layer (C) to the volume $(V'^2)$ of the space of a concave portion of the substrate having unevenness is in the range of 1 to 2.

5. The process according to claim 1, wherein said substrate having unevenness is a substrate member with barrier ribs thereon.

6. The process according to claim 1, including the additional steps, prior to step (Ic), of providing the phosphor-containing photosensitive resin composition layer (A) on said uneven surface, and then superposing said embedding layer (C) on said phosphor-containing photosensitive resin composition layer (A).

7. The process according to claim 1, wherein said step of peeling is performed after said step of irradiating.

8. The process according to claim 1, wherein the step of heating and pressurizing said embedding layer (C) is performed in a state that the embedding layer (C) is superposed on the phosphor-containing photosensitive resin composition layer (A) with a film for facilitating separation of the embedding layer (C) from the phosphor-containing photosensitive resin composition layer (A) being interposed between the embedding layer (C) and the phosphor-containing photosensitive resin composition layer (A).

9. The process according to claim 1, including the further steps, before the step of heating and pressurizing, of superposing the embedding layer (C) on the phosphor-containing photosensitive resin composition layer (A), with a film for facilitating separation of the embedding layer (C) from said phosphor-containing photosensitive resin composition (A) being interposed between the embedding layer (C) and the phosphor-containing photosensitive resin composition layer (A), and laying the superimposed layers with the phosphor-containing photosensitive resin composition layer (A) contacting the uneven surface.

10. The process according to claim 1, wherein the embedded layer (C) is superposed directly on the phosphor-containing photosensitive resin composition layer (A).

11. A process for preparing a phosphor pattern, which comprises:
    (Id) a step of heating and pressurizing a photosensitive element comprising a support film, an embedding layer (C) provided on the support film, and a phosphor-containing photosensitive resin composition layer (A) provided on the embedding layer (C), so that the phosphor-containing photosensitive resin composition layer (A) is contacted with an uneven surface of a substrate having unevenness with a height of 20 to 500 $\mu$m, to laminate the phosphor-containing photosensitive resin composition layer (A) and the embedding layer (C) in conformation with the uneven surface, the phosphor-containing photosensitive resin composition layer (A) having a thickness of 10–200 $\mu$m;
    (IId) a step of peeling the embedding layer (C);
    (IIId) a step of irradiating the phosphor-containing photosensitive resin composition layer (A) imagewisely with active light;
    (IVd) a step of removing unnecessary portions from the phosphor-containing photosensitive resin composition layer (A) by development; and (Vd) a step of removing unnecessary components from the phosphor-containing photosensitive resin composition layer (A) by calcination.

12. The process according to claim 11, wherein the respective steps of (Id) to (IVd) are repeated to form a multicolor pattern comprising photosensitive resin composition layers each containing a phosphor which emits red, green or blue light, and then the step of (Vd) is carried out to form a multicolor phosphor pattern.

13. The process according to claim 11, wherein the respective steps of (Id) to (Vd) are repeated to form a multicolor phosphor pattern which emits red, green and blue lights.

14. The process according to claim 11, wherein said substrate having unevenness is a substrate member with barrier ribs thereon.

15. The process according to claim 11, wherein the embedding layer (C) has a thickness of 10–200 µm.

16. The process according to claim 11, wherein the phosphor-containing photosensitive resin composition layer (A) is provided directly on the embedding layer (C).

17. The process according to claim 11, wherein said step of peeling is performed after said step of irradiating.

18. The process according to claim 17, wherein said film for facilitating separation is provided between the embedding layer (C) and the phosphor-containing photosensitive resin composition layer (A).

19. The process according to claim 11, wherein said step of heating and pressurizing is performed with a film for facilitating separation of the embedding layer (C) from said phosphor-containing photosensitive resin composition (A) being interposed between the embedding layer (C) and the phosphor-containing photosensitive resin composition layer (A).

20. The process according to claim 11, including the further steps, before the step of heating and pressurizing, of stacking the embedding layer (C) on the support film and the phosphor-containing photosensitive resin composition layer (A) on the embedding layer (C) to form a stack, with the stack also including a film for facilitating separation of the phosphor-containing photosensitive resin composition layer (A) from the embedding layer (C), and laying the stack with the phosphor-containing photosensitive resin composition layer (A) contacting the uneven surface.

* * * * *